United States Patent
Kaba et al.

(10) Patent No.: US 10,777,404 B2
(45) Date of Patent: Sep. 15, 2020

(54) SUBSTRATE PROCESSING APPARATUS

(71) Applicant: SCREEN Holdings Co., Ltd., Kyoto (JP)

(72) Inventors: Hiromichi Kaba, Kyoto (JP); Akihiko Taki, Kyoto (JP); Tomomi Iwata, Kyoto (JP); Toru Edo, Kyoto (JP); Kunio Yamada, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 213 days.

(21) Appl. No.: 15/422,858

(22) Filed: Feb. 2, 2017

(65) Prior Publication Data
US 2017/0243735 A1 Aug. 24, 2017

(30) Foreign Application Priority Data

Feb. 19, 2016 (JP) .................................. 2016-030153

(51) Int. Cl.
*H01L 21/02* (2006.01)
*H01L 21/67* (2006.01)
(Continued)

(52) U.S. Cl.
CPC .......... *H01L 21/02052* (2013.01); *B08B 1/04* (2013.01); *B08B 3/08* (2013.01);
(Continued)

(58) Field of Classification Search
CPC ........... H01L 21/02052; H01L 21/6704; H01L 21/67; H01L 21/6715; H01L 21/6719;
(Continued)

(56) References Cited

U.S. PATENT DOCUMENTS 5,989,342 A * 11/1999 Ikeda .................... B05C 11/08
118/52
8,435,380 B2 * 5/2013 Kim .................. H01L 21/68728
134/157
(Continued)

FOREIGN PATENT DOCUMENTS

CN 101740453 B 1/2012
JP H10-135312 A 5/1998
(Continued)

OTHER PUBLICATIONS

Machine translation of JP2008-103521A (Year: 2008).*

*Primary Examiner* — Douglas Lee
(74) *Attorney, Agent, or Firm* — Ostrolenk Faber LLP

(57) ABSTRACT

A substrate processing apparatus includes a driving magnet that is disposed correspondingly to a movable pin and that has a predetermined polar direction with respect to a radial direction of a rotary table, a pressing magnet that has a magnetic pole that gives an attractive magnetic force or a repulsive magnetic force between the driving magnet and the pressing magnet and that presses a support portion against a peripheral edge of a substrate by urging the support portion toward a contact position by means of the attractive magnetic force or the repulsive magnetic force, and a pressing-force changing unit that changes a magnitude of a pressing force against the peripheral edge of the substrate pressed by the support portion while keeping the magnitude higher than zero in response to rotation of the rotary table.

6 Claims, 30 Drawing Sheets

(51) Int. Cl.
*B08B 1/04* (2006.01)
*B08B 3/08* (2006.01)
*B08B 7/04* (2006.01)
*B08B 11/02* (2006.01)

(52) U.S. Cl.
CPC ............... *B08B 7/04* (2013.01); *B08B 11/02* (2013.01); *H01L 21/67* (2013.01); *H01L 21/6704* (2013.01)

(58) Field of Classification Search
CPC ......... H01L 21/67706; H01L 21/68764; B08B 11/02; B08B 1/04; B08B 3/08; B08B 7/04
See application file for complete search history.

(56) References Cited

U.S. PATENT DOCUMENTS

| | | | |
|---|---|---|---|
| 2004/0159343 A1 | 8/2004 | Shimbara et al. | 134/33 |
| 2008/0127888 A1* | 6/2008 | Kim | H01L 21/68728 118/52 |
| 2013/0152971 A1 | 6/2013 | Kato | 134/21 |
| 2015/0279721 A1 | 10/2015 | Kikumoto et al. | |
| 2016/0096205 A1* | 4/2016 | Kato | H01L 21/67046 134/21 |

FOREIGN PATENT DOCUMENTS

| | | | |
|---|---|---|---|
| JP | H10-135314 A | | 5/1998 |
| JP | 2001-118824 A | | 4/2001 |
| JP | 2004-048034 A | | 2/2004 |
| JP | 2004-111903 A | | 4/2004 |
| JP | 2008-103521 A | | 5/2008 |
| JP | 2008103521 A | * | 5/2008 |
| JP | 2011-119293 | | 6/2011 |
| JP | 2014-022419 | | 2/2014 |
| JP | 2015-002328 | | 1/2015 |
| JP | 2016-150403 | | 8/2016 |
| KR | 10-2015-0111867 A | | 10/2015 |
| WO | WO-2014203587 A1 | * | 12/2014 ....... H01L 21/67023 |

* cited by examiner

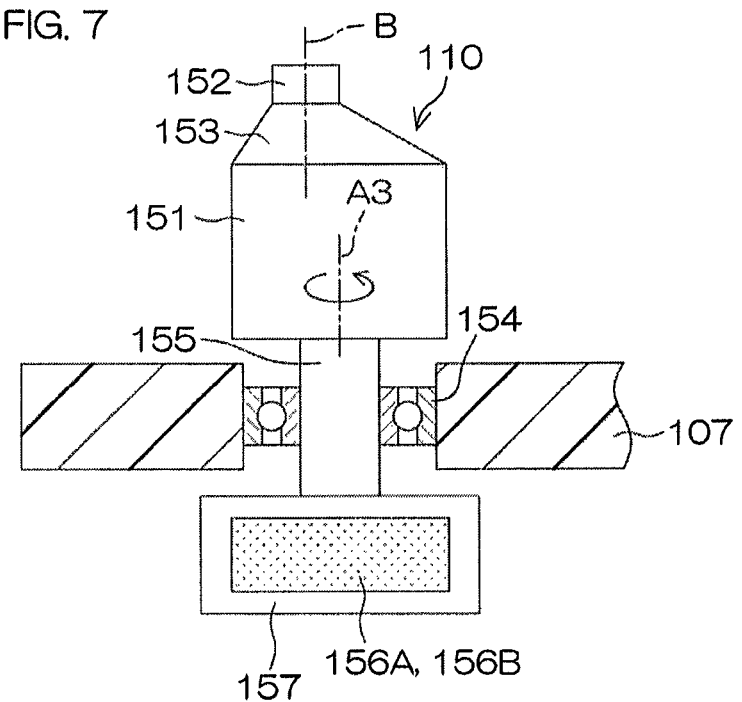

FIG. 8 OPEN POSITION
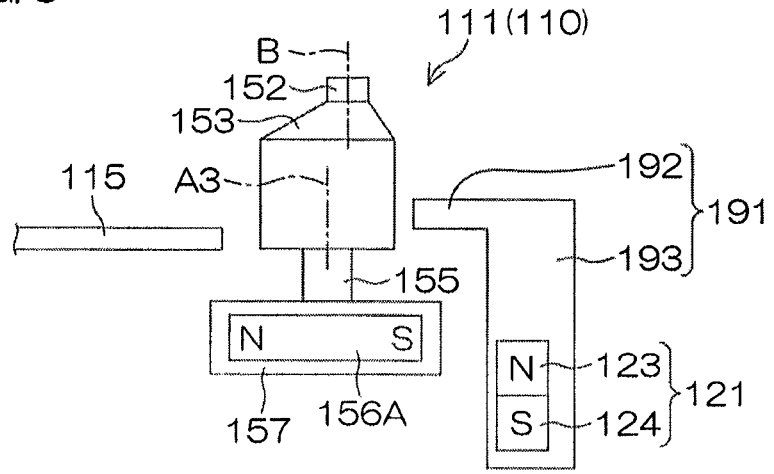
INSIDE ⟵⟶ OUTSIDE
FIG. 9 CONTACT POSITION
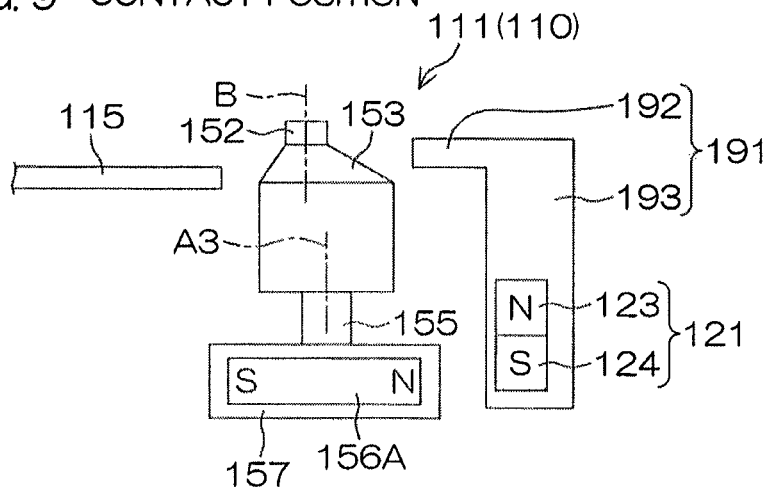
INSIDE ⟵⟶ OUTSIDE FIG. 11 OPEN POSITION
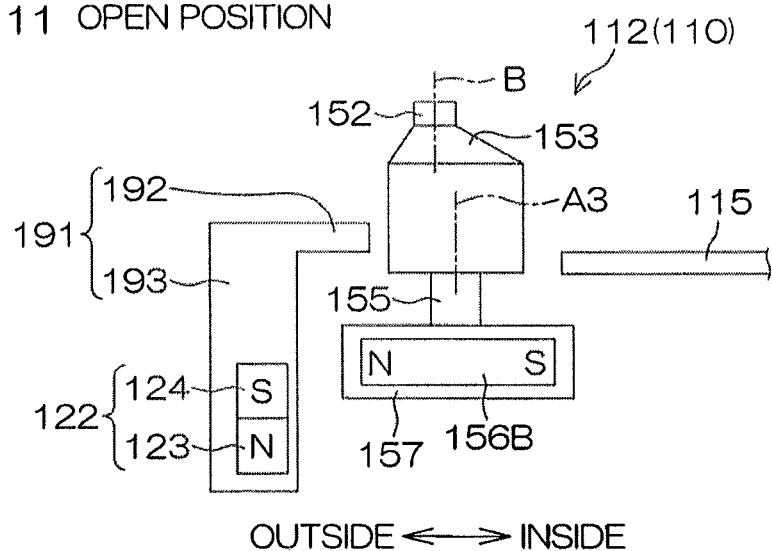
FIG. 12 CONTACT POSITION
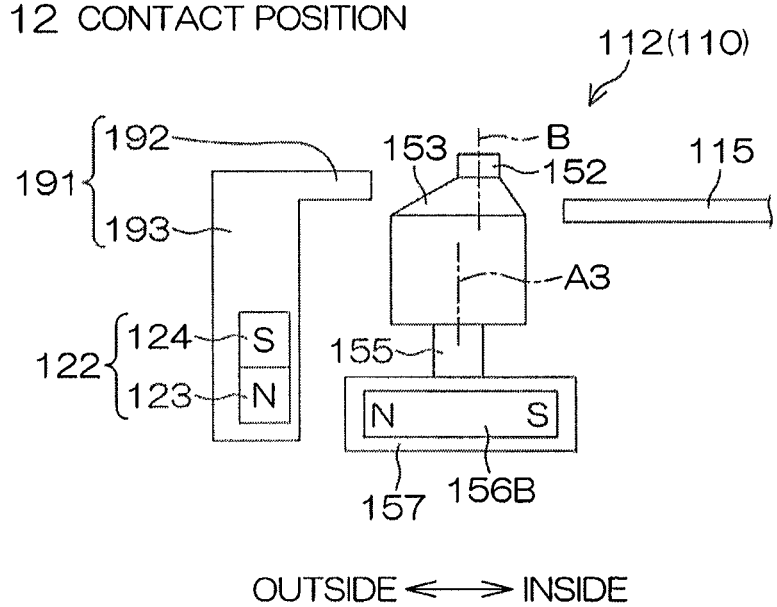

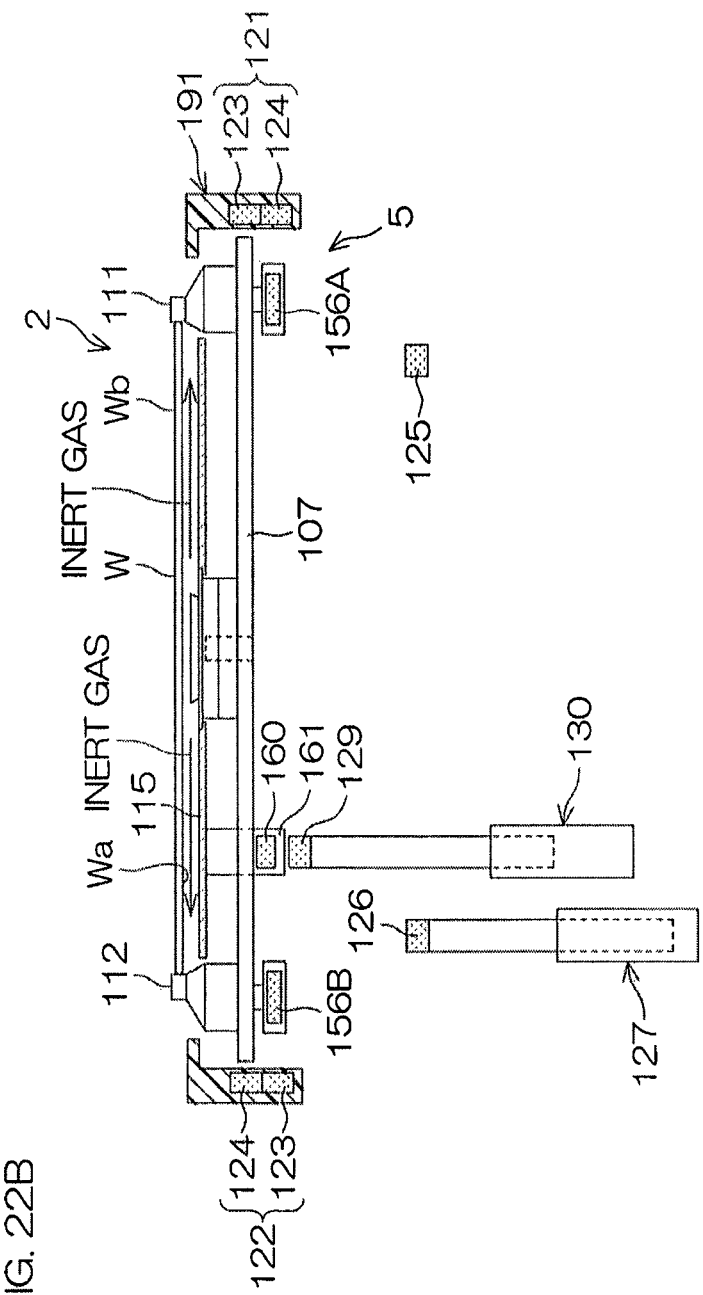

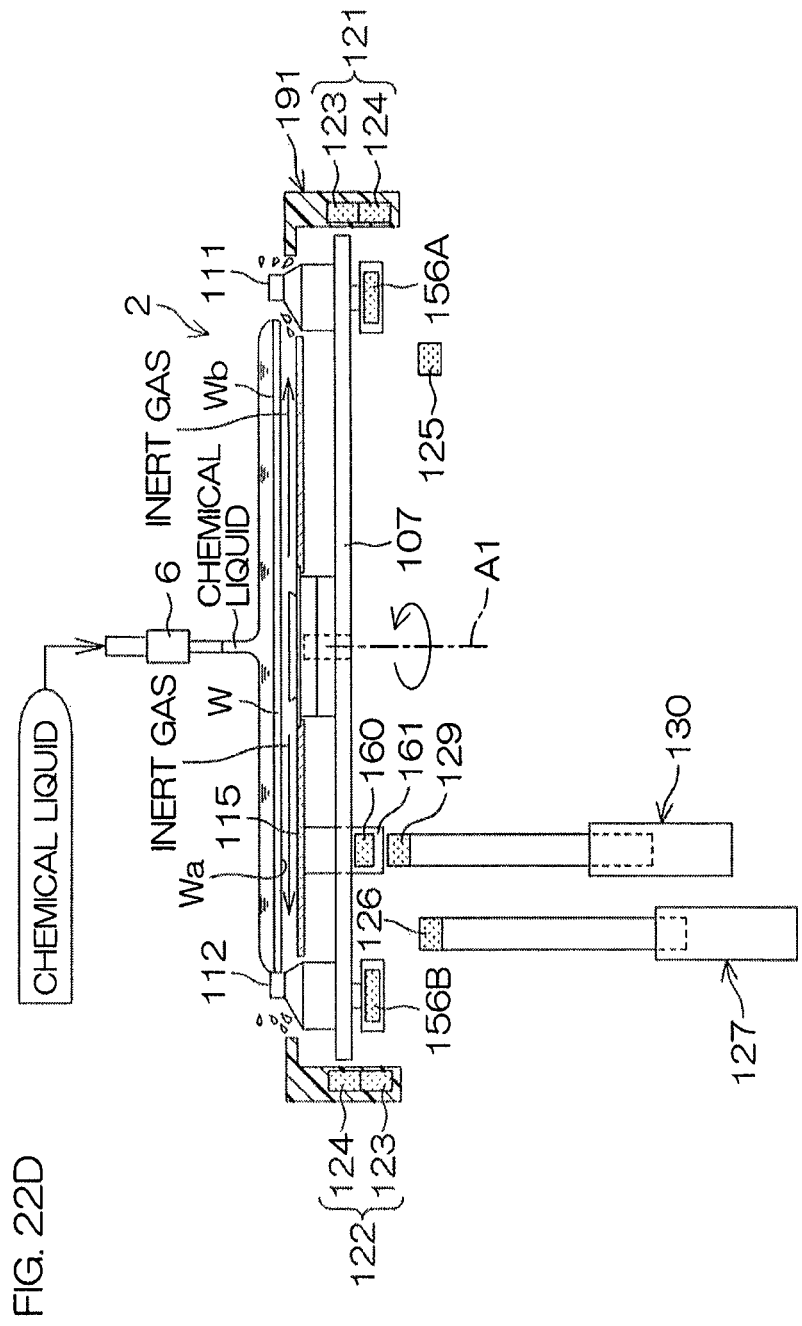

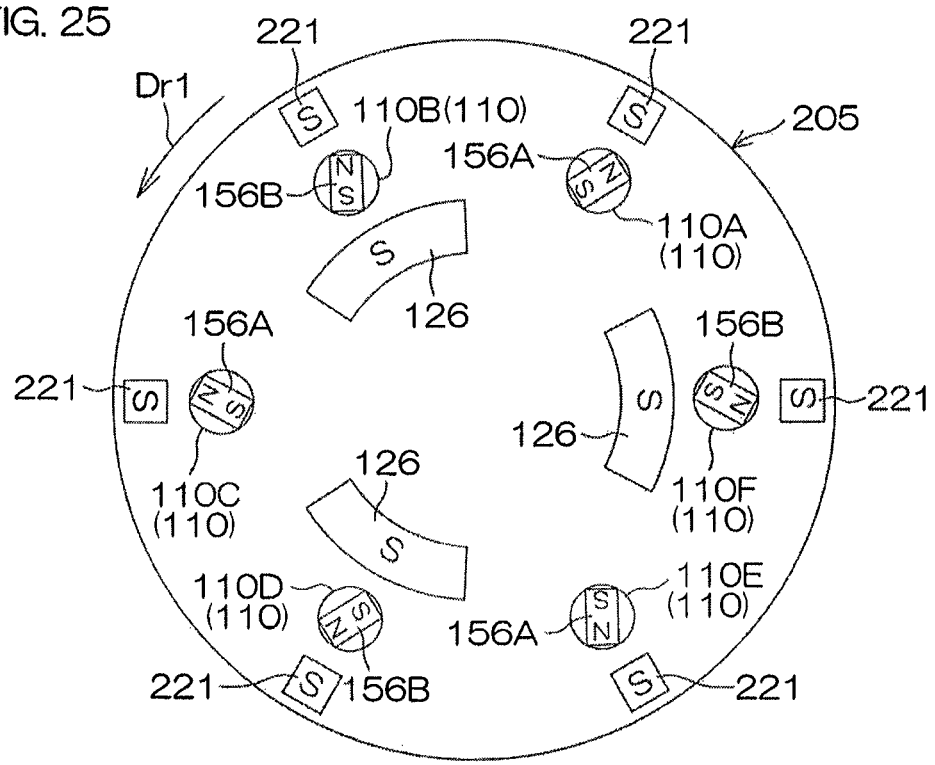

SUBSTRATE PROCESSING APPARATUS

BACKGROUND OF THE INVENTION

1. Field of the Invention

The present invention relates to a substrate processing apparatus and a substrate processing method. Examples of substrates to be processed include semiconductor wafers, substrates for liquid crystal display devices, substrates for plasma displays, substrates for FEDs (field emission displays), substrates for optical disks, substrates for magnetic disks, substrates for magneto-optical disks, and substrates for photomasks, ceramic substrates, substrates for solar cells.

2. Description of Related Art

US2013/0152971 A1 discloses a rotating type substrate holding/rotating device that includes a rotary table rotatable around a rotational axis aligned with a vertical direction, a rotation driving unit that rotates the rotary table around the rotational axis, and a plurality (for example, four) of holding pins disposed on the rotary table and horizontally positioning a substrate across a prescribed interval from a front surface of the rotary table.

The plurality of holding pins include fixed pins that are immovable with respect to the rotary table and movable pins that are movable with respect to the rotary table. Each movable pin has a contacting portion arranged to be rotatable around a rotational axis coaxial to a central axis of the movable pin and arranged to contact a peripheral end edge of the substrate. By rotation of the contacting portion, the contacting portion is displaced between an open position that is far apart from the rotational axis and a hold position that has approached the rotational axis. A pin driving magnet is coupled to a rotating shaft of the contacting portion.

Switching between opening and closing of the movable pins is performed using an elevated/lowered magnet disposed below the rotary table (magnet switching type). A magnet elevating/lowering unit is coupled to the elevated/lowered magnet. When the elevated/lowered magnet is at a prescribed lower position, the elevated/lowered magnet does not face the pin driving magnets and an external force, which urges the movable pins to the hold position, does not act on the movable pins. Therefore, when the elevated/lowered magnet is at the lower position, the movable pins are held at the open position. On the other hand, when the elevated/lowered magnet is at a prescribed upper position, the movable pins are held at the hold position by a magnetic attractive force between the elevated/lowered magnet and the pin driving magnets.

SUMMARY OF THE INVENTION

The substrate holding/rotating device is installed in a single substrate processing type apparatus that processes substrates one at a time and a processing liquid (cleaning chemical liquid) is supplied from a processing liquid nozzle to an upper surface of a substrate being rotated by the holding/rotating device. The processing liquid supplied to the upper surface of the substrate receives a centrifugal force due to rotation of the substrate and flows toward a peripheral edge portion of the substrate. The entirety of the upper surface of substrate and a peripheral end surface of the substrate is thereby liquid-processed. Also, depending on the type of substrate processing, a peripheral edge portion of a lower surface of the substrate may also be desired to be liquid-processed.

However, in the arrangement of US2013/0152971 A1, the substrate is being supported by the plurality of (e.g., four) holding pins while being in contact with the holding pins from beginning to end during the liquid treatment, and therefore there is a possibility that the processing liquid will not flow around at a plurality of contact positions of the holding pins in the peripheral end surface of the substrate, and the remainder after processing will be generated at the peripheral edge of the substrate (i.e., the peripheral end surface of the substrate and the peripheral edge of the lower surface of the substrate).

The inventors of the present invention are considering that, when a substrate is subjected to rotation processing (liquid processing), contact-support positions in the peripheral edge of the substrate are displaced in the circumferential direction while the peripheral edge of the substrate is being in contact with holding pins and is being supported by the holding pins.

Therefore, it is an object of the present invention to provide a substrate processing apparatus and a substrate processing method that are capable of displacing contact-support positions in the peripheral edge of a substrate in the circumferential direction while the peripheral edge of the substrate is being in contact with holding pins and is being supported by the holding pins when the substrate is subjected to rotation processing and, as a result, capable of excellently processing the peripheral edge of the substrate without the remainder after processing.

The present invention provides a substrate processing apparatus that includes a rotary table, and a substrate rotation holding device that is disposed to rotate around a rotational axis along a vertical direction together with the rotary table and that includes a plurality of support pins to support a substrate horizontally, and wherein the support pin including a movable pin that has a support portion disposed movably between a contact position at which the support pin comes into contact with a peripheral edge of the substrate and an open position that is more distant from the rotational axis than the contact position, further includes a driving magnet that is disposed correspondingly to the movable pin and that has a predetermined polar direction with respect to a radial direction of the rotary table, a pressing magnet that has a magnetic pole that gives an attractive magnetic force or a repulsive magnetic force between the driving magnet and the pressing magnet and that presses the support portion against the peripheral edge of the substrate by urging the support portion toward the contact position by means of the attractive magnetic force or the repulsive magnetic force, and a pressing-force changing unit that changes a magnitude of a pressing force against the peripheral edge of the substrate pressed by the support portion while keeping the magnitude higher than zero in response to rotation of the rotary table.

According to this arrangement, the support portion of the movable pin is pressed against the peripheral edge of the substrate with a predetermined pressing force by means of a magnetic force generated between the driving magnet and the pressing magnet corresponding to this driving magnet. As a result, the substrate is gripped in the horizontal direction by means of the plurality of support pins. The substrate is rotated around the rotational axis by rotating the support pin and the rotary table around the rotational axis in this state, and a centrifugal force generated by the rotation acts on the peripheral edge of the substrate.

Additionally, the magnitude of a pressing force against the peripheral edge of the substrate applied by the movable pin is changed while being kept higher than zero in response to rotation of the rotary table. As a result, the substrate being in a rotational state becomes eccentric. This eccentric direction of the substrate changes in accordance with the rotational angle position of the substrate being in a rotational state.

As thus described, the substrate becomes eccentric in a state of being rotated, and the eccentric direction changes in accordance with the rotational angle position of the substrate being in a rotational state, and the operation of a centrifugal force acting on the peripheral edge of the substrate enables the substrate supported by the plurality of support pins to turn relatively and slightly in a circumferential direction opposite to the rotational direction of the substrate with respect to the rotary table. The amount of relative turning of the substrate is increased by allowing the rotary table to rotate continuously. As a result, it is possible to displace the contact-support position in the peripheral edge of the substrate supported by the support pin in the circumferential direction while allowing the plurality of support pins to come into contact with and support the peripheral edge of the substrate when the substrate is undergoing rotation processing. Therefore, it is possible to provide a substrate processing apparatus that is capable of excellently processing the peripheral edge of the substrate without the remainder after processing.

In the present preferred embodiment, the pressing-force changing unit includes a magnetic-force generating magnet that is a magnet differing from the pressing magnet and that has a magnetic pole that gives an attractive magnetic force or a repulsive magnetic force to urge the support portion toward the open position between the driving magnet and the magnetic-force generating magnet, a magnet drive unit that drives the magnetic-force generating magnet, a rotating/driving unit that relatively rotates the rotary table and the magnetic-force generating magnet around the rotational axis, and a pressing-force changing control unit that changes the magnitude of the pressing force applied by the support portion while controlling the magnet drive unit and the rotating/driving unit and while keeping the magnitude higher than zero, and the pressing-force changing control unit performs a magnetic-force generation-position placing step of placing the magnetic-force generating magnet at a first position at which an attractive magnetic force or a repulsive magnetic force having a smaller magnitude than an attractive magnetic force or a repulsive magnetic force generated between the driving magnet and the pressing magnet is generated between the driving magnet and the magnetic-force generating magnet, and a rotation step of relatively rotating the rotary table and the magnetic-force generating magnet around the rotational axis in a state in which the magnetic-force generating magnet is placed at the first position.

According to this arrangement, the substrate processing apparatus includes a magnetic-force generating magnet that has a magnetic pole that gives an attractive magnetic force or a repulsive magnetic force to urge the support portion toward the open position. The magnetic-force generating magnet is placed at a first position at which an attractive magnetic force or a repulsive magnetic force having a smaller magnitude than an attractive magnetic force or a repulsive magnetic force generated between the driving magnet and the pressing magnet is generated between the driving magnet and the magnetic-force generating magnet. Furthermore, the rotary table and the magnetic-force generating magnet are relatively rotated around the rotational axis in a state in which the magnetic-force generating magnet is placed at the first position. The substrate is also rotated around the rotational axis in response to the rotation of the rotary table around the rotational axis.

In this case, the distance between the driving magnet and the magnetic-force generating magnet changes in accordance with the rotational angle position of the substrate, i.e., the magnitude of a magnetic force (attractive magnetic force or repulsive magnetic force) that is given from the magnetic-force generating magnet and that acts on the driving magnet also changes in accordance with the rotational angle position of the substrate. This makes it possible to change a magnetic force (attractive magnetic force or repulsive magnetic force) generated between the driving magnet and the magnetic-force generating magnet in response to rotation of the substrate.

Moreover, in a state in which the magnetic-force generating magnet is placed at the first position, the magnitude of a magnetic force (attractive magnetic force or repulsive magnetic force) generated between the driving magnet and the magnetic-force generating magnet is smaller than that of a magnetic force (attractive magnetic force or repulsive magnetic force) generated between the driving magnet and the pressing magnet. Therefore, it is possible to change the magnitude of a pressing force against the peripheral edge of the substrate applied by the support portion of the movable pin while keeping its magnitude higher than zero in response to rotation of the rotary table.

The magnetic-force generating magnet may include a first magnetic-force generating magnet and a second magnetic-force generating magnet both of which have mutually different polar directions with respect to the radial direction of the rotary table, and the first magnetic-force generating magnet and the second magnetic-force generating magnet may be alternately disposed in a circumferential direction.

According to this arrangement, the first magnetic-force generating magnet and the second magnetic-force generating magnet are alternately disposed in the circumferential direction, and therefore the magnetic pole of a magnetic field given to the driving magnet changes in response to rotation of the rotary table (the magnetic field is nonuniform). In this case, it is possible to abruptly change a magnetic force generated between each driving magnet and the magnetic-force generating magnet (the first magnetic-force generating magnet or the second magnetic-force generating magnet) in accordance with the rotational angle position of the substrate. Therefore, it is possible to largely change a magnetic force generated between each driving magnet and the magnetic-force generating magnet in response to rotation of the substrate, and it is possible to accelerate the turning of the substrate. This makes it possible to even more effectively displace the contact-support positions in the peripheral edge of the substrate supported by the support pins in the circumferential direction.

The magnetic-force generating magnet may include a plurality of magnetic-force generating magnets that have mutually identical polar directions with respect to the radial direction of the rotary table, and the plurality of magnetic-force generating magnets may be spaced out in a circumferential direction.

According to this arrangement, the plurality of magnetic-force generating magnets are spaced out in the circumferential direction, and therefore the magnitude of a magnetic field given to the driving magnet changes in response to rotation of the rotary table (the magnetic field is nonuniform). In this case, it is possible to abruptly change a magnetic force generated between each driving magnet and the magnetic-force generating magnet in accordance with the rotational angle position of the substrate. Therefore, it is possible to largely change a magnetic force generated between each driving magnet and the magnetic-force generating magnet in response to rotation of the substrate, and it is possible to accelerate the turning of the substrate. This makes it possible to even more effectively displace the contact-support positions in the peripheral edge of the substrate supported by the support pins in the circumferential direction.

The magnet drive unit may include a magnet moving unit that moves the magnetic-force generating magnet between the first position and a second position at which a magnetic field is not generated between the driving magnet and the magnetic-force generating magnet.

According to this arrangement, the magnet moving unit allows the magnetic-force generating magnet to be moved between the first position and the second position, and, as a result, it is possible to make a transition between a state in which the contact-support position in the peripheral edge of the substrate deviates and a state in which the contact-support position in the peripheral edge of the substrate does not deviate during rotation processing. The amount of displacement in the circumferential direction of the substrate is proportional to the length of time during which the magnetic-force generating magnet is placed at the first position, and therefore the magnetic-force generating magnet is moved from the first position to the second position in a state in which a predetermined period of time has elapsed after placing the magnetic-force generating magnet at the first position, and, as a result, it is possible to control the amount of displacement in the circumferential direction of the substrate so as to be set at a desired amount.

The substrate processing apparatus may further include a processing liquid supply unit that supplies a processing liquid to an upper surface of the substrate. In this case, the pressing-force changing control unit may perform a processing-liquid supply step of controlling and allowing the processing liquid supply unit to supply a processing liquid to the upper surface of the substrate in parallel to the rotation step.

According to this arrangement, a processing liquid is supplied to the upper surface of the substrate in parallel to rotation of the rotary table with respect to the magnetic-force generating magnet. A load that acts on the substrate is increased by the supply of the processing liquid to the upper surface of the substrate. When the substrate is in a rotational state, the increase of the load acts on the substrate that is in contact with and that is supported by the plurality of support pins as rotational resistance that obstructs the turning of the substrate. Therefore, it is possible to more effectively displace the contact-support position in the peripheral edge of the substrate in the circumferential direction.

The present invention provides a substrate processing method that is executed in a substrate processing apparatus, the substrate processing apparatus including a rotary table, a substrate rotation holding device that is disposed to rotate around a rotational axis along a vertical direction together with the rotary table and that includes a plurality of support pins to support a substrate horizontally, the support pin including a movable pin that has a support portion disposed movably between a contact position at which the support pin comes into contact with a peripheral edge of the substrate and an open position that is more distant from the rotational axis than the contact position, and a driving magnet that is disposed correspondingly to the movable pin and that has a predetermined polar direction with respect to a radial direction of the rotary table, the substrate processing method including a pressing-force changing step of changing a magnitude of a pressing force against the peripheral edge of the substrate pressed by the support portion while keeping the magnitude higher than zero in response to rotation of the rotary table.

According to this method, the support portion of the movable pin is pressed against the peripheral edge of the substrate with a predetermined pressing force by means of a magnetic force generated between the driving magnet and the pressing magnet corresponding to this driving magnet. As a result, the substrate is gripped in the horizontal direction by means of the plurality of support pins. The substrate is rotated around the rotational axis by rotating the support pin and the rotary table around the rotational axis in this state, and a centrifugal force generated by the rotation acts on the peripheral edge of the substrate.

Additionally, the magnitude of a pressing force against the peripheral edge of the substrate applied by the movable pin is changed while being kept higher than zero in response to rotation of the rotary table. As a result, the substrate being in a rotational state becomes eccentric. This eccentric direction of the substrate changes in accordance with the rotational angle position of the substrate being in a rotational state.

As thus described, the substrate becomes eccentric in a state of being rotated, and the eccentric direction changes in accordance with the rotational angle position of the substrate being in a rotational state, and the operation of a centrifugal force acting on the peripheral edge of the substrate enables the substrate supported by the plurality of support pins to turn relatively and slightly in a circumferential direction opposite to the rotational direction of the substrate with respect to the rotary table. The amount of relative turning of the substrate is increased by allowing the rotary table to rotate continuously. As a result, it is possible to displace the contact-support position in the peripheral edge of the substrate supported by the support pin in the circumferential direction while allowing the plurality of support pins to come into contact with and support the peripheral edge of the substrate when the substrate is undergoing rotation processing. Therefore, it is possible to provide a substrate processing method that is capable of excellently processing the peripheral edge of the substrate without the remainder after processing.

In the substrate processing method of the present invention, the pressing-force changing step may include a magnetic-force generation-position placing step of placing a magnetic-force generating magnet that is a magnet differing from the pressing magnet and that has a magnetic pole that gives an attractive magnetic force or a repulsive magnetic force to urge the support portion toward the open position between the driving magnet and the magnetic-force generating magnet at a first position at which an attractive magnetic force or a repulsive magnetic force having a smaller magnitude than an attractive magnetic force or a repulsive magnetic force generated between the driving magnet and the pressing magnet is generated between the driving magnet and the magnetic-force generating magnet, and a rotation step of relatively rotating the rotary table and the magnetic-force generating magnet around the rotational axis in a state in which the magnetic-force generating magnet is placed at the first position.

According to this method, a magnetic-force generating magnet that has a magnetic pole that gives an attractive magnetic force or a repulsive magnetic force to urge the support portion toward the open position is placed at a first position at which an attractive magnetic force or a repulsive magnetic force having a smaller magnitude than an attractive magnetic force or a repulsive magnetic force generated between the driving magnet and the pressing magnet is generated between the driving magnet and the magnetic-force generating magnet. Furthermore, the rotary table and the magnetic-force generating magnet are relatively rotated around the rotational axis in a state in which the magnetic-force generating magnet is placed at the first position. The substrate is also rotated around the rotational axis in response to the rotation of the rotary table around the rotational axis.

In this case, the distance between the driving magnet and the magnetic-force generating magnet changes in accordance with the rotational angle position of the substrate, i.e., the magnitude of a magnetic force (attractive magnetic force or repulsive magnetic force) that is given from the magnetic-force generating magnet and that acts on the driving magnet also changes in accordance with the rotational angle position of the substrate. This makes it possible to change a magnetic force (attractive magnetic force or repulsive magnetic force) generated between the driving magnet and the magnetic-force generating magnet in response to rotation of the substrate.

Moreover, in a state in which the magnetic-force generating magnet is placed at the first position, the magnitude of a magnetic force (attractive magnetic force or repulsive magnetic force) generated between the driving magnet and the magnetic-force generating magnet is smaller than that of a magnetic force (attractive magnetic force or repulsive magnetic force) generated between the driving magnet and the pressing magnet. Therefore, it is possible to change the magnitude of a pressing force against the peripheral edge of the substrate applied by the support portion of the movable pin while keeping its magnitude higher than zero in response to rotation of the rotary table.

The substrate processing method may further include a magnet moving step of moving the magnetic-force generating magnet between the first position and a second position at which a magnetic field is not generated between the driving magnet and the magnetic-force generating magnet.

According to this method, the magnet moving unit allows the magnetic-force generating magnet to be moved between the first position and the second position, and, as a result, it is possible to make a transition between a state in which the contact-support position in the peripheral edge of the substrate deviates and a state in which the contact-support position in the peripheral edge of the substrate does not deviate during rotation processing. The amount of displacement in the circumferential direction of the substrate is proportional to the length of time during which the magnetic-force generating magnet is placed at the first position, and therefore the magnetic-force generating magnet is moved from the first position to the second position in a state in which a predetermined period of time has elapsed after placing the magnetic-force generating magnet at the first position, and, as a result, it is possible to control the amount of displacement in the circumferential direction of the substrate so as to be set at a desired amount.

The substrate processing method may further include a processing-liquid supply step of allowing a processing liquid supply unit to supply a processing liquid to the upper surface of the substrate in parallel to the rotation step.

According to this method, a processing liquid is supplied to the upper surface of the substrate in parallel to rotation of the rotary table with respect to the magnetic-force generating magnet. A load that acts on the substrate is increased by the supply of the processing liquid to the upper surface of the substrate. When the substrate is in a rotational state, the increase of the load acts on the substrate that is in contact with and that is supported by the plurality of support pins as rotational resistance that obstructs the turning of the substrate. Therefore, it is possible to more effectively displace the contact-support position in the peripheral edge of the substrate in the circumferential direction.

The aforementioned or other objects, features, and effects of the present invention will be clarified by the following description of preferred embodiments with reference to the accompanying drawings.

BRIEF DESCRIPTION OF THE DRAWINGS

FIG. 7 is an enlarged sectional view of the arrangement in a vicinity of a movable pin included in the spin chuck.

FIG. 8 is a schematic view showing an open state of a movable pin included in a first movable pin group.

FIG. 9 is a schematic view showing a closed state of the movable pin included in the first movable pin group.

FIG. 11 is a schematic view showing an open state of a movable pin included in a second movable pin group.

FIG. 12 is a schematic view showing a closed state of the movable pin included in the second movable pin group.

FIGS. 22A to 22H are pictorial views to describe a processing example of the processing-liquid processing.

FIG. 25 is a view showing a positional relationship between the first and second driving permanent magnets and the first and second magnetic-force generating magnets when the rotary table is rotated in the spin chuck.

DETAILED DESCRIPTION OF PREFERRED EMBODIMENTS

Figure 1:
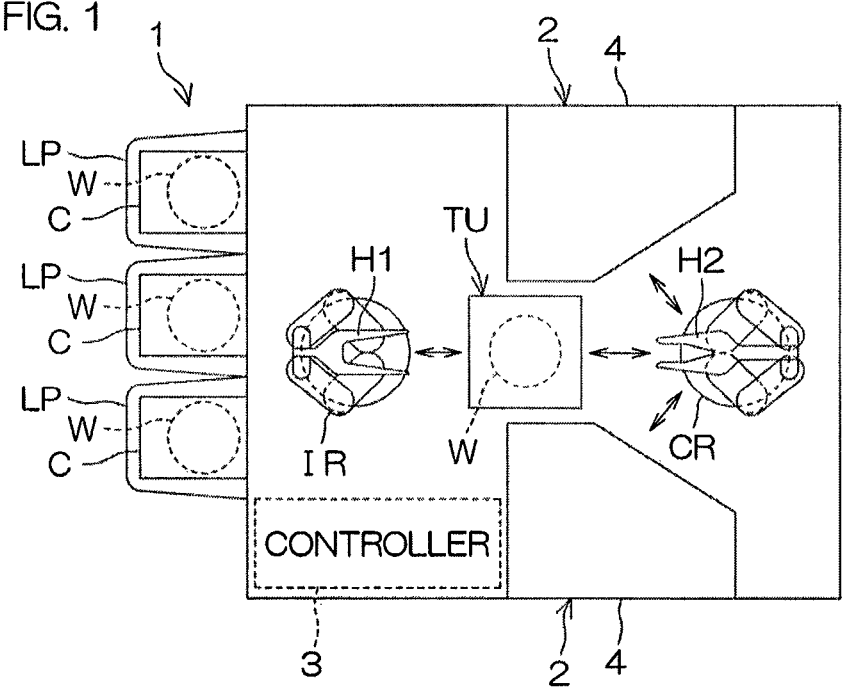
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a first preferred embodiment of the present invention.

The substrate processing apparatus 1 is a single substrate processing type apparatus that processes disk-shaped substrates W such as semiconductor wafers, one at a time by a processing liquid or a processing gas. The substrate processing apparatus 1 includes load ports LP that hold a plurality of carriers C, a turnover unit TU that performs up/down turnover of the orientation of the substrate W, and a plurality of processing units 2 that process the substrates W. The load ports LP and the processing units 2 are disposed across an interval in a horizontal direction. The turnover unit TU is disposed on a transfer path of the substrates W that are transferred between the load ports LP and the processing units 2.

As shown in FIG. 1, the substrate processing apparatus 1 further includes an indexer robot IR disposed between the load ports LP and the turnover unit TU, a center robot CR disposed between the turnover unit TU and the processing units 2, and a controller (pressing-force changing unit) 3 controlling operations of devices and opening/closing of valves included in the substrate processing apparatus 1. The indexer robot IR transfers a plurality of substrates W one by one from the carriers C held by the load ports LP to the turnover unit TU and transfers a plurality of substrates W one by one from the turnover unit TU to the carriers C held by the load ports LP. Similarly, the center robot CR transfers a plurality of substrates W one by one from the turnover unit TU to the processing units 2 and transfers a plurality of substrates W one by one from the processing units 2 to the turnover unit TU. The center robot CR further transfers substrates W among a plurality of processing units 2.

The indexer robot IR includes a hand H1 that holds a substrate W horizontally. The indexer robot IR moves the hand H1 horizontally. Further, the indexer robot IR elevates and lowers the hand H1 and rotates the hand H1 around a vertical axis. Similarly, the center robot CR includes a hand H2 that holds a substrate W horizontally. The center robot CR moves the hand H2 horizontally. Further, the center robot CR elevates and lowers the hand H2 and rotates the hand H2 around a vertical axis.

A substrate W is housed in a carrier C in a state where a front surface Wa of the substrate W that is a device forming surface is faced upward (upward facing orientation). The controller 3 makes the substrate W be transferred by the indexer robot IR in the state where the front surface Wa (see FIG. 2, etc.) is faced upward from the carrier C to the turnover unit TU. The controller 3 then makes the substrate W be turned over by the turnover unit TU. A rear surface Wb (see FIG. 2, etc.) of the substrate W is thereby faced upward. Thereafter, the controller 3 makes the substrate W be transferred by the center robot CR in the state where the rear surface Wb is faced upward from the turnover unit TU to a processing unit 2. The controller 3 then makes the rear surface Wb of the substrate W be processed by the processing unit 2.

After the rear surface Wb of the substrate W has been processed, the controller 3 makes the substrate W be transferred by the center robot CR in the state where the rear surface Wb is faced upward from the processing unit 2 to the turnover unit TU. The controller 3 then makes the substrate W be turned over by the turnover unit TU. The front surface Wa of the substrate W is thereby faced upward. Thereafter, the controller 3 makes the substrate W be transferred by the indexer robot IR in the state where the front surface Wa is faced upward from the turnover unit TU to a carrier C. The processed substrate W is thereby housed in the carrier C. The controller 3 makes the indexer robot IR, etc., execute this series of operations repeatedly to make a plurality of substrates W be processed one by one.

Figure 2:
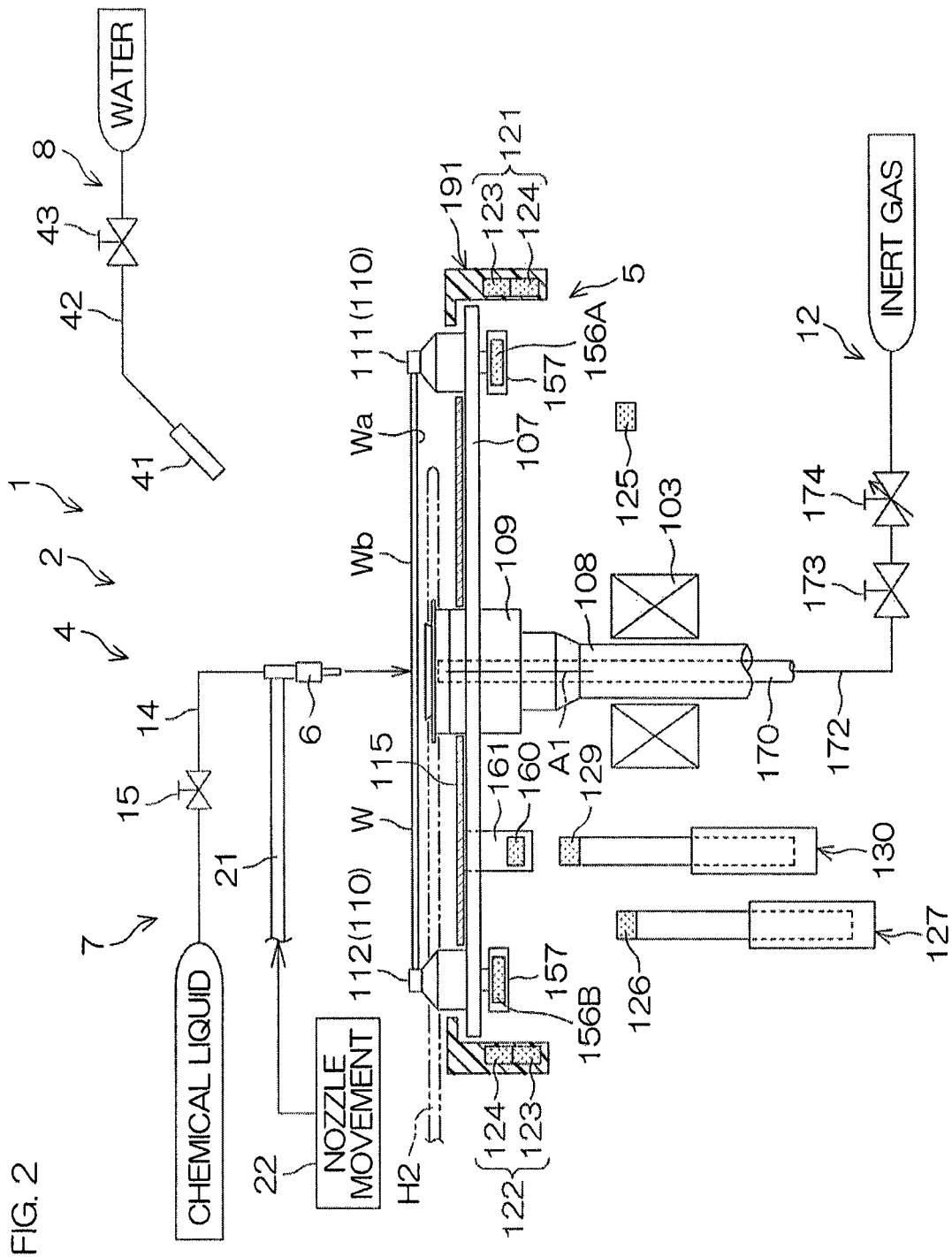
FIG. 2 is an illustrative sectional view for describing an arrangement example of a processing unit included in the substrate processing apparatus.
Figure 3:
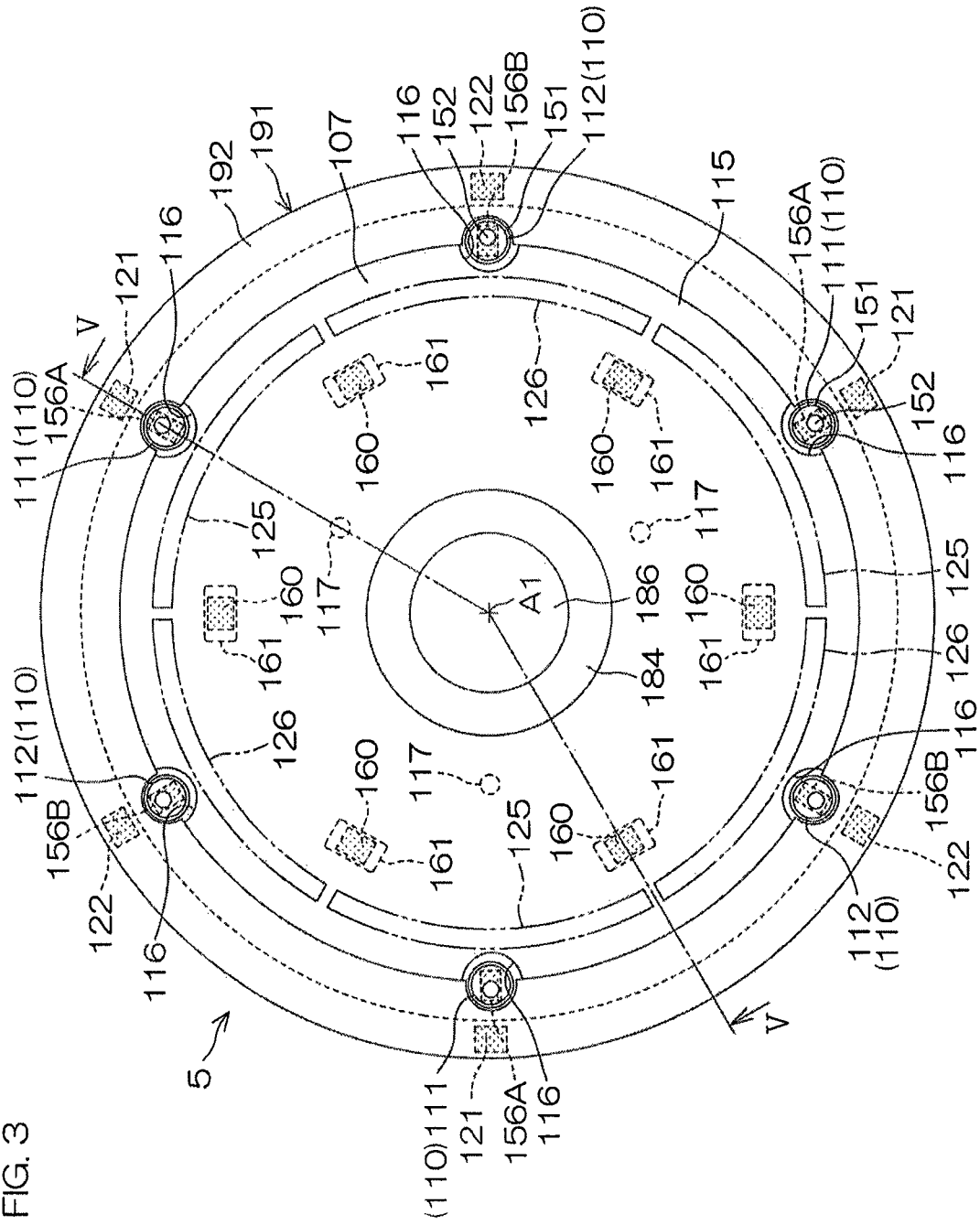
FIG. 3 is a plan view for describing a more specific arrangement of a spin chuck included in the substrate processing apparatus.
Figure 4:
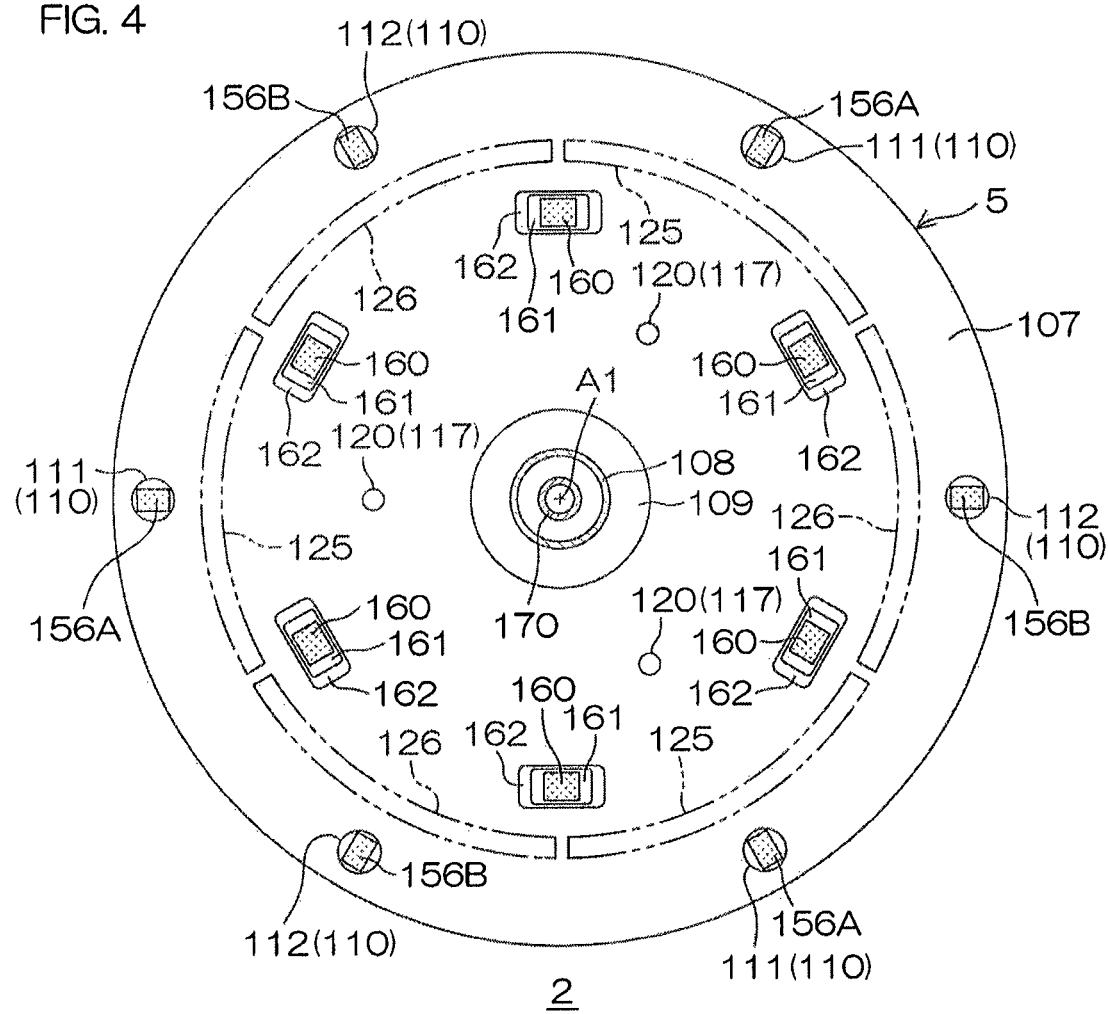
FIG. 4 is a bottom view of the arrangement of FIG. 3.
Figure 5:
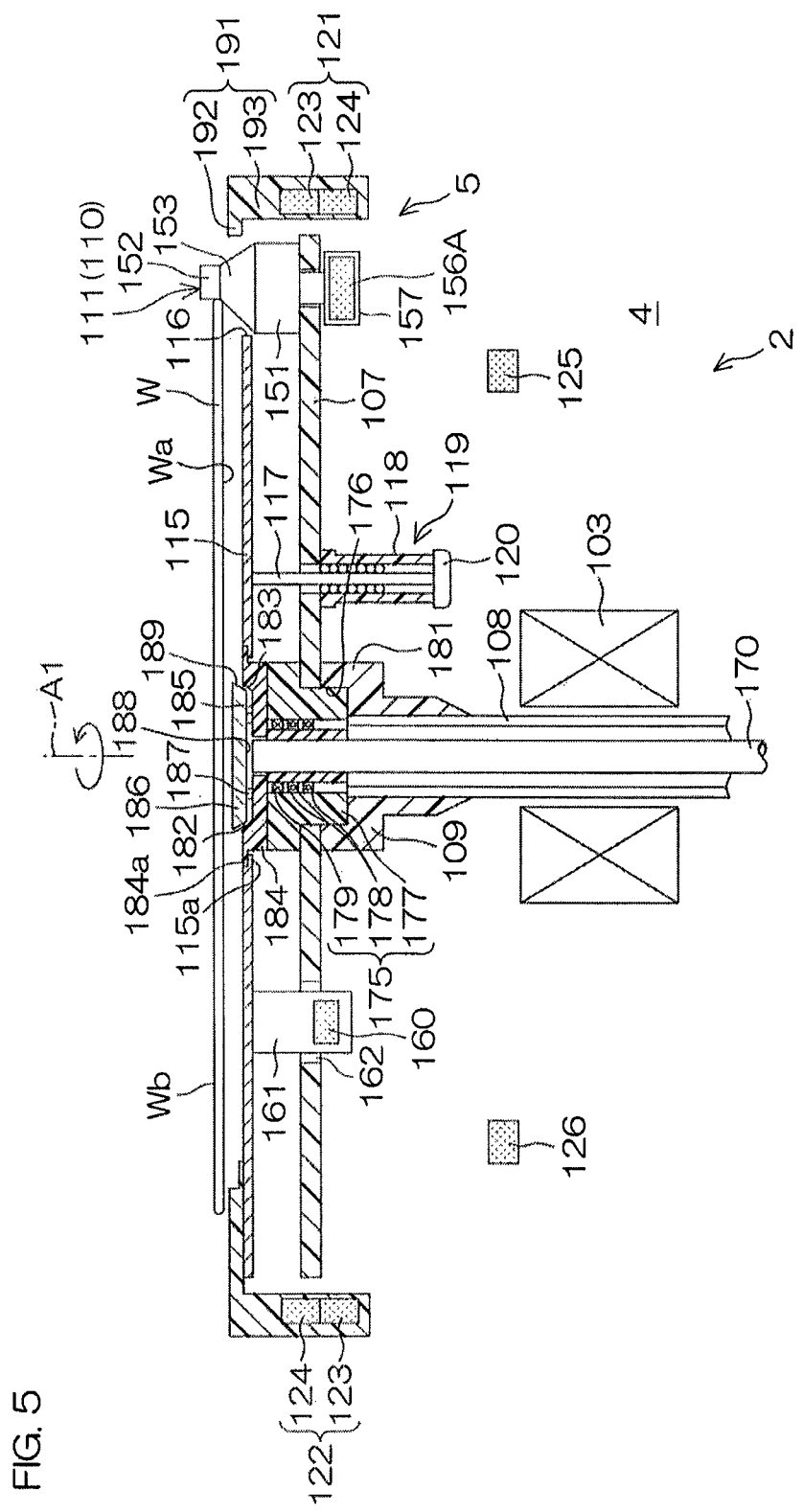
FIG. 5 is a sectional view taken along section line V-V of FIG. 3.
Figure 6:
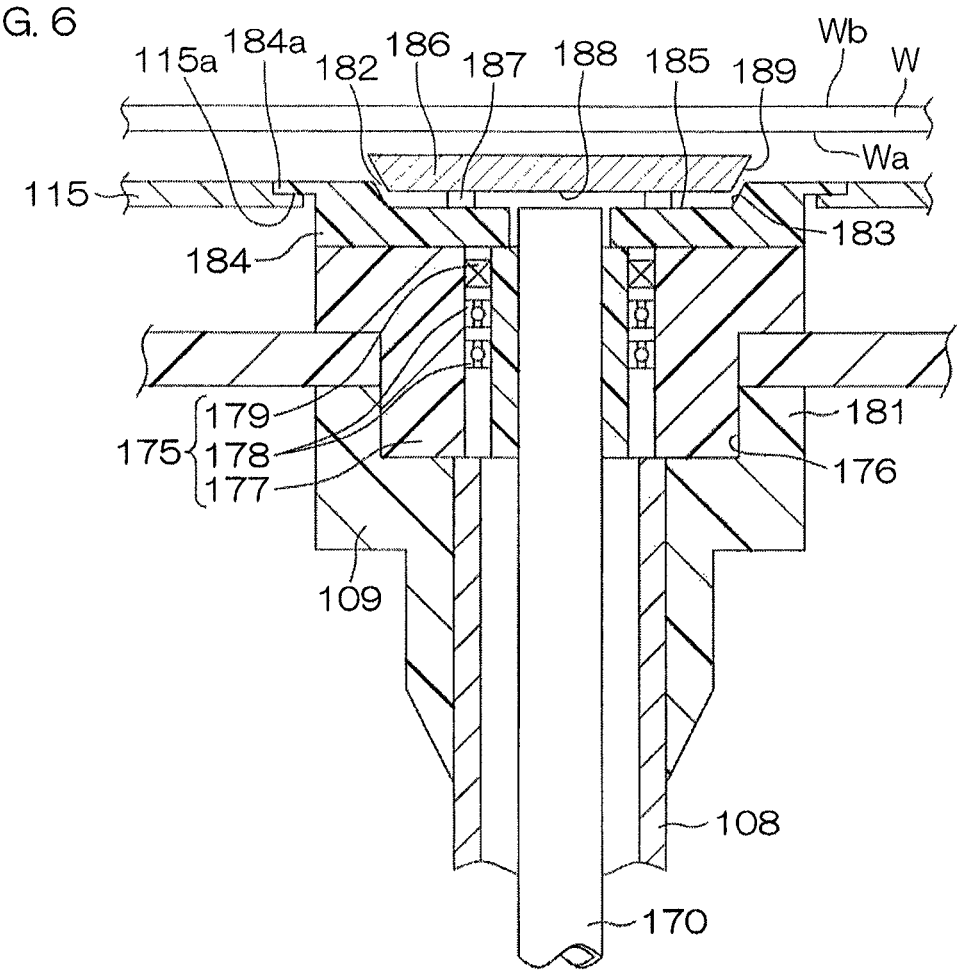
FIG. 6 is an enlarged sectional view showing a portion of the arrangement of FIG. 5 in enlarged manner.

FIG. 2 is an illustrative sectional view for describing an arrangement example of a processing unit 2 included in the substrate processing apparatus 1. FIG. 3 is a plan view for describing a more specific arrangement of a spin chuck 5 included in the substrate processing apparatus 1. FIG. 4 is a bottom view of the arrangement of FIG. 3. FIG. 5 is a sectional view taken along section line V-V of FIG. 3. FIG. 6 is an enlarged sectional view showing a portion of the arrangement of FIG. 5 in enlarged manner. FIG. 7 is an enlarged sectional view of the arrangement in a vicinity of a movable pin 110 included in the spin chuck 5.

As shown in FIG. 2, each processing unit 2 includes a box-shaped processing chamber 4 having an internal space, a spin chuck 5 holding a single substrate W in a horizontal orientation inside the processing chamber 4 and rotating the substrate W around a vertical rotational axis A1 passing through a center of the substrate W, a chemical liquid supplying unit (processing liquid supplying unit) 7 arranged to supply a chemical liquid (processing liquid) toward an upper surface (rear surface Wb) of the substrate W held by the spin chuck 5, a water supplying unit (processing liquid supplying unit) 8 arranged to supply water as a rinse liquid (processing liquid) to the upper surface of the substrate W held by the spin chuck 5, a protective gas supplying unit 12 arranged to supply an inert gas as a protective gas to a lower surface (front surface Wa) of the substrate W held by the spin chuck 5, and a cylindrical processing cup (not shown) surrounding the spin chuck 5.

As shown in FIG. 2, the processing chamber 4 includes a box-shaped partition wall (not shown), an FFU (fan filter unit, not shown) as a blower unit delivering clean air from an upper portion of the partition wall into an interior of the partition wall (corresponding to an interior of the processing chamber 4), and an exhaust device (not shown) expelling gas inside the processing chamber 4 from a lower portion of the partition wall. A down flow (downward flow) is formed inside the processing chamber 4 by the FFU and the exhaust device.

As shown in FIG. 2, the spin chuck 5 includes a rotary table 107 rotatable around a rotational axis A1 aligned with a vertical direction. A rotational shaft 108 is coupled via a boss 109 to a lower surface of a rotation center of the rotary table 107. The rotational shaft 108 is a hollow shaft, extends along the vertical direction, and is arranged to receive a driving force from a rotation driving unit 103 to rotate around the rotational axis A1. The rotation driving unit 103 may, for example, be an electric motor having the rotational shaft 108 as a drive shaft.

As shown in FIG. 2, the spin chuck 5 further includes a plurality (six, in the present preferred embodiment) of movable pins 110 that are provided across substantially equal intervals along a circumferential direction at a peripheral edge portion of an upper surface of the rotary table 107. The respective movable pins 110 are arranged to hold the substrate W horizontally at an upper substrate holding height across a fixed interval from the rotary table 107 that has a substantially horizontal upper surface. That is, the holding pins included in the spin chuck 5 are all movable pins 110. The rotary table 107 is formed to a disk shape along a horizontal plane and is coupled to the boss 109 coupled to the rotational shaft 108.

As shown in FIG. 3, the respective movable pins 110 are disposed at equal intervals along the circumferential direction at the peripheral edge portion of the upper surface of the rotary table 107. With the six movable pins 110, each set of three movable pins 110 that are not mutually adjacent is configured as a single group with which magnetic pole directions of corresponding driving permanent magnets 156A or 156B are the same. In other words, the six movable pins 110 include three movable pins 110 included in a first movable pin group 111 and three movable pins 110 included in a second movable pin group 112. The magnetic pole direction of each of the first driving permanent magnets 156A, corresponding to the three movable pins 110 included in the first movable pin group 111, and the magnetic pole direction of each of the second driving permanent magnets 156B, corresponding to the three movable pins 110 included in the second movable pin group 112, differ mutually with respect to a direction orthogonal to a rotational axis A3. The movable pins 110 included in the first movable pin group 111 and the movable pins 110 included in the second movable pin group 112 are disposed alternately with respect to the circumferential direction of the rotary table 107. In regard to the first movable pin group 111, the three movable pins 110 are disposed at equal intervals (120° intervals). Also, in regard to the second movable pin group 112, the three movable pins 110 are disposed at equal intervals (120° intervals).

Each movable pin 110 includes a lower shaft portion 151, coupled to the rotary table 107, and an upper shaft portion (support portion) 152, formed integral to an upper end of the lower shaft portion 151, and the lower shaft portion 151 and the upper shaft portion 152 are respectively formed to circular columnar shapes. The upper shaft portion 152 is arranged to be eccentric from a central axis of the lower shaft portion 151. A front surface connecting between the upper end of the lower shaft portion 151 and a lower end of the upper shaft portion 152 forms a tapered surface 153 descending from the upper shaft portion 152 to a peripheral surface of the lower shaft portion 151.

As shown in FIG. 7, each movable pin 110 is coupled to the rotary table 107 so that the lower shaft portion 151 is rotatable around the rotational axis A3 coaxial to a central axis thereof. More specifically, a support shaft 155, supported via a bearing 154 with respect to the rotary table 107, is provided at a lower end portion of the lower shaft portion 151. A magnet holding member 157, holding a driving permanent magnet (first or second driving magnet) 156A or 156B, is coupled to a lower end of the support shaft 155. The driving permanent magnet 156A or 156B is, for example, disposed with the magnetic pole direction directed in a direction orthogonal to the rotational axis A3 of the movable pin 110. The first driving permanent magnets 156A are driving permanent magnets corresponding to the movable pins 110 included in the first movable pin group 111. The second driving permanent magnets 156B are driving permanent magnets corresponding to the movable pins 110 included in the second movable pin group 112. The first driving permanent magnets 156A and the second driving permanent magnets 156B are arranged to have mutually oppositely directed but equal magnetic pole directions with respect to the direction orthogonal to the rotational axis A3 (direction orthogonal to an axis aligned with the rotational axis) in a state where an external force is not applied to the movable pins 110 corresponding to the driving permanent magnets 156A and 156B. The first driving permanent magnets 156A and the second driving permanent magnets 156B are disposed alternately with respect to the circumferential direction of the rotary table 107.

One of the features of the present preferred embodiment resides in that a first magnetic-force generating magnet 125 and a second magnetic-force generating magnet 126 are provided below the rotary table 107.

As shown in FIG. 2, the polar direction of the first magnetic-force generating magnet 125 and the polar direction of the second magnetic-force generating magnet 126 are both followed in the up-down direction, and yet are opposite in direction to each other. If the upper surface of the first magnetic-force generating magnet 125 is, for example, the N pole, the upper surface of the second magnetic-force generating magnet 126 is the S pole that is opposite in polarity thereto.

In the present preferred embodiment, three first magnetic-force generating magnets 125 and three second magnetic-force generating magnets 126 are provided (which are identical in number with the movable pins 110 included in the movable pin groups 111 and 112). The three first driving permanent magnets 156A and the three second driving permanent magnets 156B are alternately disposed with respect to the circumferential direction of the rotary table 107 in a plan view.

The three first magnetic-force generating magnets 125 form a circular arc that centers on the rotational axis A1, and are spaced out at mutually common height positions and in the circumferential direction of the rotary table 107. The three first magnetic-force generating magnets 125 have mutually identical specifications, and the length (angle) in the circumferential direction of each of the first magnetic-force generating magnets 125 is about 60°. The three first magnetic-force generating magnets 125 are evenly spaced out in the circumferential direction on the circumference that is coaxial with the rotational axis A1. Each of the first magnetic-force generating magnets 125 is disposed along a plane (horizontal plane) perpendicular to the rotational axis A1.

The three second magnetic-force generating magnets 126 form a circular arc that centers on the rotational axis A1, and are spaced out at mutually common height positions and in the circumferential direction of the rotary table 107. The three second magnetic-force generating magnets 126 have mutually identical specifications, and the length (angle) in the circumferential direction of each of the second magnetic-force generating magnets 126 is about 60°. The three second magnetic-force generating magnets 126 are evenly spaced out in the circumferential direction on the circumference that is coaxial with the rotational axis A1. Each of the second magnetic-force generating magnets 126 is disposed along a plane (horizontal plane) perpendicular to the rotational axis A1.

A first up-and-down unit (magnet moving unit) 127 that raises and lowers the plurality of first magnetic-force generating magnets 125 and the plurality of second magnetic-force generating magnets 126 together is joined to the first magnetic-force generating magnet 125 and to the second magnetic-force generating magnet 126. The first up-and-down unit 127 is arranged to include, for example, a cylinder disposed so as to be extensible and contractible in the up-down direction, and is supported by this cylinder. The first up-and-down unit 127 may be arranged to use an electric motor.

The first magnetic-force generating magnet 125 is a magnet that generates an attractive magnetic force or a repulsive magnetic force (in the present preferred embodiment, an attractive magnetic force is mentioned as an example of "an attractive magnetic force or a repulsive magnetic force." Therefore, "an attractive magnetic force or a repulsive magnetic force" will be hereinafter described as "an attractive magnetic force.") between the first driving permanent magnet 156A and the first magnetic-force generating magnet 125 and that urges the upper shaft portion 152 of the movable pin 110 included in the first movable pin group 111 to an open position by the attractive magnetic force. In a state in which the first magnetic-force generating magnet 125 is disposed at an upper position (a first position, which is shown by the solid line in FIG. 10) slightly lower than the first driving permanent magnet 156A, a slight attractive magnetic force acts between the first magnetic-force generating magnet 125 and the first driving permanent magnet 156A when the first magnetic-force generating magnet 125 and the first driving permanent magnet 156A coincide with each other with respect to their rotational directions.

On the other hand, in a state in which the first magnetic-force generating magnet 125 is disposed at a lower position (a second position, which is shown by the broken line in FIG. 13) lower than the upper position, a magnetic force is not generated between the first magnetic-force generating magnet 125 and the first driving permanent magnet 156A when the first magnetic-force generating magnet 125 and the first driving permanent magnet 156A coincide with each other with respect to their rotational directions.

The second magnetic-force generating magnet 126 is a magnet that generates an attractive magnetic force or a repulsive magnetic force (in the present preferred embodiment, an attractive magnetic force is mentioned as an example of "an attractive magnetic force or a repulsive magnetic force." Therefore, "an attractive magnetic force or a repulsive magnetic force" will be hereinafter described as "an attractive magnetic force.") between the second driving permanent magnet 156B and the second magnetic-force generating magnet 126 and that urges the upper shaft portion 152 of the movable pin 110 included in the second movable pin group 112 to an open position by the attractive magnetic force. In a state in which the second magnetic-force generating magnet 126 is disposed at an upper position (a first position, which is shown by the solid line in FIG. 10) slightly lower than the second driving permanent magnet 156B, a slight attractive magnetic force acts between the second magnetic-force generating magnet 126 and the second driving permanent magnet 156B when the second magnetic-force generating magnet 126 and the second driving permanent magnet 156B coincide with each other with respect to their rotational directions.

On the other hand, in a state in which the second magnetic-force generating magnet 126 is disposed at a lower position (a second position, which is shown by the broken line in FIG. 13) lower than the upper position, a magnetic force is not generated between the second magnetic-force generating magnet 126 and the second driving permanent magnet 156B when the second magnetic-force generating magnet 126 and the second driving permanent magnet 156B coincide with each other with respect to their rotational directions.

In the present preferred embodiment, the first magnetic-force generating magnet 125, the second magnetic-force generating magnet 126, the first up-and-down unit 127, the rotating/driving unit 103, and the controller 3 are included in the pressing-force changing unit.

As shown in FIG. 2, the spin chuck 5 further includes a protective disk 115 disposed between the upper surface of the rotary table 107 and the height of substrate holding by the movable pins 110. The protective disk 115 is coupled to the rotary table 107 in a manner enabling up/down movement, and is capable of moving between a lower position close to the upper surface of the rotary table 107 and an approach position approaching, across a minute interval, the lower surface of the substrate W held higher than the lower position by the movable pins 110. The protective disk 115 is a disk-shaped member having a size of slightly larger diameter than the substrate W and has notches 116 formed therein to avoid the movable pins 110 at positions corresponding to the movable pins 110.

The rotational shaft 108 is a hollow shaft and has an inert gas supply pipe 170 inserted through its interior. An inert gas supply passage 172, guiding an inert gas, as an example of a protective gas, from an inert gas supply source, is coupled to a lower end of the inert gas supply pipe 170. An inert gas, such as CDA (clean dry air) or nitrogen gas, etc., can be cited as an example of the inert gas guided by the inert gas supply passage 172. An inert gas valve 173 and an inert gas flow control valve 174 are interposed in the middle of the inert gas supply passage 172. The inert gas valve 173 opens and closes the inert gas supply passage 172. By opening the inert gas valve 173, the inert gas is delivered into the inert gas supply pipe 170. The inert gas is supplied to a space between the protective disk 115 and the lower surface of the substrate W by the arrangement to be described below. The protective gas supplying unit 12 is thus arranged from the inert gas supply pipe 170, the inert gas supply passage 172, the inert gas valve 173, etc.

The protective disk 115 is a substantially disk-shaped member having a size approximately equal to that of the substrate W. At a peripheral edge portion of the protective disk 115, the notches 116 are formed at positions corresponding to the movable pins 110 so as to border the movable pins 110 while securing fixed intervals from outer peripheral surfaces of the movable pins 110. A circular opening, corresponding to the boss 109, is formed in a central region of the protective disk 115.

As shown in FIG. 3 and FIG. 5, guide shafts 117, extending in the vertical direction parallel to the rotational axis A1, are coupled to a lower surface of the protective disk 115 at positions further away from the rotational axis A1 than the boss 109. In the present preferred embodiment, the guide shafts 117 are disposed at three locations at equal intervals in a circumferential direction of the protective disk 115. More specifically, as viewed from the rotational axis A1, the three guide shafts 117 are respectively disposed at angular positions corresponding to every other movable pin 110. The guide shafts 117 are coupled to linear bearings 118 provided at corresponding locations of the rotary table 107 and are capable of moving in the vertical direction, that is, the direction parallel to the rotational axis A1, while being guided by the linear bearings 118. The guide shafts 117 and the linear bearings 118 thus constitute guiding units 119 that guide the protective disk 115 along the up/down direction parallel to the rotational axis A1.

The guide shafts 117 penetrate through the linear bearings 118 and include outwardly projecting flanges 120 at lower ends thereof. By contacting of the flanges 120 with the lower ends of the linear bearings 118, upward movement of the guide shafts 117, that is, upward movement of the protective disk 115 is restricted. That is, the flanges 120 are restricting members that restrict the upward movement of the protective disk 115.

Magnet holding members 161 that hold the first levitating magnets 160 are fixed to the lower surface of the protective disk 115 at positions further outward and further away from the rotational axis A1 than the guide shafts 117 and further inward and closer to the rotational axis A1 than the movable pins 110. In the present preferred embodiment, the first levitating magnets 160 are held in the magnet holding members 161 with magnetic pole directions being directed in the up/down direction. For example, the first levitating magnets 160 may be fixed to the magnet holding members 161 so as to have the S poles at the lower sides and have the N poles at the upper sides. In the present preferred embodiment, the magnet holding members 161 are provided at six locations at equal intervals in the circumferential direction. More specifically, as viewed from the rotational axis A1, each magnet holding member 161 is disposed at an angular position corresponding to being between (in the middle in the present preferred embodiment) mutually adjacent movable pins 110. Further, the three guide shafts 117 are respectively disposed in every other angular region (at a central position of every other angular region in the present preferred embodiment) among six angular regions that are divided (divided equally in the present preferred embodiment) by the six magnet holding members 161 as viewed from the rotational axis A1.

As shown in FIG. 4, penetrating holes 162 are formed at six locations of the rotary table 107 corresponding to the six magnet holding members 161. The respective penetrating holes 162 are formed to enable the corresponding magnet holding members 161 to be respectively inserted through in the vertical direction parallel to the rotational axis A1. When the protective disk 115 is at the lower position, the magnet holding members 161 are inserted through the penetrating holes 162 and project lower than the lower surface of the rotary table 107 and the first levitating magnets 160 are positioned lower than the lower surface of the rotary table 107.

A second levitating magnet 129 arranged to levitate the protective disk 115 is provided below the rotary table 107. The second levitating magnet 129 is formed to a circular annular shape coaxial to the rotational axis A1 and is disposed along a plane (horizontal plane) orthogonal to the rotational axis A1. The second levitating magnet 129 is disposed at a position closer to the rotational axis A1 than the first and second opening permanent magnets 125 and 127. That is, it is positioned further to an inner diameter side than the first and second opening permanent magnets 125 and 127 in plan view. Also, the second levitating magnet 129 is disposed at a position lower than the first levitating magnets 160. In the present preferred embodiment, a magnetic pole direction of the second levitating magnet 129 is aligned with a horizontal direction, that is, a rotation radial direction of the rotary table 107. When the first levitating magnets 160 have the S poles at the lower surfaces, the second levitating magnet 129 is arranged to have the same magnetic pole, that is, the S pole in a ring shape at the inner side in the rotation radial direction.

A third elevating/lowering unit (third relative movement unit) 130 that elevates and lowers the second levitating magnet 129 is coupled to the second levitating magnet 129. The third elevating/lowering unit 130 is of an arrangement that includes, for example, a cylinder arranged to be capable of extending and contracting in the up/down direction and is supported by the cylinder. Also, the third elevating/lowering unit 130 may be arranged using an electric motor.

When the second levitating magnet 129 is at an upper position (see FIG. 22B), a repulsive magnetic force acts between the second levitating magnet 129 and the first levitating magnets 160, and the first levitating magnets 160 receive an upward external force. The protective disk 115 thereby receives an upward force from the magnet holding portions 161 holding the first levitating magnets 160 and is held at the approach position approaching the lower surface of the substrate W.

In the state where the second levitating magnet 129 is disposed at a lower position (see FIG. 19A) separated downward from the upper position, the repulsive magnetic force between the second levitating magnet 129 and the first levitating magnets 160 is small and therefore the protective disk 115 is maintained by its own weight at the lower position close to the upper surface of the rotary table 107.

Therefore when the second levitating magnet 129 is at the lower position, the protective disk 115 is at the lower position close to the upper surface of the rotary table 107 and the movable pins 110 are held at the open position. In this state, the center robot CR that carries in and carries out the substrate W with respect to the spin chuck 5 can make its hand H2 enter into the space between the protective disk 115 and the lower surface of the substrate W.

As shown in enlarged manner in FIG. 6, the boss 109 coupled to the upper end of the rotational shaft 108 holds a bearing unit 175 arranged to support an upper end portion of the inert gas supply pipe 170. The bearing unit 175 includes a spacer 177, fitted and fixed in a recess 176 formed in the boss 109, a bearing 178 disposed between the spacer 177 and the inert gas supply pipe 170, and a magnetic fluid bearing 179 provided similarly but higher than the bearing 178 between the spacer 177 and the inert gas supply pipe 170.

As shown in FIG. 5, the boss 109 integrally has a flange 181 projecting outward along a horizontal plane and the rotary table 107 is coupled to the flange 181. Further, the spacer 177 is fixed to the flange 181 so as to sandwich an inner peripheral edge portion of the rotary table 107, and a cover 184 is coupled to the spacer 177. The cover 184 is formed substantially to a disk shape, has, at its center, an opening arranged to expose an upper end of the inert gas supply pipe 170, and has formed, in its upper surface, a recess 185 with the opening as a bottom surface. The recess 185 has a horizontal bottom surface and an inclined surface 183 of inverted conical surface shape that rises obliquely upward toward the exterior from a peripheral edge of the bottom surface. A flow straightening member 186 is coupled to the bottom surface of the recess 185. The flow straightening member 186 has a plurality (for example, four) of leg portions 187, disposed discretely around the rotational axis A1 at intervals along the circumferential direction, and has a bottom surface 188 disposed, by the leg portions 187 at an interval from the bottom surface of the recess 185. An inclined surface 189 constituted of an inverted conical surface is formed that rises obliquely upward toward the exterior from a peripheral edge of portion the bottom surface 188.

As shown in FIG. 5 and FIG. 6, a flange 184a is formed outwardly at an upper surface outer peripheral edge of the cover 184. The flange 184a is arranged to match a step portion 115a formed at an inner peripheral edge of the protective disk 115. That is, when the protective disk 115 is at the approach position approaching the lower surface of the substrate W, the flange 184a and the step portion 115a are merged and an upper surface of the cover 184 and an upper surface of the protective disk 115 are positioned within the same plane to form a flat inert gas flow passage.

By such an arrangement, the inert gas flowing out from the upper end of the inert gas supply pipe 170 exits into a space defined by the bottom surface 188 of the flow straightening member 186 inside the recess 185 of the cover 184. The inert gas further blows out in radial directions away from the rotational axis A1 via a radial flow passage 182 defined by the inclined surface 183 of the recess 185 and the inclined surface 189 of the flow straightening member 186. The inert gas forms a gas stream of inert gas in the space between the protective disk 115 and the lower surface of the substrate W held by the movable pins 110 and blows outward in rotation radial directions of the substrate W from the space.

As shown in FIG. 5, a peripheral edge portion of the upper surface of the protective disk 115 and a peripheral end of the protective disk 115 are covered by a circular annular cover 191 of circular annular shape. The circular annular cover 191 includes a circular annular plate portion 192 protruding in horizontal directions and outward in radial directions from a peripheral edge portion of its upper surface, and a circular cylindrical portion 193 extending downward from a peripheral end of the circular annular plate portion 192. An outer periphery of the circular annular plate portion 192 is disposed further outward than a peripheral end of the rotary table 107. The circular annular plate portion 192 and the circular cylindrical portion 193 are formed integrally using, for example, a resin material having chemical resistance. Notches 194, arranged to avoid the movable pins 110, are formed at positions of an inner periphery of the circular annular plate portion 192 corresponding to the movable pins 110. The notches 194 are formed so as to border the movable pins 110 with fixed intervals being secured from the outer peripheral surfaces of the movable pins 110. The circular annular plate portion 192 and the circular cylindrical portion 193 are formed integrally using, for example, a resin material having chemical resistance.

The circular annular plate portion 192 of the circular annular cover 191 has, on its upper surface, a constricting portion that constricts the flow passage of the inert gas at a peripheral edge portion of the substrate W held by the movable pins 110. By the constricting portion, a flow speed of the inert gas flow blowing outward from the space between the circular annular cover 191 and the lower surface of the substrate W is made high, thereby enabling reliable avoidance or suppression of entry of the processing liquid (chemical liquid or rinse liquid) on the upper surface of the substrate W further inward than a peripheral edge portion of the lower surface of the substrate W.

Opening/closing switching permanent magnets 121 and 122 the number of which is identical with the number of the movable pins 110 (in the present preferred embodiment, six) are buried in the cylindrical portion 193. The plurality of opening/closing switching permanent magnets 121 and 122 are spaced out in the circumferential direction. Each of the opening/closing switching permanent magnets 121 and 122 is formed in a rod shape, and is buried in the cylindrical portion 193 in a state of extending in the up-down direction. The opening/closing switching permanent magnet includes a first opening/closing switching permanent magnet (pressing magnet) 121 and a second opening/closing switching permanent magnet (pressing magnet) 122 that is reversed in polarity with the first opening/closing switching permanent magnet 121 in the up-down direction. The first opening/closing switching permanent magnet 121 is a permanent magnet to drive the movable pin 110 included in the first movable pin group 111, and the second opening/closing switching permanent magnet 122 is a permanent magnet to drive the movable pin 110 included in the second movable pin group 112. In other words, the plurality of opening/closing switching permanent magnets 121 and 122 are evenly spaced out. The first opening/closing switching permanent magnet 121 and the second opening/closing switching permanent magnet 122 are alternately disposed in the circumferential direction. In the present preferred embodiment, the first opening/closing switching permanent magnet 121 has an N-pole portion 123 showing N polarity on its upper end side, and has an S-pole portion 124 showing S polarity on its lower end side.

Figure 10:
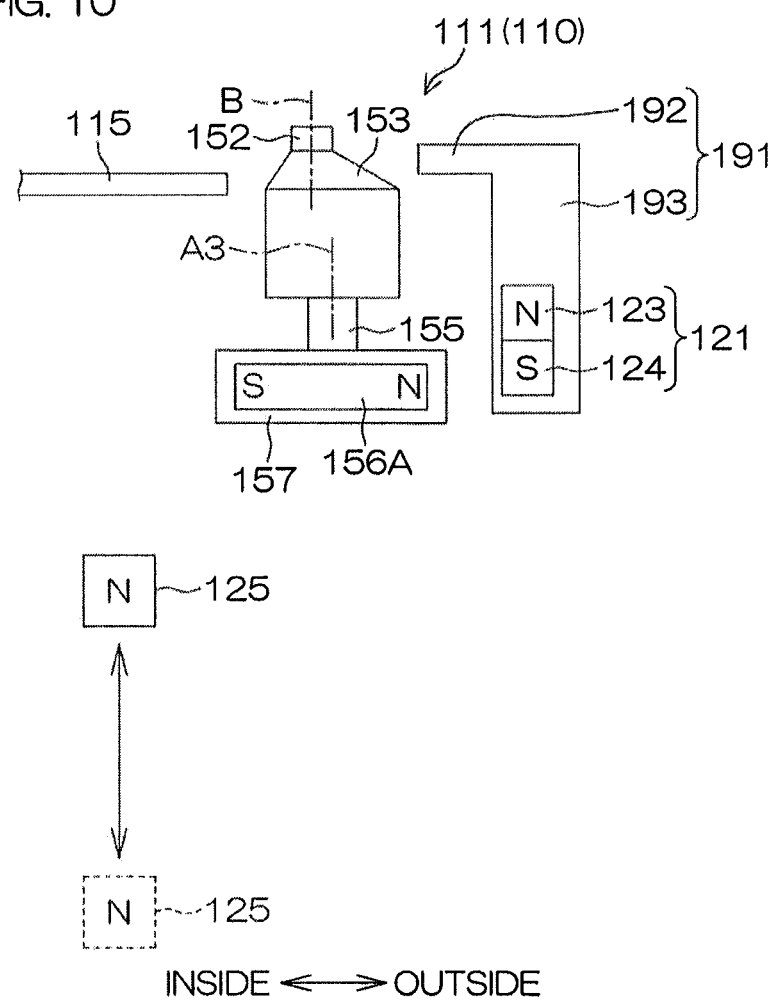
FIG. 10 is a schematic view showing a state of the movable pin included in the first movable pin group resulting from the up-and-down movement of the first magnetic-force generating magnet.

FIG. 8 is a schematic view showing an open state of the movable pin 110 included in the first movable pin group 111. FIG. 9 is a schematic view showing a closed state of the movable pin 110 included in the first movable pin group 111. FIG. 10 is a schematic view showing a state of the movable pin 110 included in the first movable pin group 111 resulting from the up-and-down movement of the first magnetic-force generating magnet 125. In FIG. 10, a state in which the first magnetic-force generating magnet 125 is at the upper position is shown by the solid line, and a state in which the first magnetic-force generating magnet 125 is at the lower position is shown by the broken line.

Figure 13:
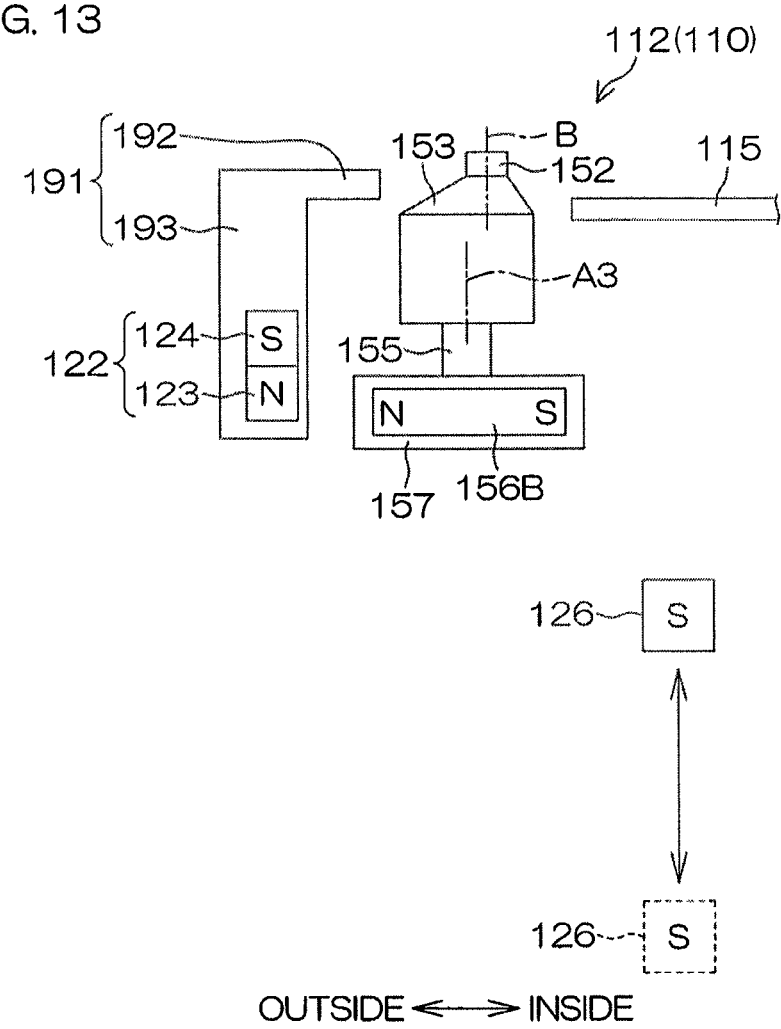
FIG. 13 is a schematic view showing a state of the movable pin included in the second movable pin group resulting from the up-and-down movement of the second magnetic-force generating magnet.

FIG. 11 is a schematic view showing an open state of the movable pin 110 included in the second movable pin group 112. FIG. 12 is a schematic view showing a closed state of the movable pin 110 included in the second movable pin group 112. FIG. 13 is a schematic view showing a state of the movable pin 110 included in the second movable pin group 112 resulting from the up-and-down movement of the second magnetic-force generating magnet 126. In FIG. 13, a state in which the second magnetic-force generating magnet 126 is at the upper position is shown by the solid line, and a state in which the second magnetic-force generating magnet 126 is at the lower position is shown by the broken line.

As shown in FIG. 8 and FIG. 9, the first opening/closing switching permanent magnet 121 is disposed so that the N-pole portion 123 on the upper end side approaches the first driving permanent magnet 156A when the protective disk 115 is at the approach position and so that the S-pole portion 124 on the lower end side approaches the first driving permanent magnet 156A when the protective disk 115 is at the lower position.

As shown in FIG. 11 and FIG. 12, the second opening/closing switching permanent magnet 122 is disposed so that the S-pole portion 124 on the upper end side approaches the second driving permanent magnet 156B when the protective disk 115 is at the approach position and so that the N-pole portion 123 on the lower end side approaches the second driving permanent magnet 156B when the protective disk 115 is at the lower position.

In the first preferred embodiment, the protective disk 115 is held at the approach position at which the protective disk 115 has approached the lower surface of the substrate W by means of the operation of a repulsive magnetic force generated between the second disk-floating magnet 129 and the first disk-floating magnet 160 when the second disk-floating magnet 129 is at the upper position (see FIG. 9 and FIG. 12) as described above. On the other hand, when the second disk-floating magnet 129 is at the lower position (see FIG. 8 and FIG. 11) downwardly apart from the upper position, the repulsive magnetic force between the second disk-floating magnet 129 and the first disk-floating magnet 160 is small, and therefore the protective disk 115 is held at the lower position closer to the upper surface of the rotary table 107 because of its own weight.

When the protective disk 115 is at the lower position, the N-pole portion 123 on the upper end side of the first opening/closing switching permanent magnet 121 approaches the first driving permanent magnet 156A as shown in FIG. 8. In this state, only a magnetic force given from the N-pole portion 123 of the first opening/closing switching permanent magnet 121 acts on the first driving permanent magnet 156A, and a magnetic force given from the S-pole portion 124 thereof does not act on the first driving permanent magnet 156A. Therefore, the first driving permanent magnet 156A is disposed to assume a posture in which the N pole is pointed inwardly in the radial direction of the rotary table 107 and in which the S pole is pointed outwardly in the radial direction of the rotary table 107 by receiving the magnetic force from the first opening/closing switching permanent magnet 121 as shown in FIG. 8. In this state, the upper shaft portion 152 of the movable pin 110 included in the first movable pin group 111 is placed at the open position far away from the rotational axis A1 (see FIG. 2).

Additionally, in this state (in which the protective disk 115 is at the lower position), the S-pole portion 124 on the upper end side of the second opening/closing switching permanent magnet 122 approaches the second driving permanent magnet 156B as shown in FIG. 11. In this state, only a magnetic force given from the S-pole portion 124 of the second opening/closing switching permanent magnet 122 acts on the second driving permanent magnet 156B, and a magnetic force given from the N-pole portion 123 thereof does not act on the second driving permanent magnet 156B. Therefore, the second driving permanent magnet 156B is disposed to assume a posture in which the S pole is pointed inwardly in the radial direction of the rotary table 107 and in which the N pole is pointed outwardly in the radial direction of the rotary table 107 by receiving the magnetic force from the second opening/closing switching permanent magnet 122 as shown in FIG. 11. In this state, the upper shaft portion 152 of the movable pin 110 included in the second movable pin group 112 is placed at the open position far away from the rotational axis A1 (see FIG. 2).

The second disk-floating magnet 129 (see FIG. 2) is raised from the state shown in FIG. 8 and FIG. 11, and the protective disk 115 is floated. The first and second opening/closing switching permanent magnets 121 and 122 are also raised correspondingly with the floating of the protective disk 115.

In a state in which the protective disk 115 is placed at the approach position, the S-pole portion 124 on the lower end side of the first opening/closing switching permanent magnet 121 approaches the first driving permanent magnet 156A as shown in FIG. 9. In this state, only a magnetic force given from the S-pole portion 124 of the first opening/closing switching permanent magnet 121 acts on the first driving permanent magnet 156A, and a magnetic force given from the N-pole portion 123 thereof does not act on the first driving permanent magnet 156A. Therefore, the first driving permanent magnet 156A assumes a posture in which the S pole is pointed inwardly in the radial direction of the rotary table 107 and in which the N pole is pointed outwardly in the radial direction of the rotary table 107 by receiving the magnetic force from the first opening/closing switching permanent magnet 121 as shown in FIG. 9. In this state, the upper shaft portion 152 of the movable pin 110 included in the first movable pin group 111 moves to the contact position closer to the rotational axis A1 than the open position. As a result, the movable pin 110 included in the first movable pin group 111 is urged toward the contact position.

In this state, when the first magnetic-force generating magnet 125 is placed at the upper position (first position) as shown by the solid line in FIG. 10, a slight magnetic force (e.g., attractive magnetic force) acts between the first magnetic-force generating magnet 125 and the first driving permanent magnet 156A in a state in which the first magnetic-force generating magnet 125 and the first driving permanent magnet 156A coincide with each other with respect to their rotational directions. As described above, the magnetic force (e.g., attractive magnetic force) generated between the first magnetic-force generating magnet 125 and the first driving permanent magnet 156A is capable of urging the upper shaft portion 152 of the movable pin 110 included in the first movable pin group 111 toward the open position. In this magnetic force (e.g., attractive magnetic force), the magnitude (magnetic flux density) of a magnetic field between the first magnetic-force generating magnet 125 and the first driving permanent magnet 156A is, for example, about several tens of milliteslas (mT), and is remarkably smaller than the magnitude (magnetic flux density: about several hundred milliteslas (mT)) of a magnetic field between the first driving permanent magnet 156A and the S-pole portion 124 of the first opening/closing switching permanent magnet 121.

On the other hand, when the first magnetic-force generating magnet 125 is placed at the lower position as shown by the broken line in FIG. 10, a magnetic force is not generated between the first magnetic-force generating magnet 125 and the first driving permanent magnet 156A even when the first magnetic-force generating magnet 125 and the first driving permanent magnet 156A coincide with each other with respect to their rotational directions.

Additionally, in this state (in which the protective disk 115 is placed at the approach position), the N-pole portion 123 on the lower end side of the second opening/closing switching permanent magnet 122 approaches the second driving permanent magnet 156B as shown in FIG. 12. In this state, only a magnetic force given from the N-pole portion 123 of the second opening/closing switching permanent magnet 122 acts on the second driving permanent magnet 156B, and a magnetic force given from the S-pole portion 124 thereof does not act on the second driving permanent magnet 156B. Therefore, the second driving permanent magnet 156B assumes a posture in which the N pole is pointed inwardly in the radial direction of the rotary table 107 and in which the S pole is pointed outwardly in the radial direction of the rotary table 107 by receiving the magnetic force from the second opening/closing switching permanent magnet 122 as shown in FIG. 12. In this state, the upper shaft portion 152 of the movable pin 110 included in the second movable pin group 112 moves to the contact position closer to the rotational axis A1 than the open position. As a result, the movable pin 110 included in the second movable pin group 112 is urged toward the contact position.

In this state, when the second magnetic-force generating magnet 126 is placed at the upper position (first position) as shown by the solid line in FIG. 13, a slight magnetic force (e.g., attractive magnetic force) acts between the second magnetic-force generating magnet 126 and the second driving permanent magnet 156B in a state in which the second magnetic-force generating magnet 126 and the second driving permanent magnet 156B coincide with each other with respect to their rotational directions. As described above, the magnetic force (in the present preferred embodiment, attractive magnetic force) generated between the second magnetic-force generating magnet 126 and the second driving permanent magnet 156B is capable of urging the upper shaft portion 152 of the movable pin 110 included in the second movable pin group 112 toward the open position. In this magnetic force (e.g., attractive magnetic force), the magnitude (magnetic flux density) of a magnetic field between the second magnetic-force generating magnet 126 and the second driving permanent magnet 156B is, for example, about several tens of milliteslas (mT), and is remarkably smaller than the magnitude (magnetic flux density: about several hundred milliteslas (mT)) of a magnetic field between the second driving permanent magnet 156B and the N-pole portion 123 of the second opening/closing switching permanent magnet 122.

On the other hand, when the second magnetic-force generating magnet 126 is placed at the lower position as shown by the broken line in FIG. 13, a magnetic force is not generated between the second magnetic-force generating magnet 126 and the second driving permanent magnet 156B even when the second magnetic-force generating magnet 126 and the second driving permanent magnet 156E coincide with each other with respect to their rotational directions.

As shown in FIG. 2, the chemical liquid supplying unit 7 includes a chemical liquid nozzle 6 that discharges the FOM (chemical liquid) toward the upper surface of the substrate W, a nozzle arm 21, at a tip portion of which is mounted the chemical nozzle 6, and a nozzle moving unit 22 that moves the nozzle arm 21 to move the chemical liquid nozzle 6.

The chemical liquid nozzle 6 is, for example, a straight nozzle that discharges the chemical liquid in a continuous flow state and is mounted to the nozzle arm 21, for example, in a perpendicular orientation of discharging the chemical liquid in a direction perpendicular to the upper surface of the substrate W. The nozzle arm 21 extends in a horizontal direction and is arranged to be pivotable around a prescribed swinging axis (not shown) extending in the vertical direction at a periphery of the spin chuck 5.

The chemical liquid supplying unit 7 includes a chemical liquid piping 14 that guides the chemical liquid to the chemical liquid nozzle 6 and a chemical liquid valve 15 that opens and closes the chemical liquid piping 14. When the chemical liquid valve 15 is opened, the chemical liquid from an chemical liquid supply source is supplied to the chemical liquid nozzle 6 from the chemical liquid piping 14. The chemical liquid is thereby discharged from the chemical liquid nozzle 6.

The chemical liquid to be supplied to the chemical liquid piping 14 is a liquid including at least one among, for example, sulfuric acid, acetic acid, nitric acid, hydrochloric acid, hydrofluoric acid, aqueous ammonia, hydrogen peroxide water, organic acid (e.g., citric acid, oxalic acid), organic alkali (e.g., TMAH: tetramethylammonium hydroxide), organic solvent (e.g., IPA: isopropyl alcohol), surfactant, and corrosion inhibitor.

The nozzle moving unit 22 turns the nozzle arm 21 around the swinging axis to move the chemical liquid nozzle 6 horizontally along a locus passing through an upper surface central portion of the substrate W in plan view. The nozzle moving unit 22 moves the chemical liquid nozzle 6 horizontally between a processing position, at which the chemical liquid discharged from the chemical liquid nozzle 6 lands on the upper surface of the substrate W, and a home position, at which the chemical liquid nozzle 6 is set at a periphery of the spin chuck 5 in plan view. Further, the nozzle moving unit 22 moves the chemical liquid nozzle 6 horizontally between a central position, at which the chemical liquid discharged from the chemical liquid nozzle 6 lands on the upper surface central portion of the substrate W, and a peripheral edge portion, at which the chemical liquid discharged from the chemical liquid nozzle 6 lands on an upper surface peripheral edge portion of the substrate W. The central position and the peripheral edge position are both processing positions.

The chemical liquid nozzle 6 may be a fixed nozzle that is disposed fixedly with its discharge port directed toward a prescribed position (for example, the central portion) of the upper surface of the substrate W.

As shown in FIG. 2, the water supplying unit 8 includes a water nozzle 41. The water nozzle 41 is, for example, a straight nozzle that discharges liquid in a continuous flow state and is disposed fixedly above the spin chuck 5 with its discharge port directed toward the central portion of the upper surface of the substrate W. A water piping 42, to which water from a water supply source is supplied, is connected to the water nozzle 41. A water valve 43, arranged to switch between supplying and stopping the supplying of water from the water nozzle 41, is interposed at an intermediate portion of the water piping 42. When the water valve 43 is opened, the continuous flow of water supplied from the water piping 42 to the water nozzle 41 is discharged from the discharge port set at a lower end of the water nozzle 41. Also, when the water valve 43 is closed, the supplying of water from the water piping 42 to the water nozzle 41 is stopped. The water is, for example, deionized water (DIW). The water is not restricted to DIW and may be any of carbonated water, electrolyzed ion water, hydrogen water, ozone water, and aqueous hydrochloric acid solution of dilute concentration (for example of approximately 10 ppm to 100 ppm).

The water nozzle 41 does not need to be disposed fixedly with respect to the spin chuck 5 and, for example, a form of a so-called scan nozzle, which is mounted on an arm swingable within a horizontal plane above the spin chuck 5 and with which a landing position of water on the upper surface of the substrate W is scanned by the swinging of the arm, may be adopted instead.

With reference to FIG. 7, the movable pin 110 has the upper shaft portion 152 at a position that is eccentric with respect to the rotational axis A2 as described above. In other words, the central axis B of the upper shaft portion 152 deviates from the rotational axis A2. Therefore, the upper shaft portion 152 is displaced by the rotation of the lower shaft portion 151 between an open position (at which the central axis B is placed) distant from the rotational axis A1 (see FIG. 8 and FIG. 11 described later) and a contact position (at which the central axis B is placed) close to the rotational axis A1 (see FIG. 9 and FIG. 12 described later). The upper shaft portion 152 of the movable pin 110 is urged toward the open position by means of an elastic pressing force of an elastic pressing member such as a spring (not shown). A predetermined gap with the peripheral end surface of the substrate W is formed in a state in which the movable pin 110 is placed at the open position.

FIGS. 14A, 15A, 16A, 17A, and 18A are views showing a positional relationship between the first and second driving permanent magnets 156A, 156B and the first and second magnetic-force generating magnets 125,126 when the first and second magnetic-force generating magnets 125 and 126 are each disposed at the upper position and when the rotary table 107 is rotated. FIGS. 14B, 15B, 16B, 17B, and 18B are views showing the movement of the substrate W with respect to the rotary table 107 when the first and second magnetic-force generating magnets 125 and 126 are each disposed at the upper position and when the rotary table 107 is rotated.

Figure 14A:
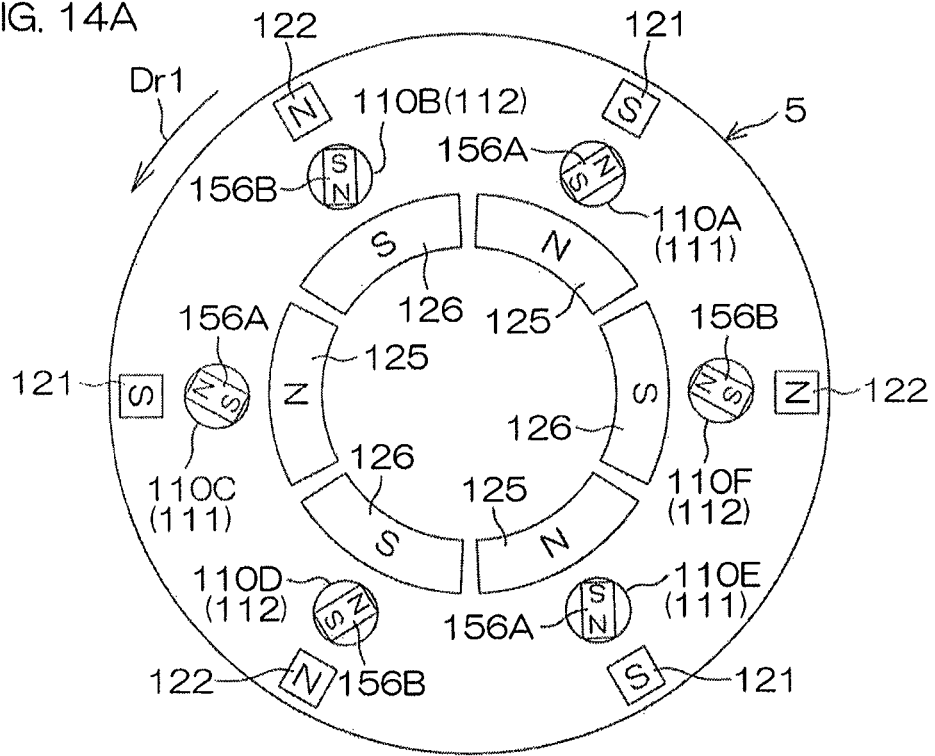
FIGS. 14A and 14B are schematic views showing a state of a substrate when the first and second magnetic-force generating magnets are each disposed at the upper position and when the rotary table is rotated.
Figure 14B:
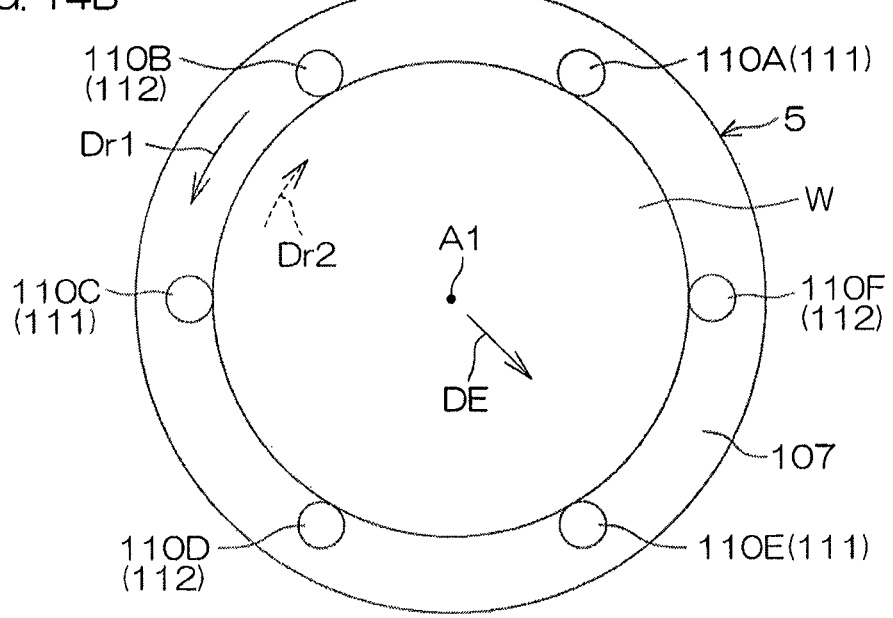
Figure 15A:
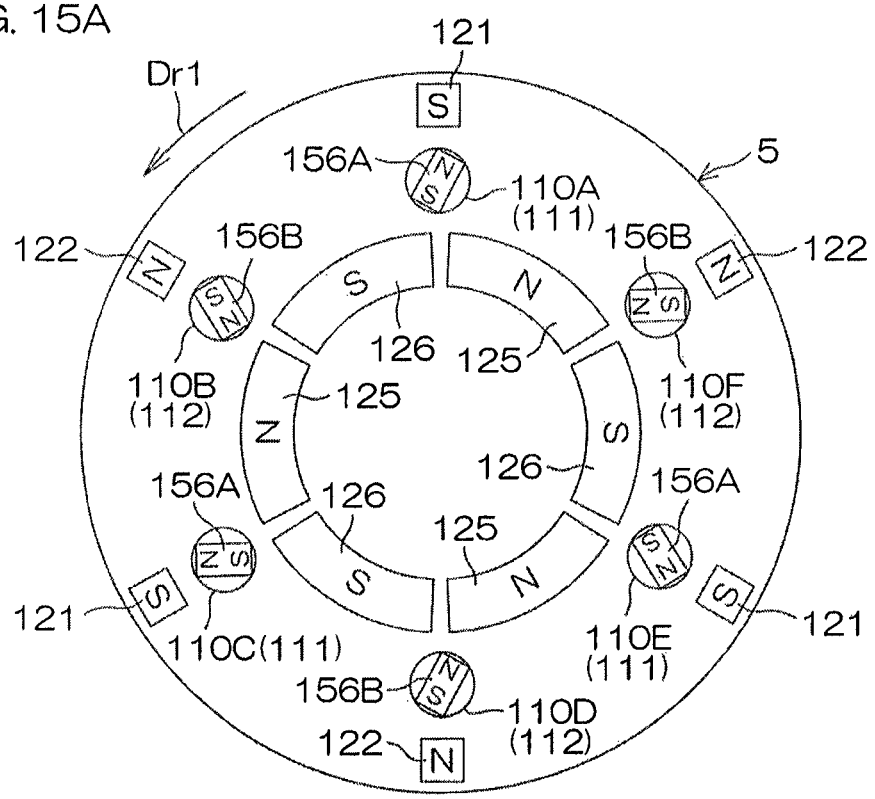
FIGS. 15A and 15B are schematic views showing a state of the substrate subsequent to FIGS. 14A and 14B.
Figure 15B:
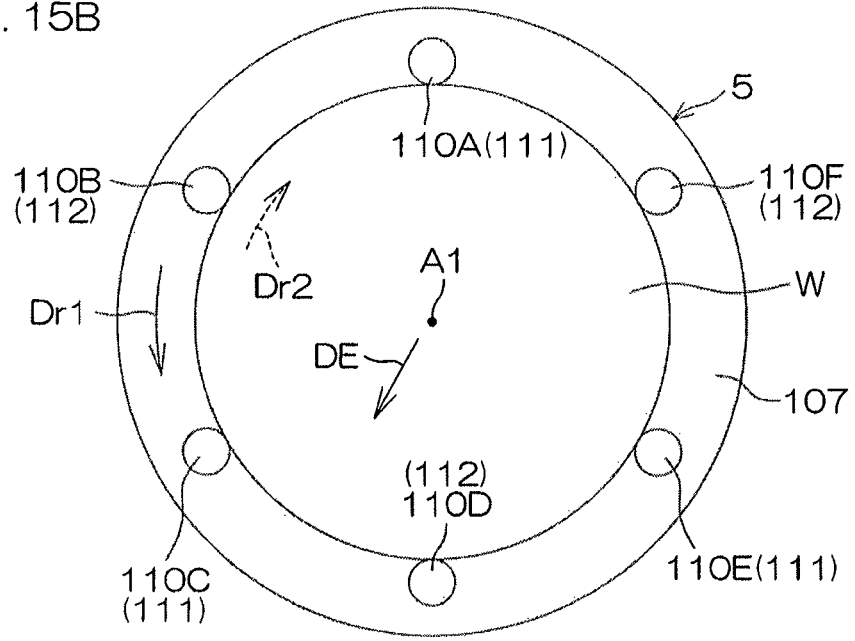
Figure 16A:
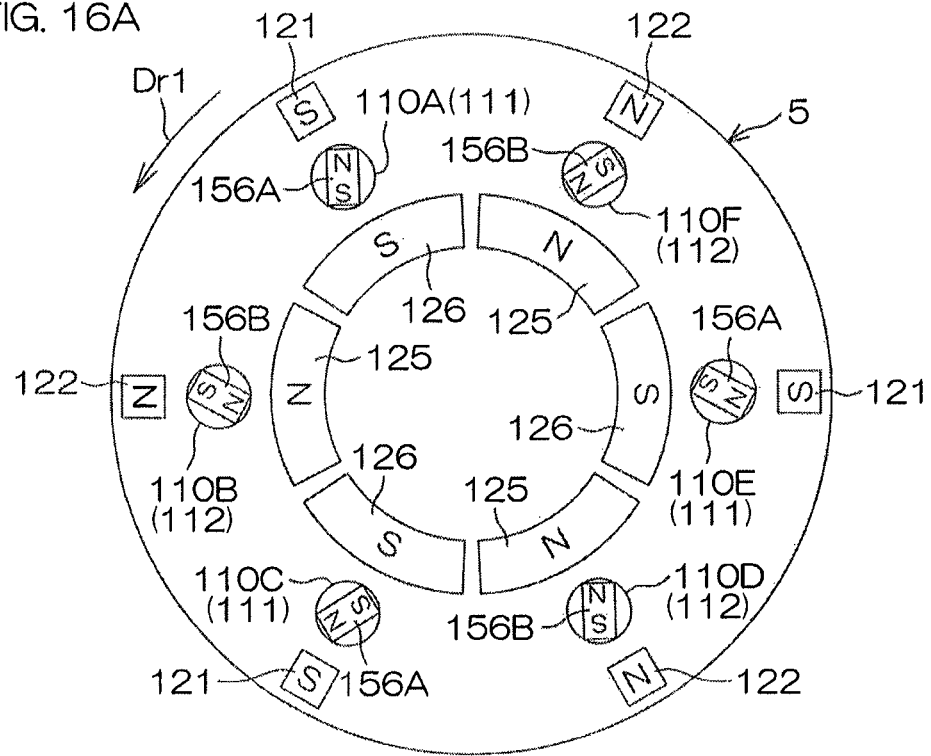
FIGS. 16A and 16B are schematic views showing a state of the substrate subsequent to FIGS. 15A and 15B.
Figure 16B:
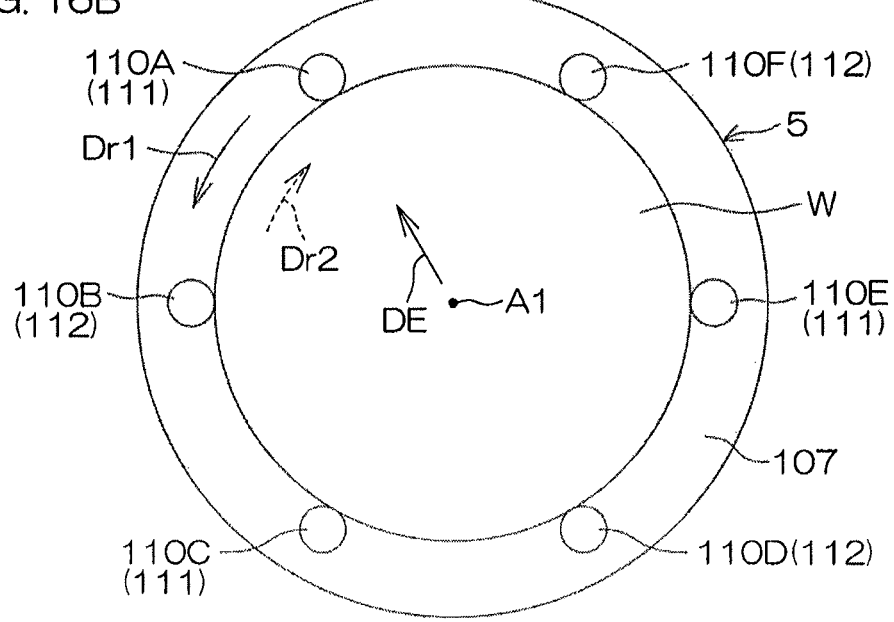
Figure 17A:
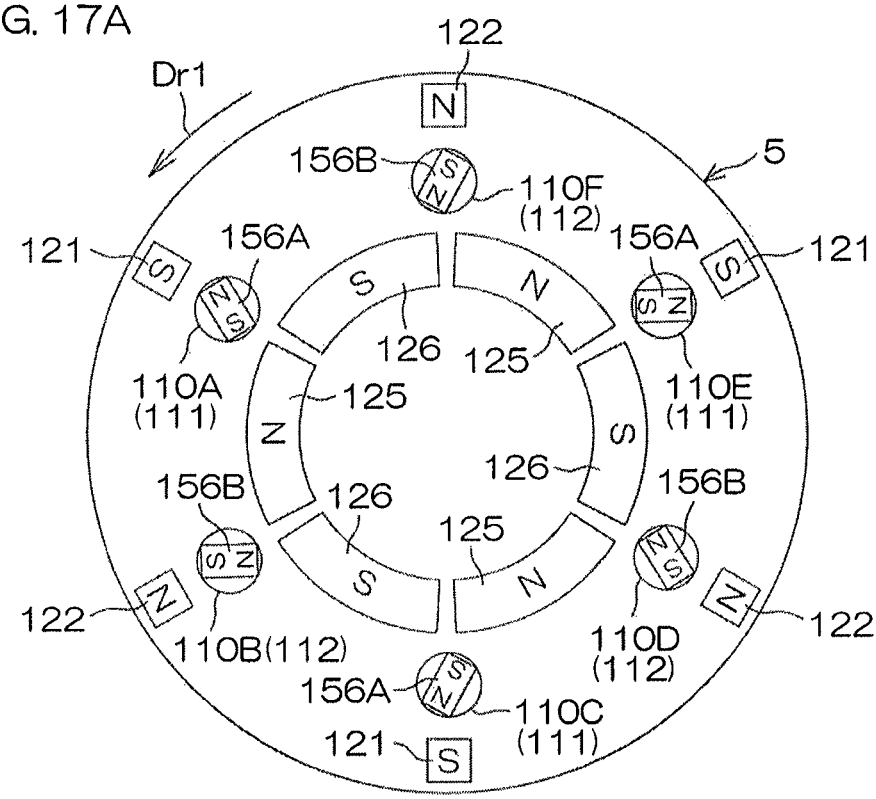
FIGS. 17A and 17B are schematic views showing a state of the substrate subsequent to FIGS. 16A and 16B.
Figure 17B:
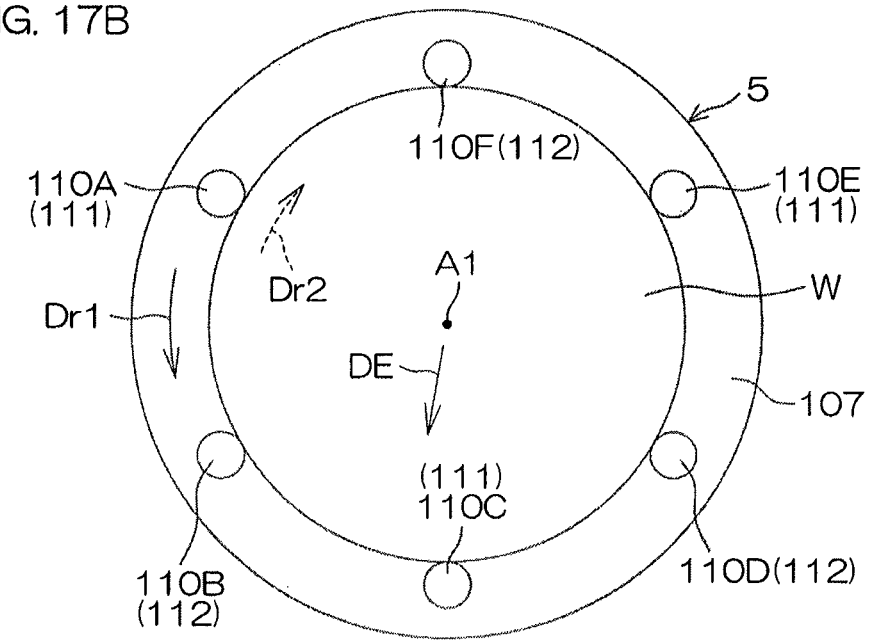
Figure 18A:
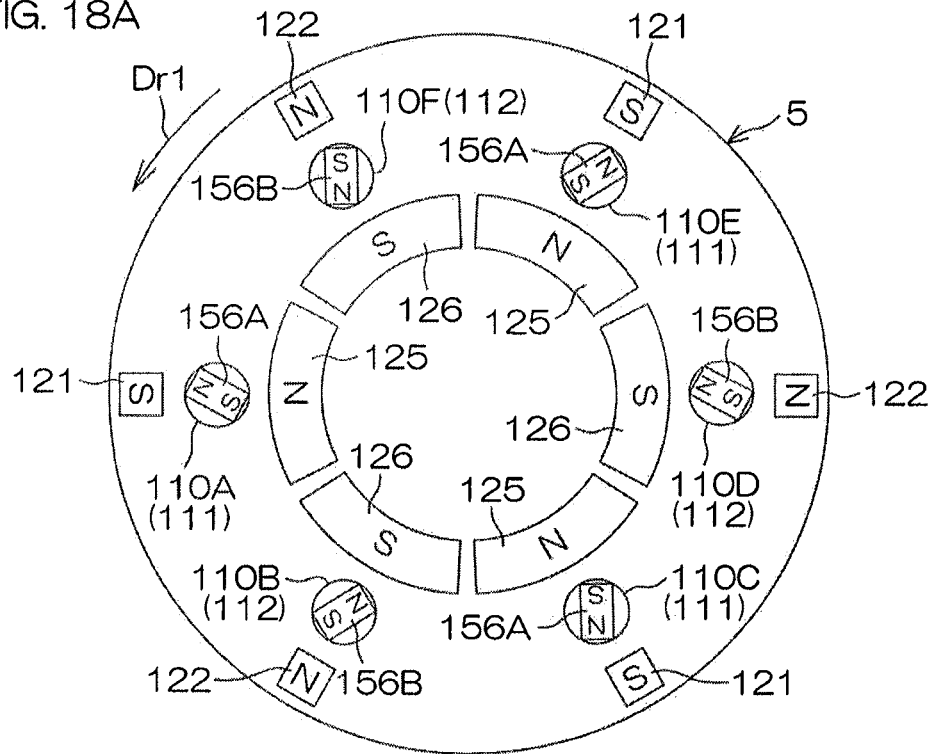
FIGS. 18A and 18B are schematic views showing a state of the substrate subsequent to FIGS. 17A and 17B.
Figure 18B:
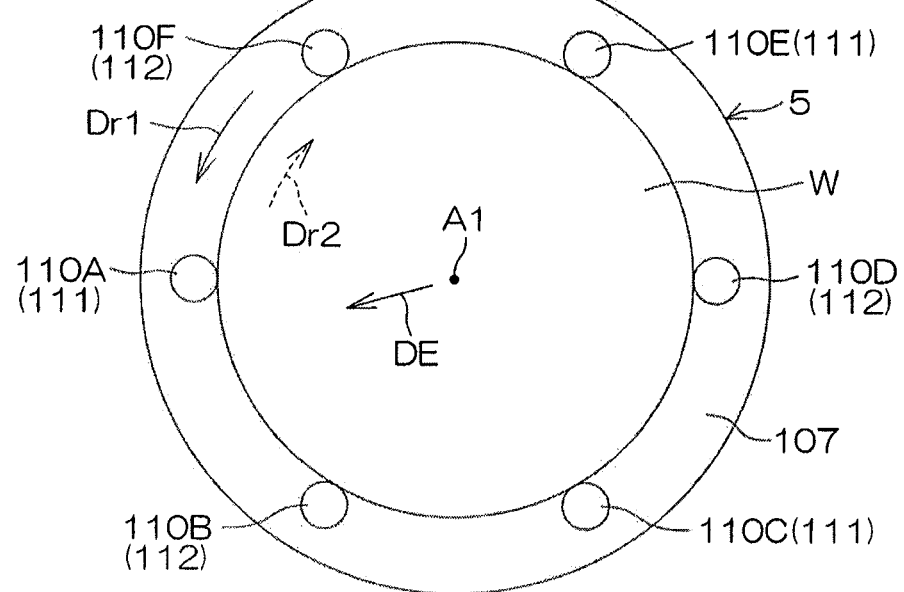

A group of FIGS. 14A and 14B, a group of FIGS. 15A and 15B, a group of FIGS. 16A and 16B, a group of FIGS. 17A and 17B, and a group of FIGS. 18A and 18B have mutually common rotational direction positions, respectively. Additionally, in FIGS. 14A to 18B, alphabetical letters are respectively assigned to the rears of reference signs "110" correspondingly to each movable pin in order to discriminate the six movable pins 110 from each other. In this respect, the same applies to FIG. 25. A state in which the rotational phase of the rotary table 107 has proceeded from the state of FIGS. 14A and 14B by about 30° in the rotational direction Dr1 is shown in FIGS. 15A and 15B. A state in which the rotational phase of the rotary table 107 has further proceeded from the state of FIGS. 15A and 15B by about 30° in the rotational direction Dr1 is shown in FIGS. 16A and 16B. A state in which the rotational phase of the rotary table 107 has further proceeded from the state of FIGS. 16A and 16B by about 30° in the rotational direction Dr1 is shown in FIGS. 17A and 17B. A state in which the rotational phase of the rotary table 107 has further proceeded from the state of FIGS. 17A and 17B by about 30° in the rotational direction Dr1 is shown in FIGS. 18A and 18B.

In a state in which the first magnetic-force generating magnet 125 is placed at the upper position, a magnetic force (e.g., attractive magnetic force) directed to urge the upper shaft portion 152 of the movable pin 110 included in the first movable pin group 111 toward the open position is generated between the first driving permanent magnet 156A and the first magnetic-force generating magnet 125 so as to have a smaller magnitude than a magnetic force (e.g., attractive magnetic force) generated between the first driving permanent magnet 156A and the first opening/closing switching permanent magnet 121.

In a state in which the second magnetic-force generating magnet 126 is placed at the upper position, a magnetic force (e.g., attractive magnetic force) directed to urge the upper shaft portion 152 of the movable pin 110 included in the second movable pin group 112 toward the open position is generated between the second driving permanent magnet 156B and the second magnetic-force generating magnet 126 so as to have a smaller magnitude than a magnetic force (e.g., attractive magnetic force) generated between the second driving permanent magnet 156B and the second opening/closing switching permanent magnet 122.

During rotation processing (a chemical liquid supply step (S6) and a rinse step (S7)) described later, in a state in which the substrate W is gripped by the plurality of support pins (movable pins 110) (i.e., in a state in which the upper shaft portion 152 of the movable pin 110 is at the contact position and is pressing the peripheral edge of the substrate W), the rotating/driving unit 103 rotates the rotary table 107 at a speed of the liquid processing speed (e.g., about 500 rpm) in the rotational direction Dr1. As a result, the substrate W is rotated around the rotational axis A1, and a centrifugal force generated by the rotation acts on the peripheral edge of the substrate W.

In rotation processing (the chemical liquid supply step (S6) and the rinse step (S7)), the distance between the first driving permanent magnet 156A and the first magnetic-force generating magnet 125 changes in accordance with the rotational angle position of the substrate W. In other words, the magnitude of a magnetic force in an opposite direction that acts on each of the first driving permanent magnets 156A changes in accordance with the rotational angle position of the substrate W. This makes it possible to change a magnetic force (e.g., attractive magnetic force) generated between each of the first the driving permanent magnets 156A and the first magnetic-force generating magnet 125 in response to rotation of the substrate W. The magnitude of a magnetic force (e.g., attractive magnetic force) generated between the first driving permanent magnet 156A and the first magnetic-force generating magnet 125 is smaller than that of a magnetic force (e.g., attractive magnetic force) generated between the first driving permanent magnet 156A and the first opening/closing switching permanent magnet 121. Therefore, it is possible to change the magnitude of a pressing force against the peripheral edge of the substrate W applied by the upper shaft portion 152 of the movable pin 110 while keeping its magnitude higher than zero in response to rotation of the rotary table 107.

Additionally, in rotation processing (the chemical liquid supply step (S6) and the rinse step (S7)), the distance between the second driving permanent magnet 156B and the second magnetic-force generating magnet 126 changes in accordance with the rotational angle position of the substrate W. In other words, the magnitude of a magnetic force in an opposite direction that acts on each of the second driving permanent magnets 156B changes in accordance with the rotational angle position of the substrate W. This makes it possible to change a magnetic force (e.g., attractive magnetic force) generated between each of the second driving permanent magnets 156B and the second magnetic-force generating magnet 126 in response to rotation of the substrate W. The magnitude of a magnetic force (e.g., attractive magnetic force) generated between the second driving permanent magnet 156B and the second magnetic-force generating magnet 126 is smaller than that of a magnetic force (e.g., attractive magnetic force) generated between the second driving permanent magnet 156B and the second opening/closing switching permanent magnet 122. Therefore, it is possible to change the magnitude of a pressing force against the peripheral edge of the substrate W applied by the upper shaft portion 152 of the movable pin 110 while keeping its magnitude higher than zero in response to rotation of the rotary table 107.

In other words, in rotation processing (the chemical liquid supply step (S6) and the rinse step (S7)), it is possible to change a pressing force applied from the upper shaft portion 152 of each movable pin 110 while allowing a centrifugal force to act on the peripheral edge of the substrate W. As a result, the substrate W being in a rotational state becomes eccentric. Accordingly, as shown in FIGS. 14B, 15B, 16B, 17B, and 18B, the eccentric direction DE of the substrate W changes in accordance with the rotational angle position of the substrate W being in a rotational state.

Additionally, in rotation processing (the chemical liquid supply step (S6) and the rinse step (S7)), a processing liquid (chemical liquid or water) is supplied to the upper surface of the substrate W in parallel to rotation of the rotary table 107 with respect to the magnetic-force generating magnet as described later. A load that acts on the substrate W is increased by the supply of the processing liquid (chemical liquid or water) to the upper surface of the substrate W. When the substrate W is in a rotational state, the increase of the load acts on the substrate W that is in contact with and that is supported by the plurality of support pins (movable pins 110) as rotational resistance that obstructs the turning of the substrate W. A centrifugal force generated by the rotation of the substrate W also acts on the peripheral edge of the substrate W. These make it possible to increase the rotational amount of the substrate W with respect to the rotary table 107. Therefore, it is possible to more effectively displace the contact-support position in the peripheral edge of the substrate W in the circumferential direction.

Therefore, in rotation processing (the chemical liquid supply step (S6) and the rinse step (S7)), the substrate W being in a rotational state becomes eccentric, and the eccentric direction DE of the substrate W changes in accordance with the rotational angle position of the substrate W being in a rotational state, and a force that obstructs the turning of the substrate W acts on the substrate W. Therefore, the substrate W being in a rotational state relatively turns in a turning direction Dr2 having a circumferential direction opposite to the rotational direction Dr1 with respect to the rotary table 107 and the support pin (movable pin 110). As a result, in the chemical liquid supply step (S6), it is possible to displace the contact-support position in the peripheral edge of the substrate W supported by the support pin (movable pin 110) in the circumferential direction (rotational direction Dr2) while allowing the plurality of support pins (movable pins 110) to come into contact with and support the peripheral edge of the substrate W.

Additionally, the first magnetic-force generating magnet 125 and the second magnetic-force generating magnet 126 are alternately disposed in the circumferential direction, and therefore the magnetic pole of a magnetic field given to the first and second driving permanent magnets 156A and 156B changes in response to rotation of the rotary table 107 (the magnetic field is nonuniform). In this case, it is possible to abruptly change a magnetic force generated between the first and second driving permanent magnets 156A, 156B and the first and second magnetic-force generating magnets 125,126 in accordance with the rotational angle position of the substrate W. Therefore, it is possible to largely change a magnetic force generated between each driving permanent magnet 156A or 156B and the magnetic-force generating magnets 125, 126 in response to rotation of the substrate W, and it is possible to accelerate the turning of the substrate W in the turning direction Dr2.

Figure 19:
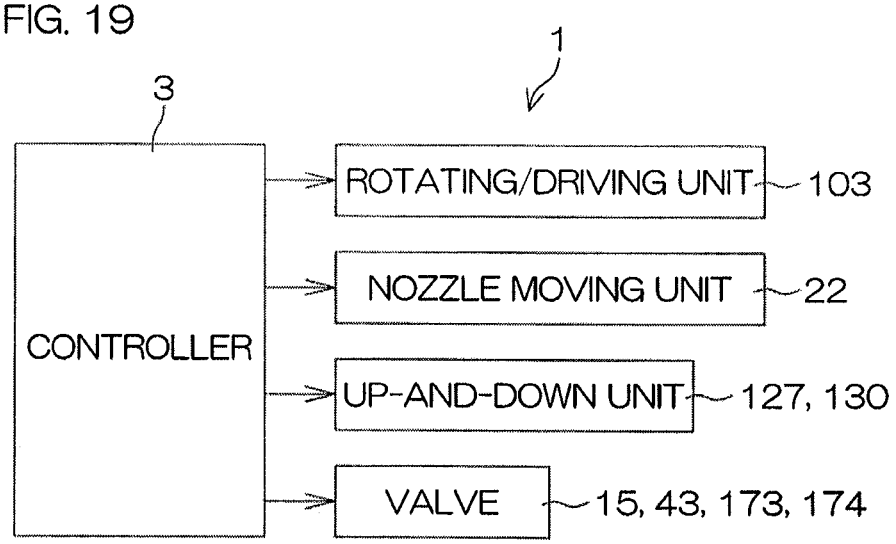
FIG. 19 is a block diagram to describe an electrical configuration of a main part of the substrate processing apparatus.

FIG. 19 is a block diagram to describe an electric configuration of a main part of the substrate processing apparatus 1.

The controller 3 is formed of, for example, a microcomputer. The controller 3 has an arithmetic unit, such as a CPU, a read-only memory device, a storage portion, such as a hard disk drive, and an input-output unit. A program that is executed by the arithmetic unit is stored in a storage unit.

The controller 3 controls operations of the rotating/driving unit 103, the nozzle moving unit 22, the first and second up-and-down units 127, 130, etc. The controller further controls an open-close operation and similar operations of the chemical liquid valve 15, the water valve 43, the inert gas valve 173, the inert gas flow control valve 174, etc.

Figure 20:
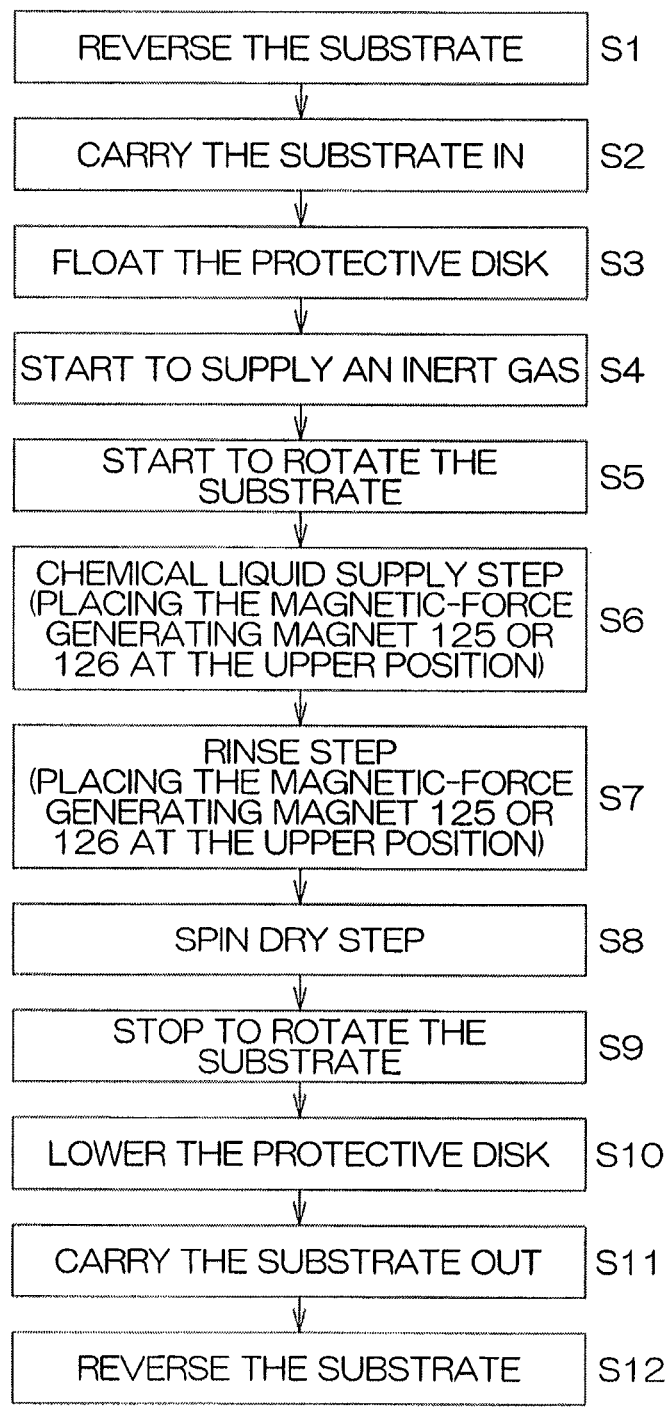
FIG. 20 is a flowchart to describe one example of processing-liquid processing performed by the processing unit.
Figure 21:
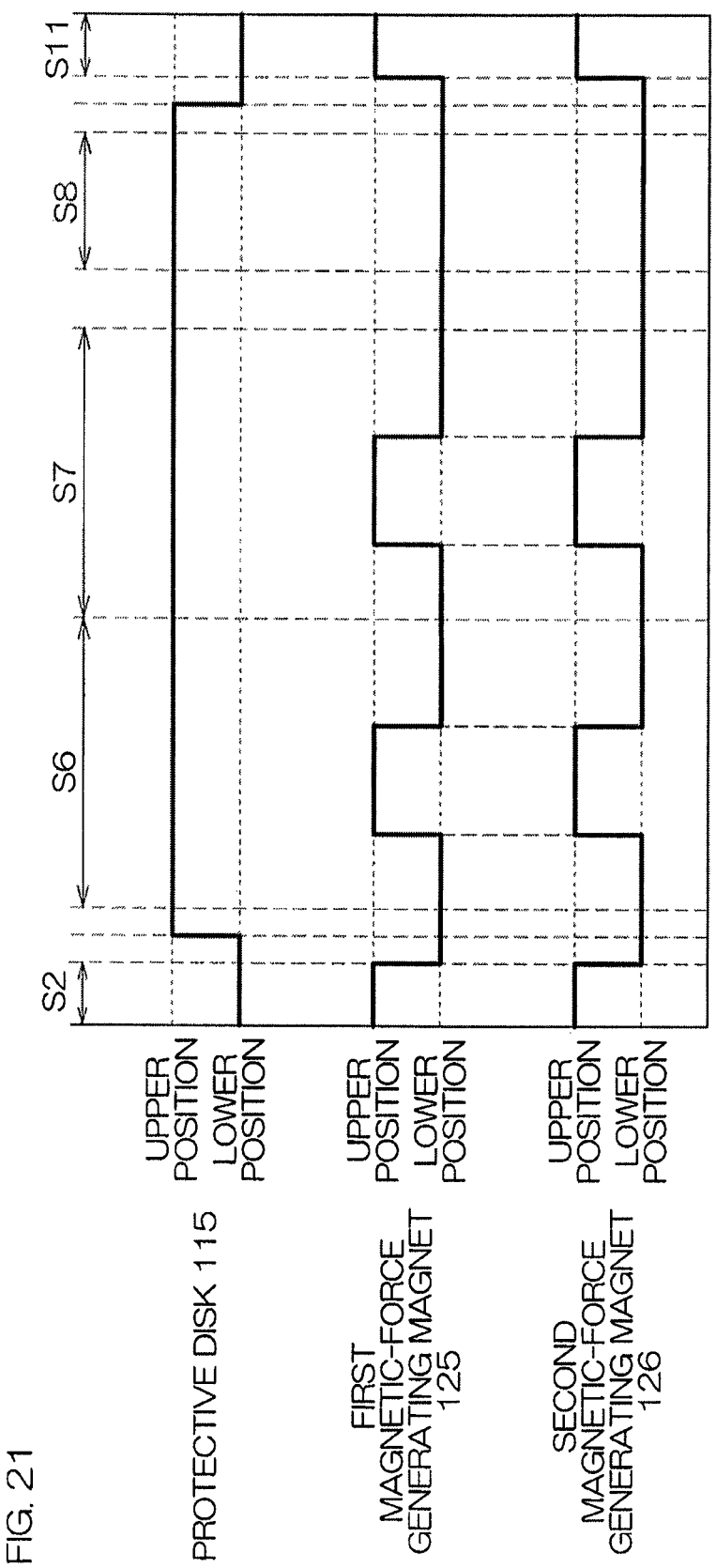
FIG. 21 is a time chart to describe the processing-liquid processing.

FIG. 20 is a flowchart to describe one example of processing-liquid processing performed by the processing unit 2. FIG. 21 is a time chart to describe the processing-liquid processing. FIGS. 22A to 22H are pictorial views to describe a processing example of the processing-liquid processing.

The processing-liquid processing will be described with reference to FIG. 1, FIG. 2 to FIG. 13, and FIG. 19 to FIG. 21. Reference is appropriately made to FIG. 22A to FIG. 22H.

A substrate to be processed by the processing unit 2 is a substrate W (which might be hereinafter referred to as a "not-yet-washed substrate" in some cases) that has been processed, for example, by a preprocessing device, such as an annealer or a film formation device. A circular silicon substrate can be mentioned as one example of the substrate W. The processing unit 2 washes, for example, a rear surface Wb (one principal plane; a device non-forming surface) that is on the opposite side to a front surface Wa (one other principal plane; a device forming surface) in the substrate W.

A carrier C in which a not-yet-washed substrate W is contained is conveyed from a preprocessing device to the substrate processing apparatus 1, and is placed at a load port LP. The substrate W is contained in the carrier C in a state in which the front surface Wa of the substrate W is directed upwardly. The controller 3 allows the indexer robot IR to convey the substrate W from the carrier C to the reversing unit TU in a state in which the front surface Wa is directed upwardly. Thereafter, the controller 3 allows the reversing unit TU to reverse the substrate W that has been conveyed thereto (S1: substrate reversal). As a result, the rear surface Wb of the substrate W is directed upwardly. Thereafter, the controller 3 allows the hand H2 of the center robot CR to take the substrate W out of the reversing unit TU and to carry the substrate W into the processing unit 2 in a state in which the rear surface Wb is directed upwardly (step S2).

In a state in which the substrate W has not yet been carried thereinto, the chemical liquid nozzle 6 is withdrawn to the home position that is set beside the spin chuck 5. Additionally, the first and second magnetic-force generating magnets 125 and 126 are each disposed at the lower position.

In a state in which the substrate W has not yet been carried thereinto, the second disk-floating magnet 129 is placed at the lower position, and therefore the second disk-floating magnet 129 is largely away from the rotary table 107 downwardly, and therefore a repulsive magnetic force that acts between the second disk-floating magnet 129 and the first disk-floating magnet 160 is small. Therefore, the protective disk 115 is placed at the lower position closer to the upper surface of the rotary table 107. Therefore, a sufficient space that can be entered by the hand H2 of the center robot CR is secured between a substrate holding height determined by the movable pin 110 and the upper surface of the protective disk 115.

Additionally, the protective disk 115 is placed at the lower position, and therefore the N-pole portion 123 on the upper end side of the first opening/closing switching permanent magnet 121 approaches the first driving permanent magnet 156A, and the S-pole portion 124 on the upper end side of the second opening/closing switching permanent magnet 122 approaches the second driving permanent magnet 156B. In this state, any of three movable pins 110 included in the first movable pin group ill and any of three movable pins 110 included in the second movable pin group 112 are placed at the open position, i.e., all of six movable pins 110 are placed at the open position.

Figure 22A:
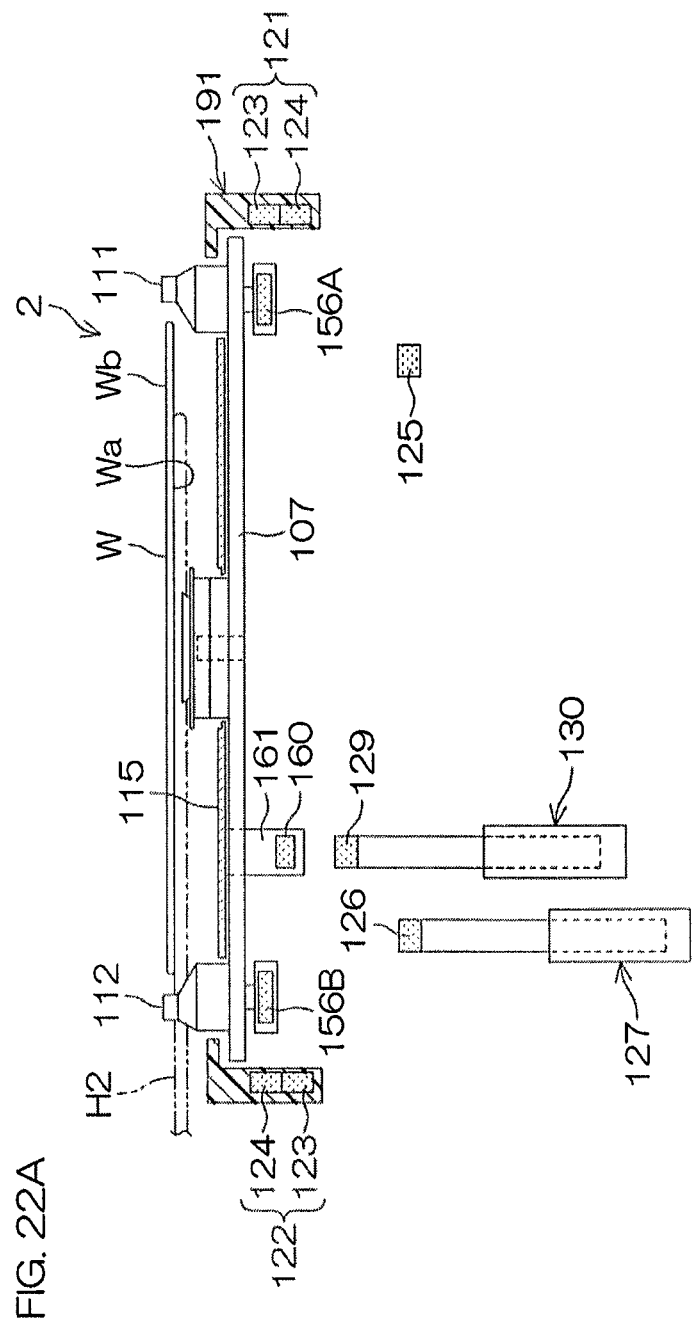

The hand H2 of the center robot CR conveys the substrate W to a space above the spin chuck 5 in a state of holding the substrate W at a position higher than the upper end of the movable pin 110. Thereafter, as shown in FIG. 22A, the hand H2 of the center robot CR descends toward the upper surface of the rotary table 107. As a result, the substrate W is delivered to the six movable pins 110 present at the open position. Thereafter, the hand H2 of the center robot CR recedes toward the side of the spin chuck 5 through a space between the movable pins 110.

As shown in FIG. 22B, the controller 3 allows the second up-and-down unit 130 to raise the second disk-floating magnet 129 toward the upper position while controlling the second up-and-down unit 130. The distance between these disk-floating magnets 129 and 160 becomes smaller, and, accordingly, a repulsive magnetic force that acts between these magnets becomes larger. The protective disk 115 floats from the upper surface of the rotary table 107 toward the substrate W by means of the repulsive magnetic force (step S3). Thereafter, when the first magnetic-force generating magnet 125 reaches the upper position, the protective disk 115 reaches the approach position that is close to the substrate W with a slight interval between the protective disk 115 and the front surface Wa (lower surface) of the substrate W, and the flange 120 formed at the lower end of the guide shaft 117 comes into contact with the linear bearing 118. As a result, the protective disk 115 is held at the approach position.

In response to the rise of the protective disk 115 from the lower position to the approach position, the N-pole portion 123 on the upper end side of the first opening/closing switching permanent magnet 121 recedes from the first driving permanent magnet 156A, and, instead, the S-pole portion 124 on the lower end side of the first opening/closing switching permanent magnet 121 approaches the first driving permanent magnet 156A. Additionally, in response to the rise of the protective disk 115 from the lower position to the approach position, the S-pole portion 124 on the upper end side of the second opening/closing switching permanent magnet 122 recedes from the second driving permanent magnet 156B, and, instead, the N-pole portion 123 on the lower end side of the second opening/closing switching permanent magnet 122 approaches the second driving permanent magnet 156B. As a result, all of the movable pins 110 are driven from the open position to the contact position, and are held at the contact position. As a result, the substrate W is gripped by the six movable pins 110, and the substrate W is held by the spin chuck 5 in a state in which its front surface Wa is directed downwardly and in which its rear surface Wb is directed upwardly.

Thereafter, as shown in FIG. 22B, the controller 3 opens the inert gas valve 173, and starts to supply an inert gas (step S4). The inert gas supplied as above is discharged from the upper end of the inert gas supply pipe 170, and is spouted in a radial manner centering on the rotational axis A1 toward a narrow space between the protective disk 115 placed at the approach position and the front surface Wa (lower surface) of the substrate W by means of operations of the rectifying member 186 etc.

Figure 22C:
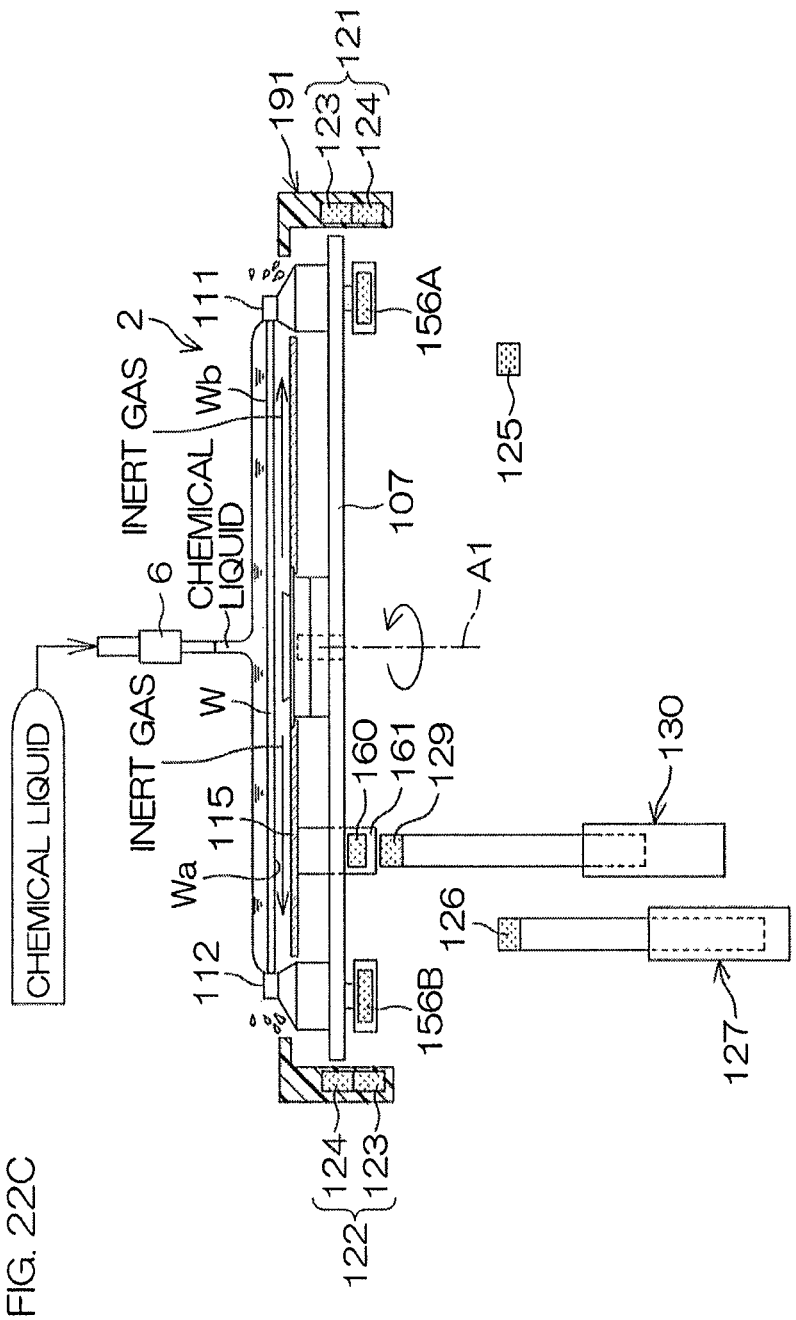

Thereafter, the controller 3 controls the rotating/driving unit 103 to start to rotate the rotary table 107 (rotation step), and hence allows the rotating/driving unit 103 to rotate the substrate W around the rotational axis A1 as shown in FIG. 22C (step S5). The rotation speed of the substrate W is raised to a predetermined liquid processing speed (e.g., 500 rpm within the range of 300 to 1500 rpm), and is kept at that liquid processing speed.

After the rotation speed of the substrate W reaches the liquid processing speed, the controller 3 performs a chemical liquid supply step (processing-liquid supply step; rotation processing; Step S6) of supplying a chemical liquid to the upper surface of the substrate W (rear surface Wb of the substrate W) as shown in FIG. 22C. In the chemical liquid supply step (S6), the controller 3 controls and allows the nozzle moving unit 22 to move the chemical liquid nozzle 6 from the home position to the central position. As a result, the chemical liquid nozzle 6 is placed above a central part of the substrate W. After the chemical liquid nozzle 6 is placed above the substrate W, the controller 3 allows the chemical liquid valve 15 to be opened, and, as a result, a chemical liquid is discharged from the discharge port of the chemical liquid nozzle 6, and lands on a central part of the rear surface Wb of the substrate W. The chemical liquid supplied to the central part of the rear surface Wb of the substrate W receives a centrifugal force generated by the rotation of the substrate W, and spreads radially toward the peripheral edge on the rear surface Wb of the substrate W. Therefore, it is possible to spread the chemical liquid on the whole area of the rear surface Wb of the substrate W. Thus, the rear surface Wb of the substrate W is processed by use of the chemical liquid.

In the chemical liquid supply step (T6) and the rinse step (T7) described later, an inert gas discharged from the upper end of the inert gas supply pipe 170 is spouted in a radial manner centering on the rotational axis A1 toward a narrow space between the protective disk 115 placed at the approach position and the front surface Wa of the substrate W (lower surface) by means of operations of the rectifying member 186 etc. This inert gas is further accelerated by a narrowing portion (orifice) provided at the peripheral edge of the annular plate portion 192 of the annular cover 191 disposed at the peripheral edge of the protective disk 115, and forms a high-speed spouting airflow beside the substrate W. In the present preferred embodiment, an inert gas is supplied to the front surface Wa (lower surface) of the substrate W while using the protective disk 115, and, as a result, without completely preventing a processing liquid (chemical liquid or rinse liquid) from flowing around the front surface Wa (lower surface) of the substrate W, the chemical liquid is allowed to daringly flow only around a peripheral edge area of the front surface Wa (lower surface) of the substrate W (a fairly small range of, for example, about 1.0 mm from the peripheral end of the substrate W) so that the peripheral edge area of the front surface Wa undergoes chemical-liquid processing. Additionally, the amount of its flow-around is controlled with excellent accuracy by controlling the supply flow rate of the processing liquid to the upper surface of the substrate W, the supply flow rate of the inert gas to the lower surface of the substrate W, the rotation speed of the substrate W, etc.

Additionally, in the chemical liquid supply step (S6), the first and second magnetic-force generating magnets 125 and 126 are each placed at the upper position during a predetermined period of time in order to slide the substrate W in the circumferential direction.

In detail, when a predetermined period of time elapses from the start of the discharge of a chemical liquid, the controller 3 controls and allows the first up-and-down unit 127 to raise the first magnetic-force generating magnet 125 and the second magnetic-force generating magnet 126 each of which has been placed at the lower position till then toward the upper position as shown in FIG. 22D, and, after these magnets rise and reach the upper positions, respectively, these magnets remain to be each placed at the upper position (magnetic-force generation-position placing step). As a result, a state is reached in which the first and second magnetic-force generating magnets 125 and 126 are placed at the upper positions, respectively (shown by the solid line in FIG. 10 and FIG. 13).

In the chemical liquid supply step (S6), the substrate W is rotated in a state in which the first and second magnetic-force generating magnets 125 and 126 are placed at the upper positions, respectively (rotation step). As a result, the magnitude of a magnetic force (e.g., attractive magnetic force) given from the magnetic-force generating magnets 125 and 126 each of which is placed at the upper position changes in accordance with the rotational angle position of the substrate W. This makes it possible to change a magnetic force (e.g., attractive magnetic force) generated between each driving permanent magnet 156A or 156B and the magnetic-force generating magnets 125, 126 in response to rotation of the substrate W. As a result of a change in the pressing force in each movable pin 110, the substrate W being in a rotational state becomes eccentric. This eccentric direction DE of the substrate W (see FIG. 143 etc.) changes in accordance with the rotational angle position of the substrate W being in a rotational state.

Additionally, in the chemical liquid supply step (S6), a chemical liquid is supplied to the upper surface of the substrate W in parallel to rotation of the rotary table 107 with respect to the magnetic-force generating magnet, i.e., in parallel to rotation of the substrate W with respect to the first and second magnetic-force generating magnets 125 and 126. A load imposed onto the substrate W is increased by allowing the chemical liquid to be supplied to the upper surface of the substrate W under predetermined pressure. The increase of the load acts on the substrate W that is in contact with and that is supported by the plurality of support pins (movable pins 110) as rotational resistance that obstructs the turning of the substrate W. A centrifugal force generated by the rotation of the substrate W also acts on the peripheral edge of the substrate W.

As a result, in the chemical liquid supply step (S6), the substrate W being in a rotational state relatively turns in the turning direction Dr2 having a circumferential direction opposite to the rotational direction Dr1 with respect to the rotary table 107 and the support pin (movable pin 110). As a result, in the chemical liquid supply step (S6), it is possible to displace the contact-support position in the peripheral edge of the substrate W supported by the support pin (movable pin 110) in the circumferential direction (rotational direction Dr2) while allowing the plurality of support pins (movable pins 110) to come into contact with and support the peripheral edge of the substrate W.

When a predetermined period of time (e.g., about 40 seconds) elapses after placing each of the first and second magnetic-force generating magnets 125 and 126 at the upper position, the controller 3 controls and allows the first up-and-down unit 127 to lower the first and second magnetic-force generating magnets 125 and 126 toward the lower position and to keep each magnet at this lower position as shown in FIG. 22C. In this processing example, the first and second magnetic-force generating magnets 125 and 126 are each placed at the upper position for about 40 seconds, and, as a result, the substrate W deviates (turns) by about 30° with respect to each movable pin 110 in a direction opposite to the rotational direction Dr1. Therefore, in the chemical liquid supply step (S6), there is no part in the peripheral edge area of the substrate W where a chemical liquid does not flow around, and it is possible to treat the whole of the peripheral edge area of the substrate W with a chemical liquid.

When a predetermined period of time elapses from the start of the discharge of the chemical liquid, the chemical liquid supply step (S6) is ended. In detail, the controller 3 closes the chemical liquid valve 15, and stops to discharge a chemical liquid from the chemical liquid nozzle 6. The controller 3 also moves the chemical liquid nozzle 6 from the central position to the home position. Thus, the chemical liquid nozzle 6 is withdrawn from above the substrate W.

Although the operation of placing each of the first and second magnetic-force generating magnets 125 and 126 at the upper position is performed once in the chemical liquid supply step (S6) as described above, this operation of placing each of the first and second magnetic-force generating magnets 125 and 126 thereat may be performed a plurality of times in the chemical liquid supply step (S6).

Following the end of the chemical liquid supply step (S6), water, which is a rinse liquid, starts to be supplied to the rear surface Wb of the substrate W (S7; Rinse step: Processing-liquid supply step: Rotation processing).

Figure 22E:
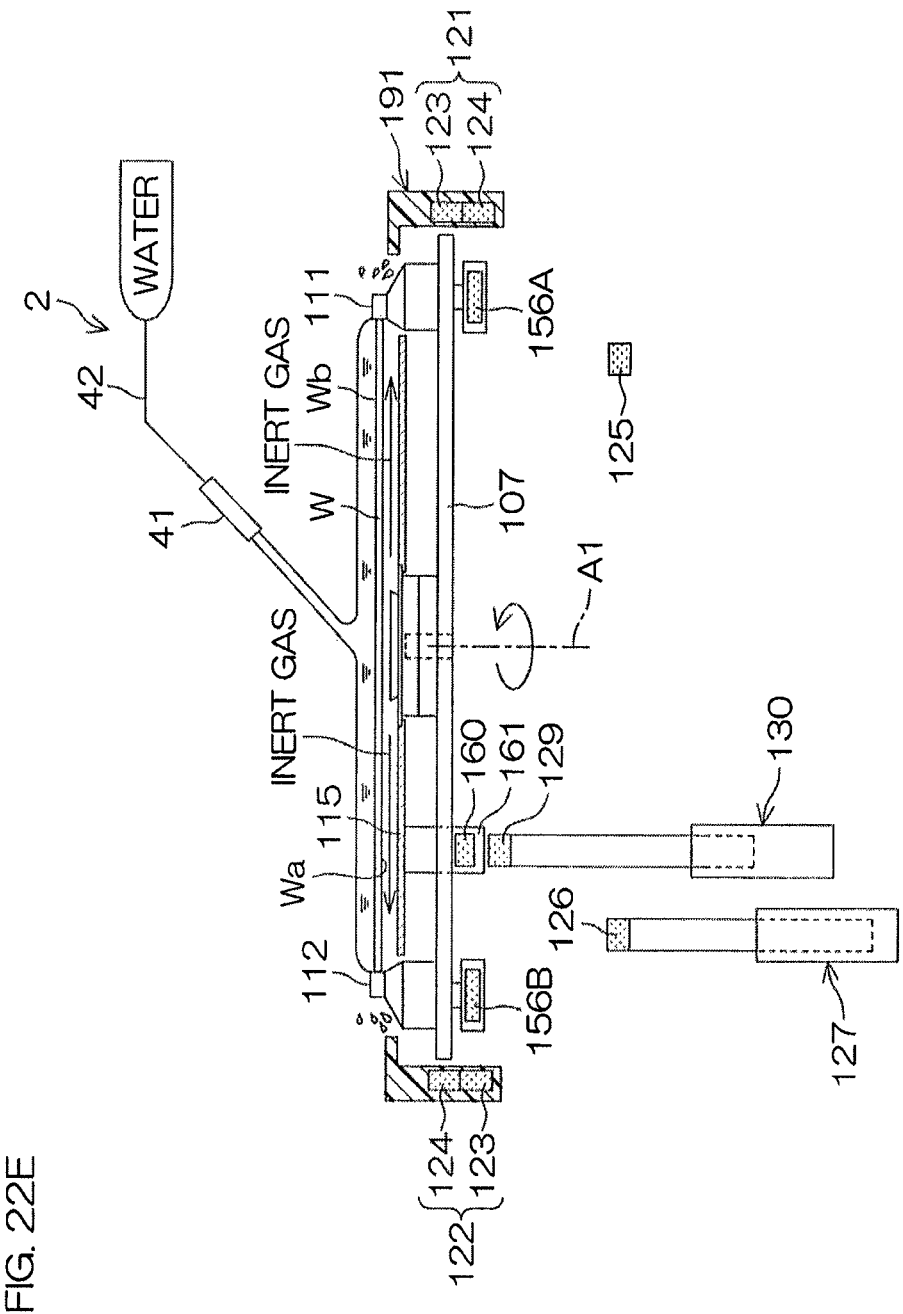

In detail, the controller 3 opens and allows the water valve 43 to discharge water from the water nozzle 41 toward the central part of the rear surface Wb of the substrate W as shown in FIG. 22E. Water discharged from the water nozzle 41 lands on the central part of the rear surface Wb of the substrate W covered with the chemical liquid. The water that has landed on the central part of the rear surface Wb of the substrate W receives a centrifugal force generated by the rotation of the substrate W, and flows toward the peripheral edge of the substrate W on the rear surface Wb of the substrate W, and spreads to the whole area of the rear surface Wb of the substrate W. Therefore, the chemical liquid present on the substrate W is outwardly swept away by the water, and is discharged from the substrate W to its surroundings. As a result, the chemical liquid that has adhered to the rear surface Wb of the substrate W is replaced by the water.

Additionally, in the rinse step (S7), the first and second magnetic-force generating magnets 125 and 126 are each placed at the upper position during a predetermined period of time in order to slide the substrate W in the circumferential direction.

Figure 22F:
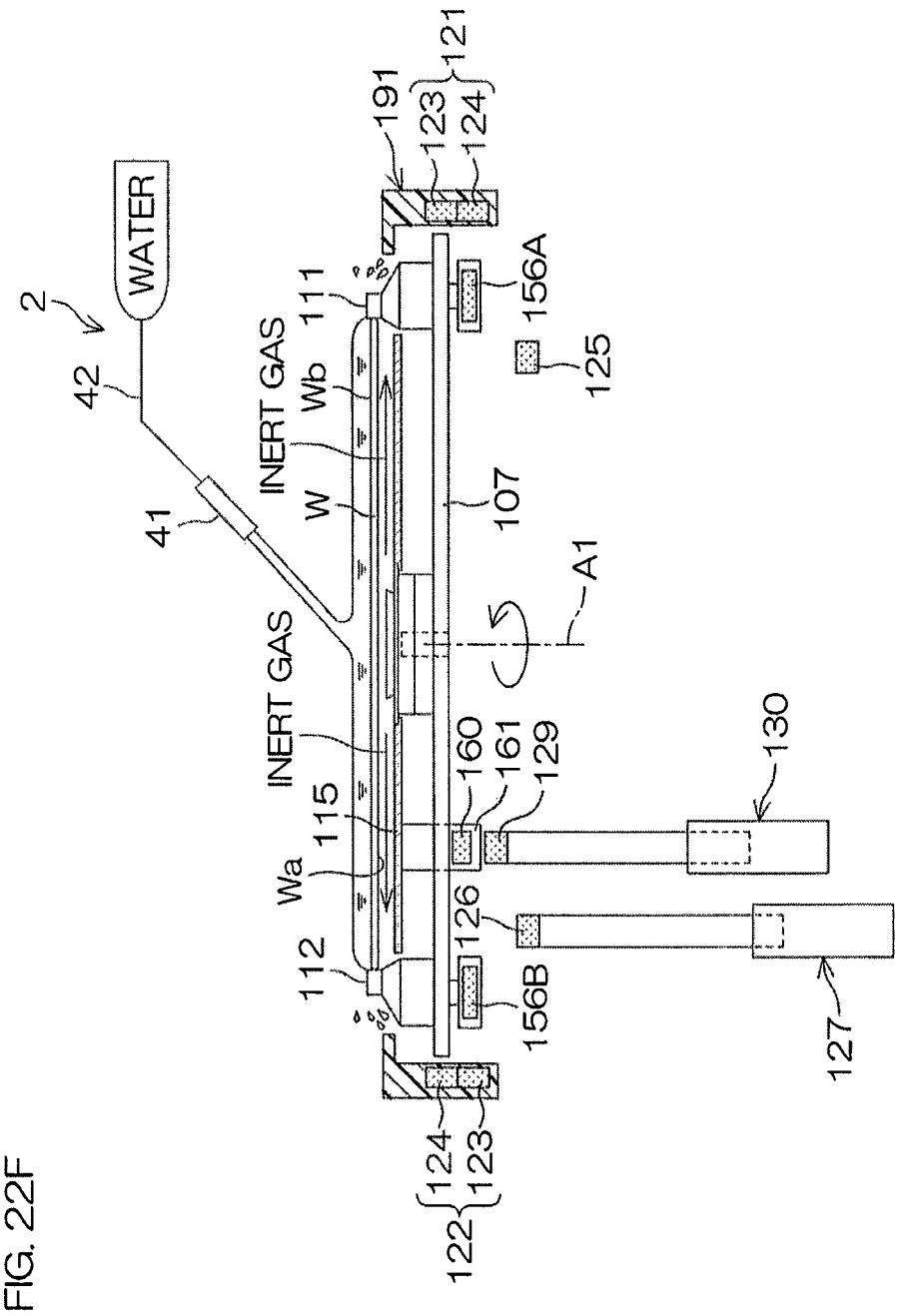

In detail, when a predetermined period of time elapses from the start of the discharge of water, the controller 3 controls and allows the first up-and-down unit 127 to raise the first magnetic-force generating magnet 125 and the second magnetic-force generating magnet 126 each of which has been placed at the lower position till then toward the upper position as shown in FIG. 22F, and, after these magnets rise and reach the upper positions, respectively, these magnets remain to be each placed at the upper position (magnetic-force generation-position placing step). As a result, a state is reached in which the first and second magnetic-force generating magnets 125 and 126 are placed at the upper positions, respectively (shown by the solid line in FIG. 10 and FIG. 13).

In the rinse step (S7), the substrate W is rotated in a state in which the first and second magnetic-force generating magnets 125 and 126 are placed at the upper positions, respectively (rotation step). As a result, the magnitude of a magnetic force (e.g., attractive magnetic force) given from the magnetic-force generating magnets 125 and 126 each of which is placed at the upper position changes in accordance with the rotational angle position of the substrate W. This makes it possible to change a magnetic force (e.g., attractive magnetic force) generated between each driving permanent magnet 156A or 156B and the magnetic-force generating magnets 125, 126 in response to rotation of the substrate W. As a result of a change in the pressing force in each movable pin 110, the substrate W being in a rotational state becomes eccentric. This eccentric direction DE of the substrate W (see FIG. 14B etc.) changes in accordance with the rotational angle position of the substrate W being in a rotational state.

Additionally, in the rinse step (S7), water is supplied to the upper surface of the substrate W in parallel to rotation of the rotary table 107 with respect to the magnetic-force generating magnet, i.e., in parallel to rotation of the substrate W with respect to the first and second magnetic-force generating magnets 125 and 126. A load imposed onto the substrate W is increased by allowing the water to be supplied to the upper surface of the substrate W under predetermined pressure. The increase of the load acts on the substrate W that is in contact with and that is supported by the plurality of support pins (movable pins 110) as rotational resistance that obstructs the turning of the substrate W. A centrifugal force generated by the rotation of the substrate W also acts on the peripheral edge of the substrate W.

As a result, in the rinse step (S7), the substrate W being in a rotational state relatively turns in the turning direction Dr2 having a circumferential direction opposite to the rotational direction Dr1 with respect to the rotary table 107 and the support pin (movable pin 110). As a result, in the rinse step (S7), it is possible to displace the contact-support position in the peripheral edge of the substrate W supported by the support pin (movable pin 110) in the circumferential direction (rotational direction Dr2) while allowing the plurality of support pins (movable pins 110) to come into contact with and support the peripheral edge of the substrate W.

When a predetermined period of time (e.g., about 40 seconds) elapses after placing each of the first and second magnetic-force generating magnets 125 and 126 at the upper position, the controller 3 controls and allows the first up-and-down unit 127 to lower the first and second magnetic-force generating magnets 125 and 126 toward the lower position and to keep each magnet at this lower position as shown in FIG. 22D. The first and second magnetic-force generating magnets 125 and 126 are each placed at the upper position for about 40 seconds, and, as a result, the substrate W deviates (turns) by about 30° with respect to each movable pin 110 in a direction (circumferential direction) opposite to the rotational direction Dr1. Therefore, in the rinse step (S7), there is no part in the peripheral edge area of the substrate W where water does not flow around, and it is possible to rinse the whole of the peripheral edge area of the substrate W.

When a predetermined period of time elapses from the start of the discharge of water, the rinse step (S7) is ended. In detail, the controller 3 closes the water valve 43, and stops to discharge water from the water nozzle 41.

Although the operation of placing each of the first and second magnetic-force generating magnets 125 and 126 at the upper position is performed once in the rinse step (S7) as described above, this operation of placing each of the first and second magnetic-force generating magnets 125 and 126 thereat may be performed a plurality of times in the rinse step (S7).

Figure 22G:
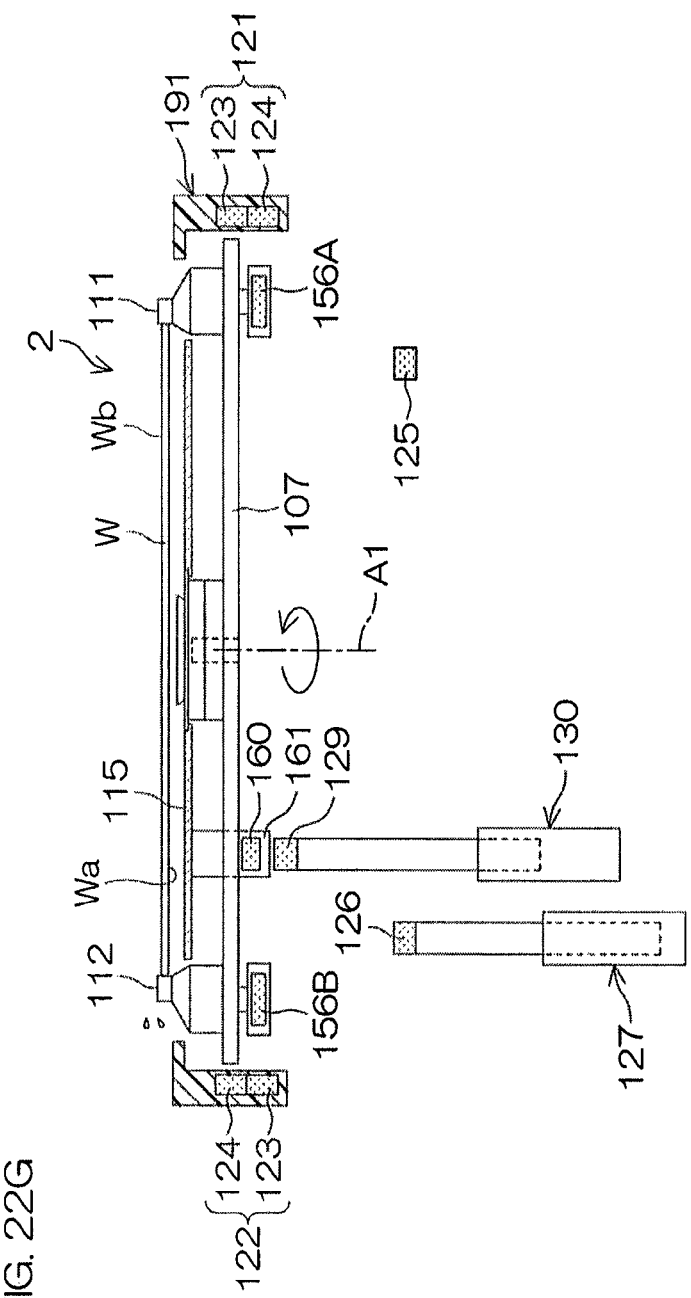
Figure 22H:
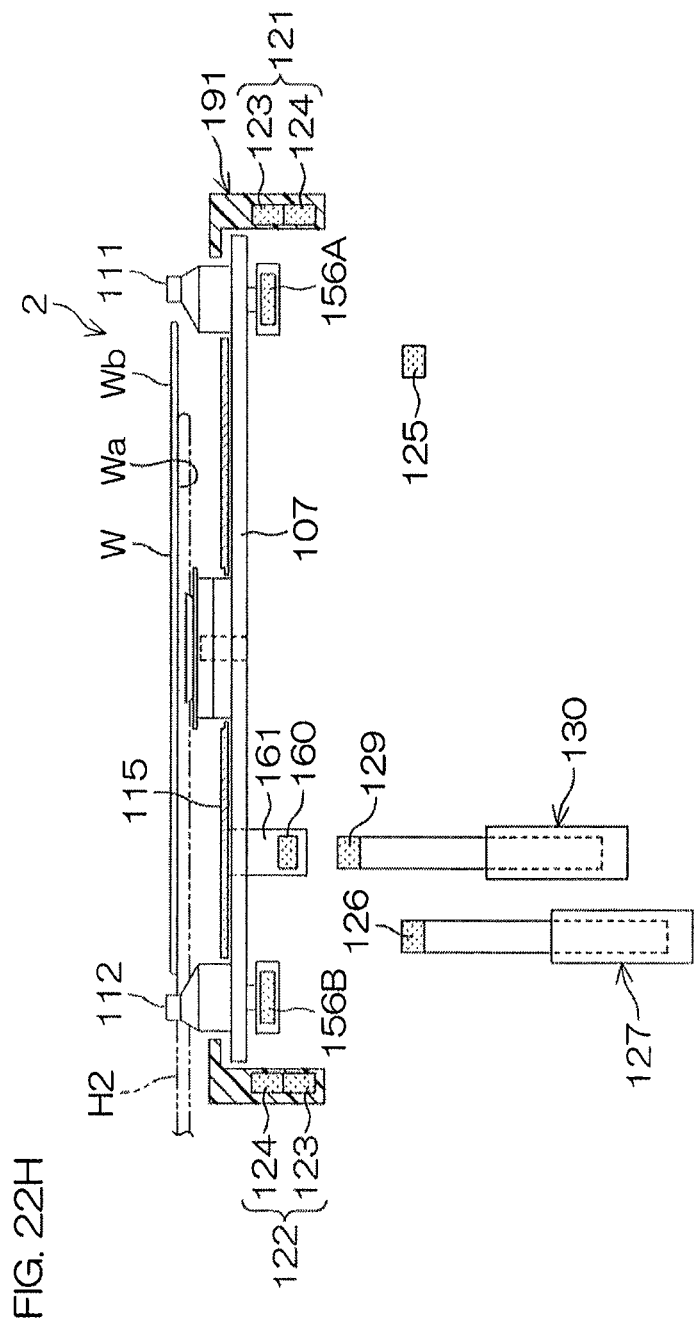

After the end of the rinse step (S7), a spin dry step (step T10) of drying the substrate W is then performed. In detail, the controller 3 controls and allows the rotating/driving unit 17 to accelerate the substrate W to a dry rotation speed (e.g., several thousand rpm) larger than the rotation speed in the chemical liquid supply step (S6) and in the rinse step (S7) and to rotate the substrate W at the dry rotation speed as shown in FIG. 22G. As a result, a large centrifugal force is applied to a liquid present on the substrate W, so that the liquid adhering to the substrate W is shaken off from the substrate W toward its surroundings. The liquid is removed from the substrate W in this way, and the substrate W is dried. In this processing example, the spin dry step (S8) is performed while the protective disk 115 is being placed at the approach position.

Thereafter, when a predetermined period of time elapses after the substrate W starts to be rotated at a high speed, the controller 3 controls and allows the rotating/driving unit 17 to stop the rotation of the substrate W by means of the spin chuck 5 (step S9).

Thereafter, the controller 3 controls and allows the second up-and-down unit 130 to lower the second disk-floating magnet 129 toward the lower position. As a result, the distance between the second disk-floating magnet 129 and the first disk-floating magnet 160 becomes larger, and the magnetic repulsive force therebetween becomes smaller. Accordingly, the protective disk 115 descends toward the upper surface of the rotary table 107 (step S10). Therefore, a space that can be entered by the hand H2 of the center robot CR is secured between the upper surface of the protective disk 115 and the front surface Wa (lower surface) of the substrate W.

Additionally, in response to the descent of the protective disk 115 from the approach position to the lower position, the S-pole portion 124 on the lower end side of the first opening/closing switching permanent magnet 121 recedes from the first driving permanent magnet 156A, and, instead, the N-pole portion 123 on the upper end side of the first opening/closing switching permanent magnet 121 approaches the first driving permanent magnet 156A. Additionally, in response to the descent of the protective disk 115 from the approach position to the lower position, the N-pole portion 123 on the upper end side of the second opening/closing switching permanent magnet 122 recedes from the second driving permanent magnet 156B, and, instead, the S-pole portion 124 on the upper end side of the second opening/closing switching permanent magnet 122 approaches the second driving permanent magnet 156B. As a result, all of the movable pins 110 are driven from the contact position to the open position, and are held at the open position. As a result, the substrate W is released from the state of being gripped.

Thereafter, the substrate W is carried out from the inside of the processing chamber 4 (see FIG. 22H. step S11), and the substrate W carried out therefrom is reversed by the reversing unit TU (step S12). Thereafter, the substrate W that has been washed is contained in the carrier C in a state in which its front surface Wa is directed upwardly, and is conveyed from the substrate processing apparatus 1 toward a postprocessing device such as an exposure device.

As thus described, according to the present preferred embodiment, the upper shaft portion 152 of each movable pin 110 is pressed against the peripheral edge of the substrate W with a predetermined pressing force by means of a magnetic force (e.g., attractive magnetic force) generated between the first and second driving permanent magnets 156A, 156B and the first and second opening/closing switching permanent magnets 121, 122, and, as a result, the substrate W is gripped in the horizontal direction by means of the plurality of support pins (movable pins 110). In the chemical liquid supply step (S6) and the rinse step (S7), the substrate W is rotated around the rotational axis A1 by rotating the support pin (movable pin 110) and the rotary table 107 around the rotational axis A1 in a state in which the substrate W is gripped by the plurality of support pins (movable pins 110), and a centrifugal force generated by the rotation acts on the peripheral edge of the substrate W.

Additionally, the substrate processing apparatus 1 is provided with the first magnetic-force generating magnet 125 that has a magnetic pole that applies a magnetic force (e.g., attractive magnetic force) urging the upper shaft portion 152 of a corresponding movable pin 110 toward the open position between the first driving permanent magnet 156A and the first magnetic-force generating magnet 125. The substrate processing apparatus 1 is further provided with the second magnetic-force generating magnet 126 that has a magnetic pole that applies a magnetic force (e.g., attractive magnetic force) urging the upper shaft portion 152 of a corresponding movable pin 110 toward the open position between the second driving permanent magnet 156B and the second magnetic-force generating magnet 126. In the chemical liquid supply step (S6) and the rinse step (S7), the controller 3 places each of the first and second magnetic-force generating magnets 125 and 126 at the upper position at which the magnitude of a magnetic force (e.g., attractive magnetic force) generated between the first and second driving permanent magnets 156A, 156B and the first and second magnetic-force generating magnets 125, 126 is smaller than that of a magnetic force (e.g., attractive magnetic force) generated between the first and second driving permanent magnet 156A, 156B and the first and second opening/closing switching permanent magnets 121, 122. In this state, the rotary table 107 is relatively rotated around the rotational axis A1. The substrate W is also rotated around the rotational axis A1 in response to the rotation of the rotary table 107 around the rotational axis A1. Therefore, the distance between each driving permanent magnet 156A or 156B and the magnetic-force generating magnets 125, 126 changes in accordance with the rotational angle position of the substrate W, i.e., the magnitude of a magnetic force (e.g., attractive magnetic force) that is given from the magnetic-force generating magnets 125 and 126 and that acts on each driving permanent magnet 156A or 156B also changes in accordance with the rotational angle position of the substrate W. This makes it possible to change a magnetic force (e.g., attractive magnetic force) generated between each driving permanent magnet 156A or 156B and the magnetic-force generating magnets 125, 126 in response to rotation of the substrate W.

Still additionally, in a state in which the first and second magnetic-force generating magnets 125 and 126 are placed at the upper positions, respectively, the magnitude of a magnetic force (e.g., attractive magnetic force) generated between the driving permanent magnets 156A, 156B and the magnetic-force generating magnets 125, 126 is smaller than that of a magnetic force (e.g., attractive magnetic force) generated between the driving permanent magnets 156A, 156B and the opening/closing switching permanent magnets 121, 122. Therefore, it is possible to change the magnitude of a pressing force against the peripheral edge of the substrate W applied by the upper shaft portion 152 of the movable pin 110 while keeping its magnitude higher than zero in response to rotation of the rotary table 107.

In other words, in the chemical liquid supply step (S6) and the rinse step (S7), it is possible to change a pressing force generated in each movable pin 110 while allowing a centrifugal force to act on the peripheral edge of the substrate W. As a result of the change of the pressing force in each movable pin 110, the substrate W being in a rotational state becomes eccentric. Accordingly, the eccentric direction DE of the substrate W changes in accordance with the rotational angle position of the substrate W being in a rotational state.

Additionally, in the chemical liquid supply step (S6) and the rinse step (S7), a processing liquid (chemical liquid or water) is supplied to the upper surface of the substrate W in parallel to rotation of the rotary table 107 with respect to the magnetic-force generating magnet, i.e., in parallel to rotation of the substrate W with respect to the first and second magnetic-force generating magnets 125 and 126. A load imposed onto the substrate W is increased by allowing the processing liquid (chemical liquid or water) to be supplied to the upper surface of the substrate Wunder predetermined pressure. In a state in which the substrate W is being rotated, the increase of the load acts on the substrate W that is in contact with and that is supported by the plurality of support pins (movable pins 110) as rotational resistance that obstructs the rotation and movement of the substrate W. A centrifugal force generated by the rotation of the substrate W also acts on the peripheral edge of the substrate W.

Accordingly, the substrate W becomes eccentric in a state in which the substrate W is being rotated, and this eccentric direction changes in accordance with the rotational angle position of the substrate being in a rotational state. In addition to this, when the substrate W being in a rotational state is eccentric, a force that obstructs the rotation and movement of the substrate W that is in contact with and that is supported by the plurality of support pins (movable pins 110) acts on the substrate W. Therefore, the substrate W being in a rotational state relatively turns in the turning direction Dr2 that is a circumferential direction opposite to the rotational direction Dr1 with respect to the rotary table 107 and the support pin (movable pin 110). As a result, in the chemical liquid supply step (S6) and the rinse step (S7), it is possible to displace the contact-support position in the peripheral edge of the substrate W supported by the support pin (movable pin 110) in the circumferential direction while allowing the plurality of support pins (movable pins 110) to come into contact with and support the peripheral edge of the substrate W. The contact-support position is displaced while performing the chemical liquid supply step (S6) and the rinse step (S7), and therefore, in the peripheral edge area of the substrate W, there is no part where a processing liquid (chemical liquid or water) does not flow around. Therefore, it is possible to provide a substrate processing apparatus 1 that is capable of excellently processing the peripheral edge of the substrate W without the remainder after processing.

Additionally, in the present preferred embodiment, the first magnetic-force generating magnet 125 and the second magnetic-force generating magnet 126 are alternately disposed in the circumferential direction, and therefore the magnetic pole of a magnetic field given to the first and second driving permanent magnets 156A and 156B changes in response to rotation of the rotary table 107 (the magnetic field is nonuniform). In this case, it is possible to abruptly change a magnetic force generated between the first and second driving permanent magnets 156A, 156B and the first and second magnetic-force generating magnets 125, 126 in accordance with the rotational angle position of the substrate W. Therefore, it is possible to largely change a magnetic force generated between each driving permanent magnet 156A or 156B and the magnetic-force generating magnets 125, 126 in response to rotation of the substrate W, and it is possible to accelerate the turning of the substrate W in the turning direction Dr2. This makes it possible to even more effectively displace the contact-support positions in the peripheral edge of the substrate W supported by the support pins (movable pins 110) in the circumferential direction.

Additionally, in the chemical liquid supply step (S6) and the rinse step (S7), the first and second magnetic-force generating magnets 125 and 126 are moved between the upper position (first position) and the lower position (the second position), and, as a result, it is possible to make a transition between a state in which the contact-support position in the peripheral edge of the substrate W deviates and a state in which the contact-support position in the peripheral edge of the substrate W does not deviate. The amount of displacement in the circumferential direction of the substrate W is proportional to the length of time during which the first and second magnetic-force generating magnets 125 and 126 are placed at the upper positions, respectively, and therefore the first and second magnetic-force generating magnets 125 and 126 are each moved from the upper position to the lower position in a state in which a predetermined period of time has elapsed after placing each of the first and second magnetic-force generating magnets 125 and 126 at the upper position, and, as a result, it is possible to control the amount of displacement in the circumferential direction of the substrate W so as to be set at a desired amount.

Figure 23:
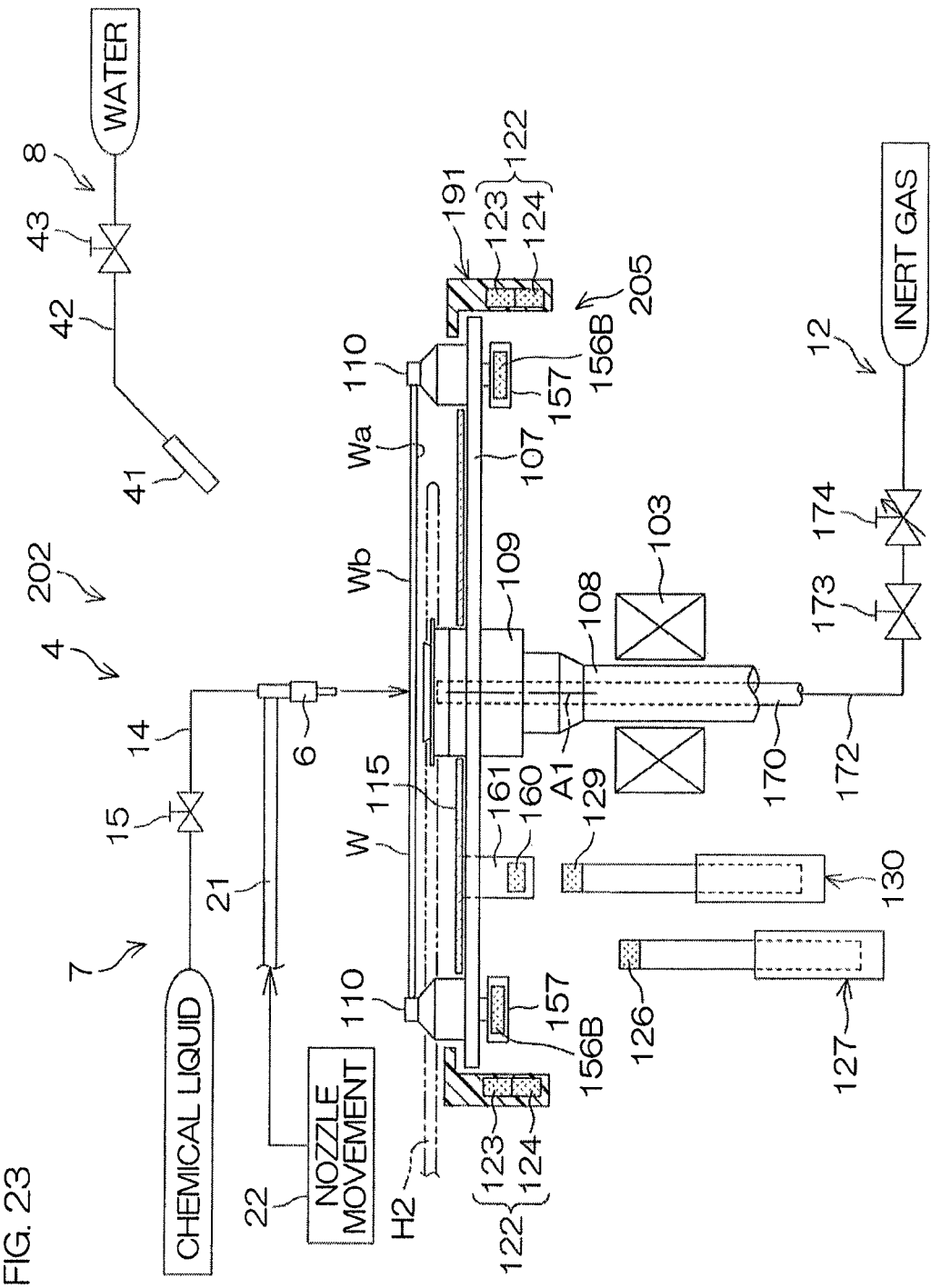
FIG. 23 is a pictorial cross-sectional view to describe an arrangement example of a processing unit included in a substrate processing apparatus according to a second preferred embodiment of the present invention.
Figure 24:
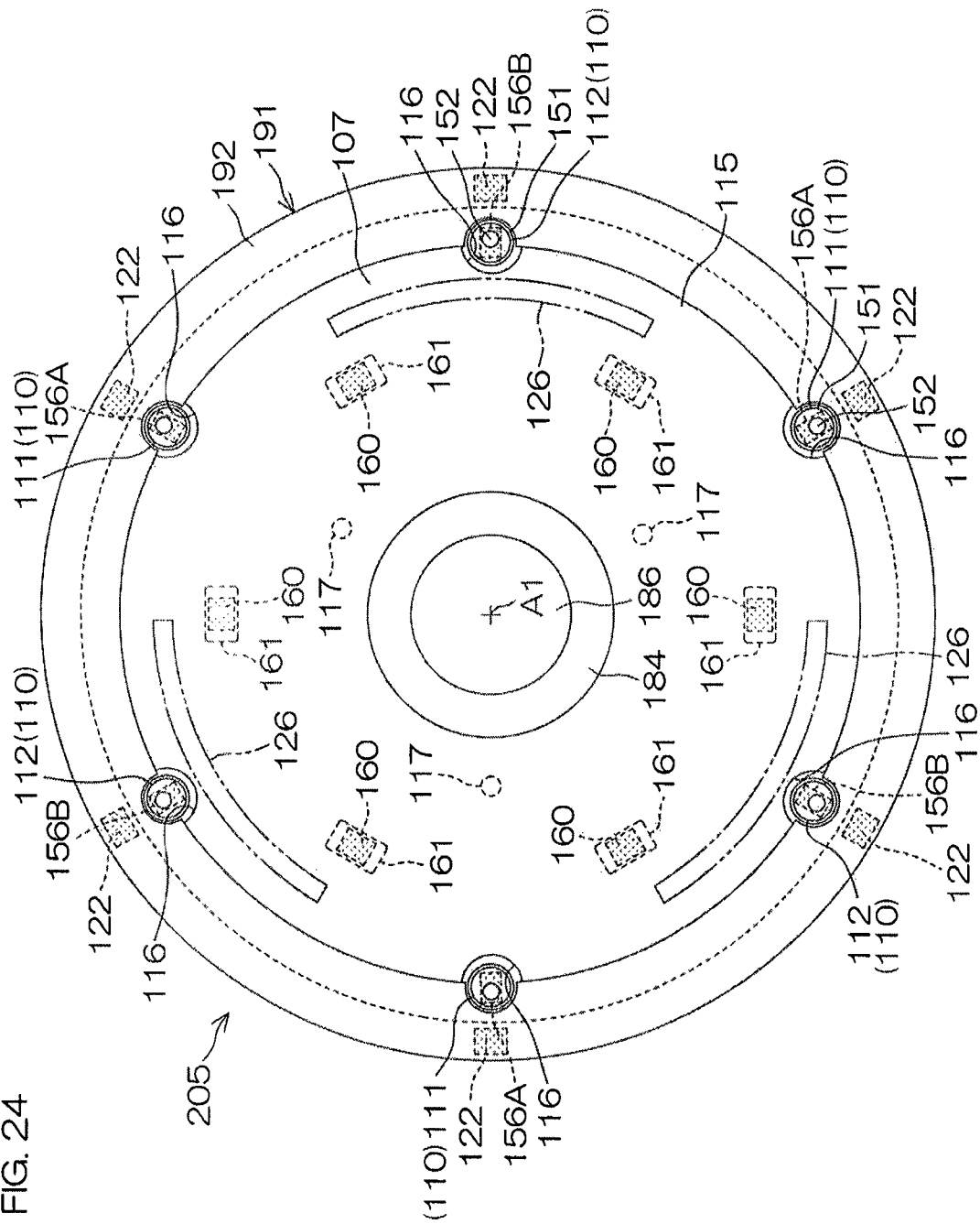
FIG. 24 is a plan view to describe a more concrete arrangement of a spin chuck included in the processing unit.

FIG. 23 is a pictorial cross-sectional view to describe an arrangement example of a processing unit 202 included in a substrate processing apparatus according to a second preferred embodiment of the present invention. FIG. 24 is a plan view to describe a more concrete arrangement of a spin chuck 205 included in the processing unit 202. FIG. 25 is a view showing a positional relationship between the first and second driving permanent magnets 156A, 156B and the first and second magnetic-force generating magnets 125, 126 when the rotary table 107 is rotated in the spin chuck 205.

In the preferred embodiment shown in FIGS. 23 to 25, the same reference sign as in FIGS. 1 to 22B is given to an element corresponding to each element of the preferred embodiment shown in FIGS. 1 to 22B, and a description of this element is omitted.

A main respect in which the spin chuck 205 according to this preferred embodiment differs from the spin chuck 5 according to the aforementioned preferred embodiment is that the magnetic-force generating magnets are formed of not the plurality of first and second magnetic-force generating magnets 125 and 126 but only a plurality of magnetic-force generating magnets 126. In other words, an arrangement of magnetic-force generating magnets according to the second preferred embodiment is formed by eliminating the first magnetic-force generating magnets 125 from the arrangement of the magnetic-force generating magnets according to the first preferred embodiment.

In still other words, magnetic-force generating magnets according to the second preferred embodiment include a plurality of magnetic-force generating magnets 126 that have mutually-common polar directions in the radial direction. Additionally, these magnetic-force generating magnets 126 are spaced out in the circumferential direction. The first up-and-down unit 127 is joined to the plurality of magnetic-force generating magnets 226. The first up-and-down unit 127 raises and lowers the plurality of magnetic-force generating magnets 126 together.

The spin chuck 205 of the second preferred embodiment also differs from that of the first preferred embodiment in that the six movable pins 110 spaced out at the peripheral edge of the upper surface of the rotary table 107 are all equal to each other in the polar direction of a corresponding driving magnet with respect to the radial direction. In addition to this, only one kind of opening/closing switching permanent magnet (e.g., second opening/closing switching permanent magnet 122) is also employed as an opening/closing switching permanent magnet (pressing magnet) that is disposed so as to correspond to each movable pin 110 and that is used to perform the switching of the upper shaft portion 152 of the movable pin 110 between the open position and the holding position.

As described in the first preferred embodiment, in a state in which the second magnetic-force generating magnet 126 is placed at the upper position, a magnetic force (e.g., attractive magnetic force) directed to urge the upper shaft portion 152 (see FIG. 13) of the movable pin 110 toward the open position is generated between the second driving permanent magnet 156B and the second magnetic-force generating magnet 126 so as to have a smaller magnitude than a magnetic force (e.g., attractive magnetic force) generated between the second driving permanent magnet 156B and the second opening/closing switching permanent magnet 122 when the second magnetic-force generating magnet 126 coincides with the second driving permanent magnet 156B with respect to their rotational directions.

In the rotation processing (chemical liquid supply step (S6 of FIG. 20) and the rinse step (S7 of FIG. 20)), in a state in which the substrate W is gripped by the plurality of support pins (movable pins 110) (i.e., in a state in which the upper shaft portion 152 of the movable pin 110 is at the contact position and is pressing the peripheral edge of the substrate W), the rotating/driving unit 103 rotates the rotary table 107 at a speed of the liquid processing speed (e.g., about 500 rpm) in the rotational direction Dr1. As a result, the substrate W is rotated around the rotational axis A1, and a centrifugal force generated by the rotation acts on the peripheral edge of the substrate W.

In the rotation processing (chemical liquid supply step (S6 of FIG. 20) and the rinse step (S7 of FIG. 20)), the distance between the second driving permanent magnet 156B and the second magnetic-force generating magnet 126 changes in accordance with the rotational angle position of the substrate W. In other words, the magnitude of a magnetic force in an opposite direction that acts on each of the second driving permanent magnets 156B changes in accordance with the rotational angle position of the substrate W. This makes it possible to change a magnetic force (e.g., attractive magnetic force) generated between each of the second driving permanent magnets 156B and the second magnetic-force generating magnet 126 in response to rotation of the substrate W. The magnitude of a magnetic force (e.g., attractive magnetic force) generated between the second driving permanent magnet 156B and the second magnetic-force generating magnet 126 is smaller than that of a magnetic force (e.g., attractive magnetic force) generated between the second driving permanent magnet 156B and the second opening/closing switching permanent magnet 122. Therefore, it is possible to change the magnitude of a pressing force against the peripheral edge of the substrate W applied by the upper shaft portion 152 of the movable pin 110 while keeping its magnitude higher than zero in response to rotation of the rotary table 107.

In other words, in the rotation processing (the chemical liquid supply step (S6 of FIG. 20) and the rinse step (S7 of FIG. 20)), it is possible to change a pressing force applied from the upper shaft portion 152 of each movable pin 110 while allowing a centrifugal force to act on the peripheral edge of the substrate W. As a result, the substrate W being in a rotational state becomes eccentric. Additionally, in the same way as in the first preferred embodiment, the eccentric direction DE (see FIG. 14B etc.) of the substrate W changes in accordance with the rotational angle position of the substrate W being in a rotational state.

Therefore, also in the second preferred embodiment, the operation and effect equivalent to the operation and effect described in the first preferred embodiment are fulfilled.

Additionally, in the second preferred embodiment, the plurality of second magnetic-force generating magnets 126 are spaced out in the circumferential direction, and therefore the magnetic pole of a magnetic field given to the second driving permanent magnet 156B changes in response to rotation of the rotary table 107 (the magnetic field is nonuniform). In this case, it is possible to abruptly change a magnetic force (e.g., attractive magnetic force) generated between each second driving permanent magnet 156B and the second magnetic-force generating magnet 126 in accordance with the rotational angle position of the substrate W. Therefore, it is possible to largely change a magnetic force (e.g., attractive magnetic force) generated between each second driving permanent magnet 1563 and the second magnetic-force generating magnet 126 in response to rotation of the substrate W, and it is possible to accelerate the turning of the substrate W. This makes it possible to even more effectively displace the contact-support positions in the peripheral edge of the substrate W supported by the support pins (movable pins 110) in the circumferential direction.

Although the two preferred embodiments of the present invention have been described as above, the present invention can be embodied in other modes.

For example, although each of the upper positions (first positions) of the first and second magnetic-force generating magnets 125 and 126 is placed slightly below the first and second driving permanent magnets 156A and 156B in the first and second preferred embodiments as described above, each of the upper positions (first positions) of the first and second magnetic-force generating magnets 125 and 126 may be placed laterally with respect to the first and second driving permanent magnets 156A and 156B. In this case, the kind of the magnetic-force generating magnets 125, 126 or the distance (distance in an approach state) between the magnetic-force generating magnets 125, 126 and the driving permanent magnets 156A, 156B is appropriately set (selected) so that the magnitude of a magnetic force generated between the magnetic-force generating magnets 125, 126 and the driving permanent magnets 156A, 156B becomes smaller than that of a magnetic force generated between the opening/closing switching permanent magnets 121, 122 and the driving permanent magnets 156A, 1563 when the magnetic-force generating magnets 125, 126, and the driving permanent magnets 156A, 156B coincide with each other with respect to their rotational directions.

Additionally, in the first preferred embodiment, the up-and-down unit that raises and lowers the plurality of first magnetic-force generating magnets 125 together and the up-and-down unit that raises and lowers the plurality of second magnetic-force generating magnets 126 together may be used as mutually different units, respectively. Still additionally, in the first and second preferred embodiments, the plurality of first magnetic-force generating magnets 125 may be raised and lowered by individual up-and-down units, respectively, and the plurality of second magnetic-force generating magnets 126 may be raised and lowered by individual up-and-down units, respectively.

Additionally, although the first up-and-down unit 127 is used as an example of a magnet moving unit in the first and second preferred embodiments as described above, the magnet moving unit may move magnetic-force generating magnets (the first magnetic-force generating magnet 125 and/or the second magnetic-force generating magnet 126) in a direction (e.g., horizontal direction) other than the vertical direction.

Additionally, although the first magnetic-force generating magnet 125 and/or the second magnetic-force generating magnet 126 are/is held in a stationary state in the first and second preferred embodiments as an example as described above, the magnetic-force generating magnets 125, 126 may be disposed movably with respect to the rotary table 107. However, the substrate W supported by the support pin and the magnetic-force generating magnets 125 and 126 are required to be relatively rotated in response to rotation of the rotary table 107.

Additionally, although the first disk-floating magnet 160 includes a plurality of magnets spaced out in the circumferential direction in the annular shape coaxial with the rotational axis A1 in the first and second preferred embodiments as described above, the first disk-floating magnet 160 may have an annular shape coaxial with the rotational axis A1.

Additionally, although the pressing magnet (opening/closing switching permanent magnets 121 and 122) that presses the upper shaft portion 152 (support portion) against the contact position is provided so as to be raised and lowered in response to the movement of the protective disk 115 in the first and second preferred embodiment as an example as described above, the pressing magnet may be attached to the rotary table 107, or may be held so as to be raised and lowered (moved) by members other than the protective disk 115.

Additionally, although the first magnetic-force generating magnets 125 and the second magnetic-force generating magnets 126 are each three in number in the first preferred embodiment as described above, it is only necessary for the number to be one or more.

Likewise, in the second preferred embodiment, the number of the magnetic-force generating magnets (second magnetic-force generating magnets 126) is not limited to three, and it is only necessary for the number to be one or more. Additionally, in the second preferred embodiment, the first magnetic-force generating magnet 125, instead of the second magnetic-force generating magnet 126, may be employed as a magnetic-force generating magnet.

Additionally, although the number of the support pins is six as described above, this is an example, and it is only necessary for the number to be three or more without being limited to six.

Additionally, although all support pins are formed of the movable pins 110 in the present invention as described above, part of the support pins may be formed of fixed pins each of which has an upper shaft portion 152 that is immovable.

Additionally, although a surface to be processed is a rear surface (device non-forming surface) Wb of a substrate W as described above, a front surface (device forming surface) Wa of the substrate W may be a to-be-processed surface. In this case, it is also possible to eliminate the reversing unit TU.

Additionally, the series of processing-liquid processing steps may be performed to remove metals or remove impurities buried in a film without being limited to the removal of foreign substances. Additionally, the series of processing-liquid processing steps may be to perform etching, not washing.

Additionally, although a to-be-processed surface is an upper surface of a substrate W as described above, the to-be-processed surface may be a lower surface of the substrate W. In this case, although a processing liquid is supplied to the lower surface of the substrate W, the processing liquid is allowed to flow around from the lower surface of the substrate W to the upper surface of the substrate W at a substrate support position in the peripheral edge of the substrate W, and, as a result, it is possible to excellently process the peripheral edge of the substrate W without the remainder after processing by use of the processing liquid.

The present invention can also be embodied in parallel to rotation processing in which a processing liquid is not supplied to an upper surface of a substrate W. Even if the processing liquid is not supplied to the upper surface of the substrate W, the substrate W itself will function as rotational resistance in rotation processing if the own weight of the substrate W supported by support pins is sufficiently heavy.

Additionally, although the substrate processing apparatus 1 is an apparatus that processes a disk-shaped semiconductor substrate as described above, the substrate processing apparatus 1 may be an apparatus that processes a polygonal substrate, such as a glass substrate for liquid crystal display devices.

Although the preferred embodiments of the present invention have been described in detail, these embodiments are merely concrete examples used to clarify the technical contents of the present invention, and the present invention should not be understood by being limited to these concrete examples, and the scope of the present invention is limited solely by the appended claims.

The present application corresponds to Japanese Patent Application No. 2016-30153 filed in the Japan Patent Office on Feb. 19, 2016, and the entire disclosure of the application is incorporated herein by reference.

What is claimed is:

1. A substrate processing apparatus comprising:
a substrate rotation holding device including a rotary table that is rotatable around a rotational axis along a vertical direction, and a plurality of support pins to support a substrate horizontally, the plurality of support pins disposed to rotate around the rotational axis together with the rotary table,
wherein the plurality of support pins includes a movable pin that has a support portion disposed movably between a contact position at which the support pin comes into contact with a peripheral edge of the substrate and an open position that is more distant from the rotational axis than the contact position;
the substrate processing apparatus further comprising:
a driving magnet that is coupled to the movable pin and that has a predetermined polar direction with respect to a radial direction of the rotary table;
a pressing magnet that has a magnetic pole and is arranged for applying an attractive magnetic force or a repulsive magnetic force between the driving magnet and the pressing magnet so as to press the support portion against the peripheral edge of the substrate by urging the support portion toward the contact position by means of the attractive magnetic force or the repulsive magnetic force;
a rotating/driving unit that rotates the rotary table together with the plurality of support pins and the driving magnet coupled to the movable pin around the rotational axis; and
a pressing-force changing unit that changes a magnitude of a pressing force against the peripheral edge of the substrate pressed by the support portion in response to rotation of the rotary table around the rotational axis while keeping the magnitude of the pressing force higher than zero; wherein
the pressing-force changing unit comprises
a magnetic-force generating magnet that is a magnet differing from the pressing magnet, that is arranged on an opposite side of the driving magnet from the pressing magnet, for acting on the driving magnet oppositely to the pressing magnet, and that has a magnetic pole that gives an attractive magnetic force or a repulsive magnetic force between the driving magnet and the magnetic-force generating magnet to urge the support portion toward the open position,
the magnetic-force generating magnet including a first magnetic-force generating magnet and a second magnetic-force generating magnet both of which have mutually different polar directions with respect to the radial direction of the rotary table, the first magnetic-force generating magnet and the second magnetic-force generating magnet being alternately disposed in a circumferential direction around the rotational axis, the magnetic-force generating magnet and the rotary table relatively rotating with respect to each other when the rotary table is in rotation;
a magnet drive unit that drives the magnetic-force generating magnet; and
a pressing-force changing control unit that controls the magnet drive unit so as to place the magnetic-force generating magnet at a first position at which an attractive magnetic force or a repulsive magnetic force is generated between the driving magnet and the magnetic-force generating magnet with a smaller magnitude thereof than an attractive magnetic force or a repulsive magnetic force generated between the driving magnet and the pressing magnet, thereby changing the magnitude of the pressing force applied by the support portion while keeping the magnitude of the pressing force higher than zero when the rotary table together with the plurality of support pins are in rotation around the rotational axis so that the driving magnet and the magnetic-force generating magnet placed at the first position are relatively rotating around the rotation axis.

2. The substrate processing apparatus according to claim 1, wherein the magnet drive unit includes a magnet moving unit that moves the magnetic-force generating magnet between the first position and a second position at which a magnetic field is not generated between the driving magnet and the magnetic-force generating magnet.

3. The substrate processing apparatus according to claim 1, further comprising a processing liquid supply unit that supplies a processing liquid to an upper surface of the substrate supported by the plurality of support pins rotated together with the rotary table by the rotating/driving unit.

4. The substrate processing apparatus according to claim 1, wherein the movable pin includes a lower shaft portion coupled to the rotary table and an upper shaft portion formed on an upper end of the lower shaft portion, the movable pin is rotatable around a pin-rotational axis coaxial to a central axis of the lower shaft portion with respect to the rotary table, and the upper shaft is disposed eccentric from the pin-rotational axis.

5. The substrate processing apparatus according to claim 1, wherein the magnetic-force generating magnet is provided non-rotatable around the rotational axis.

6. A substrate processing apparatus comprising:
a substrate rotation holding device including a rotary table that is rotatable around a rotational axis along a vertical direction, and a plurality of support pins to support a substrate horizontally, the plurality of support pins disposed to rotate around the rotational axis together with the rotary table,
wherein the plurality of support pins includes a movable pin that has a support portion disposed movably between a contact position at which the support pin comes into contact with a peripheral edge of the substrate and an open position that is more distant from the rotational axis than the contact position;
the substrate processing apparatus further comprising:
a driving magnet that is disposed correspondingly to the movable pin to rotate around the rotational axis together with the rotary table, and that has a predetermined polar direction with respect to a radial direction of the rotary table;

a pressing magnet that has a magnetic pole that gives an attractive magnetic force or a repulsive magnetic force between the driving magnet and the pressing magnet and that presses the support portion against the peripheral edge of the substrate by urging the support portion toward the contact position by means of the attractive magnetic force or the repulsive magnetic force;

a rotating/driving unit configured to rotate the rotary table together with the plurality of support pins and the driving magnet around the rotational axis; and a pressing-force changing unit that changes a magnitude of a pressing force against the peripheral edge of the substrate pressed by the support portion while keeping the magnitude of the pressing force higher than zero in response to rotation of the rotary table around the rotational axis; wherein the pressing-force changing unit comprises a magnetic-force generating magnet that is a magnet differing from the pressing magnet and that has a magnetic pole that gives an attractive magnetic force or a repulsive magnetic force to urge the support portion toward the open position between the driving magnet and the magnetic-force generating magnet, the magnetic-force generating magnet including a first magnetic-force generating magnet and a second magnetic-force generating magnet both of which have mutually different polar directions with respect to the radial direction of the rotary table, the first magnetic-force generating magnet and the second magnetic-force generating magnet being alternately disposed in a circumferential direction around the rotational axis, the magnetic-force generating magnet and the rotary table relatively rotating with respect to each other when the rotary table is in rotation;

a magnet drive unit that drives the magnetic-force generating magnet and a control unit which controls the rotating/driving unit and the magnet drive unit so as to place the magnetic-force generating magnet at a first position at which an attractive magnetic force or a repulsive magnetic force is generated between the driving magnet and the magnetic-force generating magnet with a smaller magnitude than an attractive magnetic force or a repulsive magnetic force generated between the driving magnet and the pressing magnet while rotating the rotary table around the rotation axis so that the driving magnet and the magnetic-force generating magnet placed at the first position are relatively rotating around the rotation axis, thereby changing the magnitude of the pressing force applied by the support portion while keeping the magnitude of the pressing force higher than zero.

\* \* \* \* \*